(12) United States Patent
Masubuchi et al.

(10) Patent No.: US 8,115,480 B2
(45) Date of Patent: Feb. 14, 2012

(54) MAGNETIC BODY DETECTOR

(75) Inventors: Shinichi Masubuchi, Tochigi (JP); Hiroshi Uchida, Tochigi (JP)

(73) Assignee: Deed Corporation, Tokyo (JP)

( * ) Notice: Subject to any disclaimer, the term of this patent is extended or adjusted under 35 U.S.C. 154(b) by 677 days.

(21) Appl. No.: 12/251,925

(22) Filed: Oct. 15, 2008

(65) Prior Publication Data
US 2010/0013461 A1 Jan. 21, 2010

(30) Foreign Application Priority Data
Jul. 15, 2008 (JP) ................... 2008-184266

(51) Int. Cl.
*G01R 33/02* (2006.01)
*G01N 27/72* (2006.01)
(52) U.S. Cl. ......................... 324/227; 324/244
(58) Field of Classification Search .................. None
See application file for complete search history.

(56) References Cited

U.S. PATENT DOCUMENTS

| | | | | | |
|---|---|---|---|---|---|
| 3,971,983 | A | * | 7/1976 | Jaquet ........................... | 324/227 |
| 4,060,039 | A | * | 11/1977 | Lagarrigue ..................... | 109/3 |
| 6,819,241 | B2 | * | 11/2004 | Turner et al. .................. | 340/551 |
| 2004/0189293 | A1 | * | 9/2004 | Czipott et al. ................. | 324/244 |

FOREIGN PATENT DOCUMENTS
WO WO 03077725 A2 * 9/2003
* cited by examiner

*Primary Examiner* — Paresh Patel
(74) *Attorney, Agent, or Firm* — Westerman, Hattori, Daniels & Adrian, LLP

(57) ABSTRACT

To provide a magnetic body detector as a means for warning that a magnetic body enters into a room where a strong magnet, such as an MRI diagnostic system, is installed, wherein a magnetic sensor can detect even a small magnetic body without being saturated even in an environment with strong magnetic flux density; and appropriate notification is provided to a user by arithmetic processing for inhibiting the detected value of a magnetic body that does not pass through a gate. By adjusting a solid angle formed with a detection axis of the magnetic sensor and a vertical axis or a horizontal axis to be within 15 degrees, a strong direct-current magnetic flux density to be applied to the detection axis is reduced; a small change in magnetic flux density due to the entry of a small magnetic body is detectable without saturation; the characteristics of a magnetic body that will not pass through the gate is extracted by the magnetic sensors arranged in the front, rear, left and right of the gate; and only a magnetic body in the vicinity that passes through the gate is regarded as a target for detection by inhibiting magnetic bodies that will not pass through the gate by calculation.

20 Claims, 54 Drawing Sheets

Fig. 49
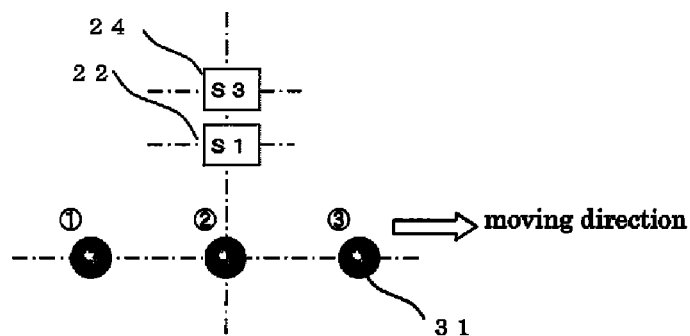
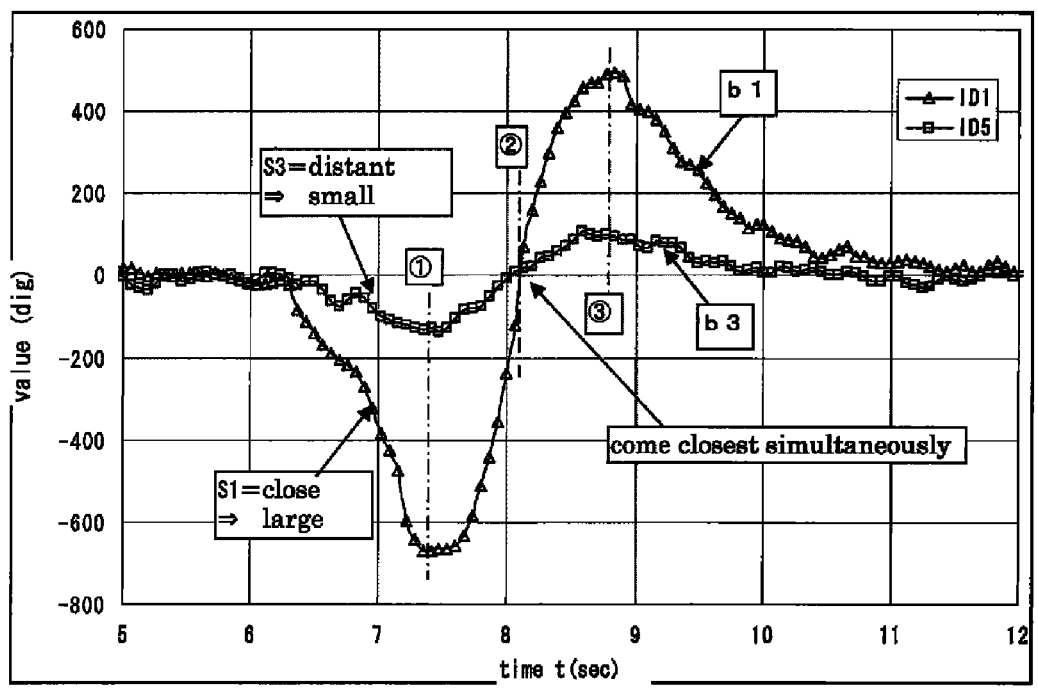

$dhb1 \geqq dhb2 \geqq db3$

MAGNETIC BODY DETECTOR

TECHNICAL FIELD

The present invention relates to a magnetic body detector, and specifically relates to a magnetic body detector where a small magnetic body is detectable even under strong magnetic flux density, and that enables the control of an effect due to a movement of the magnetic body outside a detection region.

BACKGROUND TECHNOLOGY

As a device crucial to recent medical diagnostics, a magnetic resonance imaging (MRI) diagnostic system is available. This system is a method for imaging internal information within a living body by utilizing a nuclear magnetic resonance phenomenon, and requires a strong magnet. Recently, for the purpose of improvement of resolution power and processing speed, an MRI diagnostic system using an extremely strong magnet, such as 1.5 T (tesla) or 3 T, is being developed. For such strong a magnet, a superconductive magnet is generally used. It is necessary to cool the superconductive magnet down close to absolute 0 of temperature and it take a lot of time and cost to start-up. Therefore, the superconductive magnet that has started once shall be operated on a steady basis, and it shall not be stopped as long as there is no special reason.

The stronger the magnet, the stronger the attracting force of the magnet for a magnetic body. In the case of bringing tools, such as a driver made of a magnetic body, such as iron, medical supplies, such as an oxygen bottle or an infusion stand, into the MRI examination room, a magnet attraction accident where these are attracted to a magnet and absorbed into the system may occur. The magnetic body, such as an oxygen bottle, attracted by strong force cannot be detached with a human's power. In order to detach these, the superconductive magnet has to be stopped; however, it takes time to stop and restart the superconductive magnet and the diagnostic task is stopped in the meantime. Other than the time, it also requires a lot of cost.

In the case of bringing tools or medical supplies made of magnetic body by accident, the magnetic body collides into a patient or a laboratory technician and it may cause injury. Therefore, the magnetic body must not be brought into the examination room. Even in the case of transferring a patient to the examination room, it is necessary to use a stretcher or wheelchair exclusively for MRI which has smaller mass ratio of magnetic body. For other infusion stands or medical carts, medical supplies exclusively for MRI should be used.

Laboratory technicians and/or nurses who are engaged in the MRI diagnostic system are educated about and familiar to the risk of magnet, and they will basically never bring a magnetic body. Since the laboratory technicians will confirm whether or not he/she has a magnetic body, such as pacemaker, in the body in advance, there should be no problem for a patient. However, it is not guaranteed that the laboratory technicians have perfect knowledge. For example, since ferrite is not metal, it does not look like being attracted to the magnet; however, this is a magnetic body. There are some cases where a thing, which is believed not being such magnetic body, is brought in. A patient falls into an urgent condition during the examination, and there is a case that a nurse brings an oxygen bottle in by accident. There are some nurses who do not know about the MRI diagnostic system in detail. There are other cases where some workers who have no knowledge about the risk of magnet bringing a stepladder, tools and/or cleaning implements for the purpose of maintenance or cleaning of the MRI examination room.

In order to prevent any magnet attraction accident due to bringing a magnetic body in, it is necessary to mount a gate-type magnetic body detector for detecting a magnetic body and providing a warning in front of a shield door at the MRI examination room.

Furthermore, as a device similar to the gate-type magnetic body detector, a gate-type metal detector is also used at airports. This device is to detect an eddy current flowing in metal, and nonmagnetic metal, such as aluminum, is also detected. Consequently, supplies exclusively for MRI where the majority is made of non-magnetic body are also warned. Therefore, even if a metal detector is used in a shield door at an examination room of the MRI diagnostic system, it is meaningless. Inversely, the magnetic body detector does not react to non-magnetic metal. Therefore, it is meaningless to use this magnetic body detector at airports. The present invention only relates to a magnetic body detector.

As the prior art regarding such magnetic body detector, in Japanese Patent Application Laid-Open No. H5-52962 (Patent Literature 1), an invention where homogeneous magnetic fields are alternately generated using a two-way Helmholtz coil, and a change of magnetic flux density B to be generated due to invasion of a magnetic body is detected by the two-way detection coil, and an electromotive force is amplified and detection is conducted is proposed.

In addition, as the prior art regarding such magnetic body detector, in International Publication Number WO03/077725 A2 (Patent Literature 2), an invention where hall elements are arranged at both sides of a gate, and an output signal is determined by CPU is proposed.

[Patent Literature 1]
Japanese Patent Application Laid-Open No. H5-52962
[Patent Literature 2]
International Publication WO03/077725 A2

DISCLOSURE OF THE INVENTION

Problem to be Solved by the Invention

However, in the invention described in Patent Literature 1, a wound coil is used as a magnetic sensor. Further, in the invention described in Patent Literature 2, a hall element is used as a magnetic sensor. However, the wound coil and the hall element show low resolution, and there is a problem where a small magnetic body cannot be detected.

In other words, the magnetic flux density B is changed due to the entry of a magnetic body into a magnetic field. Although a change of the magnetic flux density delta B has to be detected using a magnetic sensor, a value of the delta B is extremely small according to circumstances. The change in magnetic flux density delta B is basically in proportion to the size of the magnetic body according to magnetic laws of physics, and is inversely proportional to the square of a distance to the magnetic sensor. In addition, the change delta B of the magnetic flux density is complicatedly affected by a shape or direction of a magnetic body. Therefore, although delta B cannot simply be obtained, there is a case where only extremely small change, the change in magnetic flux density delta B=10 nT, is generated according to circumstances. In order to detect a minute change in magnetic flux density, a supersensitive magnetic sensor is required.

Recently, various supersensitive magnetic sensors are developed, and there is a sensor referred to as a superconductive quantum interference device having sensitivity of 10 fT.

If such supersensitive magnetic sensor is used, it is extremely easy to detect an amount of change in magnetic flux density delta B=10 nT.

However, not limiting to the magnetic sensor, in all sensors, the resolution has a proportional relationship with a dynamic range, which means a measurable input tolerance. An object to be measured, which is lower than the resolution, cannot be measured. Further, an object to be measured exceeding a dynamic range will be saturated, so it cannot be measured.

It is recommended that a scalar quantity of the direct-current magnetic flux density B that leaks to the outside of the MRI examination room should be 500 μT or less. This is 10 times stronger magnetic flux density compared to the average geomagnetic direct-current magnetic flux density B, 30 μT.

It is extremely difficult task to detect the amount of change, delta B=10 nT, in an environment of direct-current magnetic flux density B=500 μT. Metaphorically speaking, it is like detecting a change of 0.1 mm out of a stick with 5 m of length. If a tape with a large dynamic range is used, the length of 5 m can be measured; however, it cannot measure the length of 0.1 mm. If a vernier caliper with high resolution is used, the length can be measured by 0.1 mm; however, the length of 5 m is out of measurable range and cannot be measured.

A magnetic sensor with a wound coil or a hall element with a large dynamic range does not bring magnetic saturation; however, it cannot detect a minute amount of change, delta B=10 nT due to its low resolution. With the supersensitive superconductive quantum interference device, although a minute amount of change can be detected, the object is saturated and detection action cannot be performed because of strong direct-current magnetic flux density, B=500 μT.

If a magnetic range with a large dynamic range and high resolution, this problem will be easily solved. However, it is extremely difficult to realistically develop such a magnetic sensor, and even if it could be developed, the cost is extremely high and it cannot be put into practical use. There are only two methods, a method to detect a small change in a magnetic flux density delta B using a magnetic sensor with a large dynamic range, and another method is to use a magnetic sensor with high resolution not to saturate an object. In the case of using a magnetic sensor with low resolution, a signal lower than its threshold cannot be detected. Even if a high-performance amplifier is used, both magnitude of signal and noise merely becomes larger in proportional to the same amplification factor, so there is no effect. Therefore, a technology is required which utilizes a supersensitive magnetic sensor with a low dynamic range without saturation in an environment with strong direct-current magnetic flux density.

Further, in the invention described in Patent Literature 1, a magnetic flux density is alternately generated by a two-way Helmholtz coil. This change in magnetic flux density affects the MRI diagnostic system, and accurate diagnosis cannot be conducted. Further, if the change in magnetic flux density is approximately equal to geomagnetism, which is 30 μT, a two-way magnetic field generated by itself can be controlled; however, control within a strong magnetic field, such as 500 μT, is difficult, and detection of a magnetic body itself becomes impossible.

In order to prevent magnetic mutual interference, a magnetic body detector should be mounted at a position more than a dozen meters away from the MRI diagnostic system. However, it is impossible to install this unless an especially large room is prepared.

Further, in the invention described in Patent Literature 1, it is necessary to pass through a coil even in a floor surface, and a step difference will be generated. There are disabled people among patients, and a step difference will be an obstacle of passage not only with a cane or wheelchair, but a risk of fall also occurs.

In order to configure a Helmholtz coil or a detection coil, it is necessary to wind an enamel wire several turns to a bobbin through which a human can pass by, and extra material costs and assembly man-hour also will be required. An entire device is large-sized, and an installation work costs are high, as well. Further, for the purpose of generating a magnetic field to a Helmholtz coil, massive electric power is also consumed.

It is possible to solve the problems of the magnetic interference, the step difference, the cost and the power consumption caused by the Helmholtz coil or the detection coil by using a magnetic sensor with a hall element according to the invention described in Patent Literature 2; However, the problem where a small magnetic body cannot be detected still remains.

Further, in the invention described in Patent Literature 1 and the invention described in Patent Literature 2, there are problems mentioned below, because an output signal of the magnetic sensor and a threshold value are simply compared, and a notification function is activated.

In other words, not only the wound coil or the hall element but all magnetic sensors are to detect the magnetic flux density at a location where the magnetic sensor is mounted, and they are not for detecting a magnetic body itself.

Further, there is a physical law where the magnitude of the change in magnetic flux density at a position of the magnetic sensor is in proportion to approximately the size of the magnetic body, and is in inversely proportional to the square of the distance.

Therefore, the magnetic sensor cannot distinguish between a small magnetic body in the vicinity and a large magnetic body from a distance. In the case that a magnetic sensor has a capability to detect the small magnetic body in the vicinity, the large magnetic body from a distance will be detected, as well. Consequently, when a user who does not have any magnetic body passes through the magnetic body detector, if a magnetic body from a distance accidentally moves, this is detected and an unnecessary warning will be provided.

In addition, in the actual hospital, a magnetic body is contained in a shield door of the MRI examination room. In the vicinity, there are a door of control room containing a magnetic body, a door of dressing room and a door of a locker, as well. In addition, in the adjacent hall way, a stretcher, a wheelchair or a cylinder formed with a magnetic body, which does not aim at entering into the MRI examination room, comes and goes. From a viewpoint of a user, it is desirable that only a magnetic body that passes through a gate is detected, and a magnetic body that does not pass through the gate even in the vicinity is not detected. In other words, it is desirable to limit to an object that passes through the gate, and to determine whether the object is a magnetic body or non-magnetic body. Therefore, from a viewpoint of a user, the magnetic body that passes through the gate is a signal S, and the magnetic body that does not pass through the gate is noise N.

However, the change in magnetic flux density delta B is generated due to the movement of the magnetic body, and whether the magnetic body passes through the gate has no relation at all. From a viewpoint of a user, the magnetic body that does not pass through the gate is noise N; however, this is according to a subjective determination of a user. The magnetic sensor is not an element to be operated based upon the subjective determination by a user. In the case of viewing from the magnetic sensor, whether or not the magnetic body passes through the gate has no difference, and the amount of change in magnetic flux density delta B is all signals S. From the physical laws of magnetism, a method by the magnetic sensor itself to distinguish a magnetic body that does not pass through the gate does not exist in principle.

Even in the case that the magnetic body that does not pass through the gate is moved, the magnetic body detector according to the invention described in Patent Literature 1 and the invention described in Patent Literature 2 provide a notification. In the case of viewing from the magnetic body detector, since a notification is provided due to generating a change in magnetic flux density B at the location where the magnetic sensor is mounted, this is not a malfunction. However, from a viewpoint of a user, it is notified even though he/she does not have a magnetic body, it is determined as a malfunction. When such situation occurs over and over, the user would lose the trust to the magnetic body detector. As a result of losing the trust, the user actually brings a magnetic body into and he/she is notified, he/she ignores the notification and a risk to generate a magnet attraction accident occurs.

Further, it is characterized such that the magnitude of the change in magnetic flux density delta B is changed due to the movement rate of the magnetic body. In the case that the movement rate is fast, the change in magnetic flux density delta B becomes greater; however, the time period of changing is short. Inversely, in the case that the movement rate is slow, although the time period of changing is long, the change in magnetic flux density delta B becomes smaller. Therefore, in the case of simply determining only with the magnitude of the change in magnetic flux density delta B, it is possible that a magnetic body with a slow movement rate cannot be detected.

Further, in the invention described in Patent Literature 1, what detects a presence of a magnetic body is only a magnetic sensor, and there is a problem where although a user who has a magnetic body has no intention to pass through the gate, he/she is notified when he/she merely approaches the vicinity of the gate.

Further, as a magnetic body that may enter into the MRI examination room, an infusion stand can be considered. Among the infusion stands, there is one where only a pedestal is a magnetic body. In the invention described in Patent Literature 2, a gate type sensor where magnetic sensors are arranged in left and right is used, and in the case that the pedestal passes through the vicinity of the center of the gate, the distance between the magnetic sensor and the pedestal becomes the furthest. At this time, since the further the distance becomes, the smaller the change in magnetic flux density becomes, another problem where the detection becomes difficult can occur, as well.

Further, it is unavoidable for electric noise to enter into the magnetic sensor. It is substantially impossible to distinguish whether a signal to be outputted from the magnetic sensor is due to a magnetic body or the electrical noise. This electrical noise may cause the malfunction. If the threshold value for detecting a presence of a magnetic body is set high, the frequency of the malfunction is lowered. However, since the detection sensitivity is lowered, it becomes impossible to detect a small magnetic body. Further, the magnitude of the electric noise varies depending upon the installation environment. Even if the magnetic sensor is operated without any problem under one installation environment, malfunction may frequently occur under another installation environment.

Further, the magnetic sensor is operated by using an electric current. The consumption current of the magnetic sensor and its peripheral circuit is not always constant but fluctuates, and when an electric current flows into the electric wire, a magnetic field is generated. In association with the generation of this magnetic field, the magnetic flux density fluctuates. As described above, the magnetic flux density fluctuates, the magnetic sensor detects this and it may cause malfunction.

Further, steady magnetic noise will also enter into the magnetic sensor. It is impossible in principle to distinguish whether a signal generated in the magnetic sensor is caused by the magnetic body or the steady magnetic noise. Malfunction occurs due to this steady magnetic noise. If a threshold value is set high for determining a presence of a magnetic body, the frequency of malfunction is lowered. However, because the detection sensitivity is lowered, it becomes impossible to detect a small magnetic body. Further, the magnitude of the steady magnetic noise varies depending upon the installation environment. Even if the magnetic sensor is operated without any problem under one installation environment, the malfunction may frequently occur under another installation environment.

Further, there are various medical supplies in a hospital, and if a large magnetic body, such as an iron oxygen bottle, causes a magnet attraction accident, damage is extremely great. It is needless to say, such dangerous magnetic body should not to be brought into the MRI examination room. In the case of such magnetic body, in order to prevent the risk, there is also a case where a warning is necessary when it approaches the gate even if it does not pass through the gate.

Further, depending upon the way it is used, there is a case where it needs to be notified only when a magnetic body passes through the gate, and there is another case where a notification is necessary regardless of passage of the gate, and there is another case where a combination of notification is required.

Further, with the magnetic body detector according to the invention described in Patent Literature 1 and the invention described in Patent Literature 2, a user who has a magnetic body that will pass through a gate is notified after he/she has passed through the gate, unless he/she goes back and the warning function is checked, he/she cannot recognize what is notified. If he/she does not have recognition that he/she is notified, since he/she will not go back, it is a problem because the notification action is in vain. Even if a user is notified and recognizes this, if he/she ignores the notification, it is still possible to bring a magnetic body. This depends upon a use environment, but there is a problem that the notification is invalid if it is ignored.

There is always an MRI laboratory technician for an MRI diagnostic system at a hospital. The MRI laboratory technician is aware of the risk of magnet, and if he/she can determine whether or not a person who enters into the MRI examination room has a magnetic body, it is possible to prevent the person from entering into the room. In order to realize this, it is necessary install a function to notify the carry-on the magnetic body in the MRI operation room, as well. Further, there is a case that administrators inside and outside the hospital may want to know the notified information.

Further, with a magnetic body detector according to the invention described in Patent Literature 1 and the invention described in Patent Literature 2, it is necessary to have the notification function separately from a door to pass through. Since it is trouble to install the magnetic sensor, there is another problem of high installation cost. Further, it is necessary to install another notification function as occasional demands, and extra installation cost becomes required. In addition, because cables have to be connected, there is also another problem from a viewpoint of appearance. Taking the above-mentioned problems into consideration, one object of the present invention is to use a supersensitive magnetic sensor under an environment with strong direct-current magnetic flux density B in the vicinity of the MRI examination room without saturation, and to detect a small magnetic body, as well.

Further, another object is to solve the problems about the magnetic interference, the step difference, the cost and the power consumption, as well.

Further, another object is to control any effect of a magnetic body from a distance and in the vicinity that will not pass through the gate; concurrently, any effect on a movement rate of the magnetic body is also controlled, and to detect only a magnetic body that will pass through the gate, as well.

Further, another object is to provide a notification only when requirements are met, and to provide a useful notification for a user, as well.

Further, another object is to improve a detection capability for a magnetic body arranged in the lower side, and to improve a detection capability for a magnetic detection, such as an infusion stand that passes through the vicinity of the center of a gate, as well.

Further, another object of the present invention is to control a malfunction by restraining electric noises, as well.

Further, in the present invention, another object is to control a malfunction caused by an electric current flowing in the circuit, as well.

Further, in the present invention, another object is to control a malfunction by conforming to a steady magnetic noise environment, as well.

Further, in the present invention, another object is to operate a notification function even if the magnetic sensor does not pass through the gate but only approaches the gate, as well.

Further, in the present invention, another object is to enable setting of conditions to activate a notification function according to a circumstance of use environment, as well.

Further, in the present invention, another object is to receive notification information at a location other than a gate, as well.

Further, in the present invention, another object is to reduce installation cost and to improve appearance, as well.

Means to Solve the Problems

In order to solve the problems, the present invention adopts a configuration of a magnetic body detector having a magnetic sensor for detecting magnetic flux density, a threshold value, a comparison function between an output of the magnetic sensor and the threshold value, and a warning function for warning the result of the comparison function, wherein a solid angle formed by a detection axis of the magnetic sensor and a vertical axis or a horizontal axis is within 15 degrees.

Further, the present invention adopts a configuration where a plurality of magnetic sensors are established; concurrently, each magnetic sensor is arranged at a different position from each other.

The magnetic flux density B is a vector. The magnetic flux B in the vector axis direction is q scalar amount; however, that in the direction at right angles to the vector axis is zero. In the meantime, the magnetic sensor has a vector axis, referred to as a detection axis. This has the maximum sensitivity to the magnetic flux density B in the same direction as the detection axis; however, the magnetic flux density B in the direction as right angles of the detection axis is not detected.

Therefore, if the detection axis of the magnetic sensor is set to the direction at right angles to the vector axis of the magnetic flux density B where a superconductive magnet is generated, the direct-current magnetic flux density B to be added to the detection axis of the magnetic sensor is zero. Therefore, even if a supersensitive magnetic sensor having only a small dynamic range is used, the object will never be saturated. In the case that a magnetic body enters into the magnetic filed, the vector of the magnetic flux density B is changed and a change of the magnetic flux density B is generated in the detection axis direction of the magnetic sensor. If this delta B is detected, it is possible to detect the entry of the magnetic body.

However, the direction of the magnetic flux density B where the superconductive magnet is generated varies according to a location, and it is not unidirectional. Size of the examination room and a position of the shield door where a magnetic sensor is mounted are also various. The vector axis direction of the magnetic flux density B, which is generated at a position of the magnetic sensor, will be determined according to geomagnetism or a magnetic body, such as reinforcing bars or equipment inside a building, in addition to a positional relationship between the superconductive magnet and a magnetic sensor, distance and magnetic field intensity to be generated. If a vector axis of the direct-current magnetic flux density B is examined by using a measuring scale and a detection axis of the magnetic sensor is adjusted so as to be at right angles, it can be responded. However, specialized knowledge and advanced technology are required, and it is impossible to install a magnetic sensor by a general worker.

Herein, an environment where the MRI diagnostic system is installed will be examined. In the general MRI diagnostic system, a central axis of a cylinder superconductive magnet is horizontally installed. The central axis of the magnet is located at approximately 1 m from a floor surface, and there is no significant difference according to manufacturers and model types.

In the meantime, the size of a shield door has no significant difference according to manufactures and model types, and the height is approximately 2 m.

In other words, the central axis of magnet is located substantially in the center of height of the shield door.

In the meantime, the distance between the MRI diagnostic system and the wall of the examination room where the shield door are installed is long to some degree in order to lower leakage magnetic flux density B. It depends upon the installation location, but it is approximately 6 to 15 m.

Further, the width of the shield door is somewhat different, and it is approximately 1 to 1.4 m. Therefore, a gate of the magnetic body detector requires the same as the shield door width or more width.

In the case of horizontally placing a cylindrical magnet, the direct-current magnetic flux density B is generated in the horizontal direction of the central axis; however, the direct-current magnetic flux density Bz in the vertical direction is zero. Therefore, if a magnetic sensor is mounted on the same horizontal surface as that of the central axis of the magnet and the detection axis is set to the vertical direction, the direct-current magnetic flux density B to be added to the detection axis direction of the magnetic sensor is zero and the object will not be saturated.

In the case of the position, which is vertically apart from the same horizontal surface as that of the central axis of the magnet, the direct-current magnetic flux density Bz is generated in the vertical axis direction. However, the direct-current magnetic flux density Bz in the vertical direction is smaller than the direct-current magnetic flux density Bx and By in the horizontal direction. Even in the environment of the strong direct-current magnetic flux density whose scalar amount B is 500 ($\mu$T), the direct-current magnetic flux density to be applied to the detection axis direction of the magnetic sensor can be reduced. If the direct-current magnetic flux density Bz to be added to the magnetic sensor is small, the dynamic range is low because of the small density; however, it becomes possible to use the supersensitive magnetic sensor with high resolution.

This is to utilize the characteristic where the dimension of the examination room is greater in the horizontal direction than that in the vertical direction. Comprising this to the length of a stick, if a stick of 5 m of length is viewed from the diagonal direction, this looks shorter, and even if a vernier caliper with high resolution is used, it is possible to measure an object without saturation.

Simply considering, the amount of change in magnetic flux density delta B becomes smaller with the same rate, as well, and even if the magnetic sensor with high resolution is used, it is considered that a magnetic body cannot be detected after all. However, the change in magnetic flux density delta B has a direction, and the orientation is not always the same as that of the direct-current magnetic flux density B. A scalar amount of the change in magnetic flux density delta B is determined according to various conditions. If the direction of the change in magnetic flux density delta B and the direction of the detection axis of the magnetic sensor are close, it is possible to sufficiently detect a magnetic body.

However, the direction of the amount of change in magnetic flux density delta B does not always agree with the direction of the detection axis of the magnetic sensor. In the case of being at right angles, a magnetic body cannot be detected at all. Then, a plurality of magnetic sensors are established, and a magnetic body is detected in different positions. The relative direction difference between the direction of the amount of change in magnetic flux density delta B and the direction of the detection axis varies according to the position of the magnetic sensor. Even if one magnetic sensor is situated at right angles and detects nothing at all, it is still possible for another magnetic sensor to detect an amount of change delta B.

As described above, the change in magnetic flux density delta B is inversely proportional to the square of a distance between the magnetic body and the magnetic sensor. Therefore, it is impossible to detect the entire gate area, which is a space where the magnetic body passes with one sensor. A width of a space of approximately 70 cm, which is one half of width of the gate, approximately 1.4 m is detected by establishing magnetic sensors at left and right sides of the gate. The change in magnetic flux density delta B at the position of the magnetic sensor can be 4 times by reducing a maximum distance between the magnetic body and the magnetic sensor by one-half.

Further, it is indefinite which position, either upper side or lower side, the magnetic body passes through. Therefore, the entire space of the shield door can be detected by vertically establishing the magnetic sensors.

In the case of vertically establishing the magnetic sensors at both sides of the gate, in the magnetic sensors at the upper end and the lower end away from the plane of the central axis of the magnet, the direct-current magnetic flux density Bz in the vertical direction is more strongly applied than the magnetic sensor in the vicinity of the central axis. Even in the case of establishing the detection axis of the magnetic sensor strictly in the vertical direction, it cannot prevent some degree of direct-current magnetic flux current Bz from being applied.

Further, it is technically difficult to strictly adjust the direction of the detection axis of the magnetic sensor to the vertical direction, as well. Some degree of error shall occur. In the case of establishing the detecting axis of the magnetic sensor not in the vertical direction but by inclining at solid angle $\theta D$, if $\theta D$ is greater, the magnetic flux density in the detection axis direction becomes greater, and it approaches the saturation level.

Considering the above-mentioned, it is not particularly important to establish the detection axis of the magnetic sensor strictly in the vertical direction. There is no problem to have some tolerance to the solid angle $\theta D$.

If the direct-current magnetic flux density Bs in the detection axis direction is 30% or less of the direct-current magnetic flux density B, as shown in the mathematical formula, the solid angle $\theta D$ formed with detection axis and the vertical axis of the magnetic sensor should be 15 degrees or less. If the solid angle is within this range, the object is difficult to be saturated.

$$\theta D = \sin^{-1}(0.3) \; \& \; \text{nearly 15 (degrees)} \quad \text{[Mathematical Formula 1]}$$

In the open type MRI diagnostic systems, there is one where the central axis of the magnet is orientated toward the vertical direction. In the case of such system, if the detection axis of the sensor is mounted to the horizontal direction, a similar result can be obtained. The solid angle $\theta D$ formed with detection axis and the horizontal axis of the magnetic sensor should be 15 degrees or less.

For the supersensitive magnetic sensor, other than superconductive quantum interference device, various types are developed. There are various types, such as a magnetoresistance effect (MR) sensor, a magnetoimpedance effect (MI) sensor or flux gate sensor. The present invention does not specify the type of the magnetic sensor, and any type is acceptable as long as it is a supersensitive sensor.

Since the magnetic sensor does not require a coil to generate a magnetic field, it will not affect the MRI diagnosis, and the power consumption can be restrained. Further, since a detection coil does not have to be wound around the entire gate, it is unnecessary to establish any step difference on the floor.

Since it is unnecessary to prepare a large coil, not only the assembly man-hour can be reduced, but it can be installed without using any special measuring equipment or skill, so it is possible to reduce overall cost.

In addition, the present invention is equipped with an operation function, and it is configured to control an operation output of a magnetic body that does not pass through the gate by utilizing the characteristic of the change in magnetic flux density delta B to be generated by the magnetic body, and to control a difference due to the a difference in the movement rate of the magnetic body.

As described above, the magnetic sensor does not have a means to determine whether or not the magnetic body has passed through the gate according to the physical principle. The magnetic sensor in the present invention is totally the same, and the magnetic sensor itself does not have a determination means.

However, it is possible to control an operation value of the magnetic body that does not pass through the gate, by appropriately arranging the magnetic sensors around the periphery of the gate, extracting and calculating the characteristic of the change in magnetic flux density delta B to be generated by a magnetic body that passes through a gate and another magnetic body that does not pass through the gate.

Further, it is possible to control the difference due to the difference in the movement rate of the magnetic bodies by operation, as well.

For the operation function, a plurality of computing types are combined.

In addition, the present invention, as one of the computing types, is equipped with an in-phase signal reduction calculation function for removing an in-phase signal component and an addition calculation function for adding a plurality of in-phase signal mode reduction signals obtained by the in-phase signal reduction calculation function, and it is configured such that the in-phase signal components detected by each magnetic sensor are removed using the in-phase signal reduction calculation function, respectively; the plurality of the in-phase signal component removing signals obtained by the in-phase signal reduction computing function is added by the addition calculation function; and the added signal obtained by the addition calculation function and the threshold value are compared.

In the case of arranging a plurality of magnetic sensors at different positions in a gate-state detection space, the distance to the adjacent magnetic body viewing from the magnetic sensor and the vector (angle) are greatly different. In the meantime, the distance to the far magnetic body viewing from the magnetic sensor and the vector (angle) are different to some extent; however, this is not a big difference. Therefore, a vector of the change in magnetic flux density delta B and a scalar amount due to the adjacent magnetic body are greatly different depending upon the position of the sensor, respectively; however, distance and vector of the change in magnetic flux density delta B due to the magnetic body from a distance are substantially the same regardless of the position of the magnetic sensor.

The output change in the magnetic sensor due to the same vector change is basically the same. In other words, the in-phase signal component of the magnetic sensor is to be generated by a magnetic body from a distance, and it can be determined that a non in-phase signal component is generated by an adjacent magnetic body.

In order to determine whether or not it is an in-phase signal, a plurality of magnetic sensors should be established and arranged around the periphery of a gate-state detection space, and they should be simultaneously operated. If the in-phase signal components are extracted out of the output of each magnetic sensor and subtracted, an effect of the magnetic body from a distance can be controlled.

Further, the present invention is, as one of computing types, equipped with an alternating-current component computing function for extracting only an alternating-current component from the detection signal of the magnetic sensors, an absolute value computing function for computing an absolute value of the in-phase signal component removing signal obtained by removing the in-phase signal by the in-phase signal removal computing function from the alternating-current component, and an integration computing function for temporal integration operation of the absolute value, and a configuration where a plurality of integration values obtained by the integration computing function are added by the addition computing function, and the addition signal obtained by the addition computing function and the threshold value are compared by the comparing function can be adopted. Another problem is an effect due to the movement rate of the magnetic body. In the case of moving the magnetic body at high speed, the change in magnetic flux density delta B becomes greater; however, the time period to be changed becomes shorter. Inversely, in the case of moving the magnetic bodies at low speed, the change in magnetic flux density delta B becomes smaller; however, the time period of changing becomes longer.

This is the same as an electric power generation in principle by an electricity generator (dynamo), such as used for a bicycle. If the electric generator rotates faster, a light bulb turns on brightly, and if it is spun slowly, the light bulb becomes darker. On the first glance, it appears that the faster the electric generator rotates, the greater the electric energy to be outputted becomes. However, in actuality, the electric power to be generated during one revolution is not related to rotation speed, but it is constant. The electric energy generated per unit of time at a faster speed increases power consumption per unit time, which increases the brightness of light bulb=electric power=electric energy/time.

When one magnetic body passes through the vicinity of the magnetic sensor under the same condition, the magnetic energy to be generated at the position of the magnetic sensor is constant regardless of the passage time. Therefore, if an evaluation is conducted not with the change in magnetic flux density delta B but with the magnetic energy, it is possible to detect this regardless of the speed of the magnetic body. The magnetic energy is a value where the change in magnetic flux density delta B is integrated with a time, and no specially complicated computing is required.

Further, the magnetic sensors have various d.c. values. In the case of using a plurality of magnetic sensors, direct-current values are not always the same. For each magnetic sensor, it is possible to control the variation if adjustment is conducted one by one; however, a sophisticated technology is required, and it is realistically impossible.

Among the signals of the magnetic sensor, if the direct-current component is removed and only alternating-current component is used, the variation problem can be solved.

In addition, in the present invention, as one of the computing types, a sensor part is configured such that sensor units comprising at least one or more magnetic sensors are arranged in the front and rear with regard to the traveling direction of an object to be detected; an operating part is composed of the alternating-current component operating part, the in-phase removing part, a front-to-rear ratio operating part, the integration part and the determination part; the alternating-current component operating part is composed of alternating-current operations as many as the magnetic sensors, and equipped with an integration operation function and a subtraction operation function, the in-phase signal removing part is composed of in-phase operations comprising a subtraction calculation function, addition calculation functions as many as the magnetic sensors and the division calculation functions as the number of magnetic sensors; the front-to-rear ratio calculation function part is composed of the ratio operations equipped with the addition calculation function, the ratio calculation function, the multiplication calculation function and the absolute value calculation function as many as one-half of the magnetic sensors, and the addition calculation function; the integration part is composed with an integration calculation function; the determination part is composed of a threshold input function for entering a threshold value and the comparison calculation function; and a notification function is configured to notify a warning to a user using a predetermined means, about an effect of the magnetic body in the vicinity of the gate.

In the magnetic body detector with the above-mentioned configuration, a plurality of magnetic sensors are simultaneously operated; an integrated value of the detection signal of each magnetic sensor is obtained by the integration calculation function of the alternating-current component calculating part, respectively; each detection signal and a subtracted value of the integrated value are obtained by the subtraction calculation function of the alternating-current component calculating part; an added value of obtained subtracted value is obtained by the addition calculation function of the in-phase signal removing part; a divided value of obtained added value is obtained by the division calculation function of the in-phase signal removing part; a subtracted value (second subtracted value) between the subtracted value and the divided value is obtained by the subtraction calculation function of the in-phase signal removing part; added values (second added values) of the second subtracted values in two each of front and rear magnetic sensors are obtained by the addition calculation function of the front-to-rear ratio calculating part; ratios of the second subtracted value in each of the two front and rear magnetic sensors are obtained by the comparison calculation function of the front-to-rear ratio calculating part, respectively; multiplied values of the second added value and the ratio in the front and rear are obtained by the multiplication calculation function of the front-to-rear ratio calculating part, respectively; absolute values of the obtained front and rear multiplied values are obtained by the absolute value calculation function of the front-to-rear ratio calculating part; an added value (third added value) of all obtained values is obtained by the addition calculation function of the front-to-rear ratio calculating part; an integrated value (second integrated value) of the obtained third added value is obtained by the integration calculation function of the integration part; a threshold value is entered by the threshold value input function of the determination part; the determination value of the second integrated value and the threshold value is obtained by the comparison calculation function of the determination part; and the notification function will be activated according to the obtained determination value.

Further, the present invention, as one of the computing types, in the magnetic body detector, is configured such that the sensor units in the sensor part are arranged in the front & rear and left & right relative to the traveling direction of the object to be detected; concurrently, left-right in-phase removing part are established to the calculating part; and the present invention can adopt the configuration such that the left-right in-phase removing part is composed of two in-phase ratio calculation functions, a left-right counting calculation function and the multiplication calculation function, and the in-phase ratio calculation function is composed of absolute/subtraction calculation functions comprising the subtraction calculation function, the first absolute value calculation function and the second absolute value calculation function as many as one-half of the magnetic sensors, a first addition calculation function, a first division calculation function, a second addition calculation function, a third addition calculation function and a second subtraction division calculation function.

In the magnetic body detector with the above-mentioned configuration, a plurality of magnetic sensors are simultaneously operated; integrated values of detection signal of each magnetic sensor is are obtained by the integration calculation function of the alternating-current component calculating part; a subtracted value of the detection signal and its integrated value is are obtained by the subtraction calculation function of the alternating-current component calculating part; an added value of obtained subtracted values is obtained by the addition calculation function of the in-phase signal removing part, respectively; an divided value of obtained added value is obtained by the division calculation function of the in-phase signal removing part, respectively; a subtracted value (second subtracted value) between the subtracted value and the divided value is obtained by the subtraction calculation function of the in-phase signal removing part; an added value (second added value) of the second subtracted values in each of the two front and rear magnetic sensors is obtained by the addition calculation function of the front-to-rear ratio calculating part; a ratio of the second subtracted values in each of the two front and rear magnetic sensors are obtained by the ratio calculation function of the front-to-rear ratio calculating part; a multiplied value of the front and rear of second added values and the ratio is obtained by the multiplication calculation function of the front-to-rear ratio calculating part; an absolute value of the obtained front or and rear multiplied value is obtained by the absolute value calculation function of the front-to-rear ratio calculating part; an added value (third added value) of obtained all absolute values is obtained by the addition calculation function of the front-to-rear ratio calculating part; absolute values (second absolute values) of the right and left of the second subtracted values are obtained by the first absolute value calculation function of the left-right in-phase removing part, respectively; added values (fourth added value) of the right and left second subtracted values are obtained by the first addition calculation function of the left-right in-phase removing part, respectively; divided values (second divided values) of the obtained right and left of the fourth added values are obtained by the first division calculation function of the left-right in-phase removing part, respectively; subtracted values (third subtracted values) of the right and left of second subtracted values and the second divided value are obtained by the subtraction calculation function of the left-right in-phase removing part; absolute values (third absolute values) of the obtained right and left of the third subtracted values are obtained by the second absolute value calculation function of the left-right in-phase removing part, respectively; added values (fifth added values) of the right and left of the second absolute values are obtained by the second addition calculation function of the left-right in-phase removing part, respectively; added values (sixth added values) of the right and left of the third absolute values are obtained by the third addition calculation function of the left-right in-phase removing part, respectively; divided values (third divided values) of the right and left of the fifth added value and the sixth added value are obtained by the second division calculation function of the left-right in-phase removing part, respectively; coefficients of the right and left of the third divided values are obtained by the left-right counting calculation function of the left-right in-phase removing part, respectively; a multiplied value (second multiplied value) of the third added value and the coefficient is obtained by the multiplication calculation function of the left-right in-phase removing part; an integrated value (second integrated value) of the obtained second multiplied value is obtained by the integration calculation function of the integration part; a threshold value is entered by the threshold input function of the determination part, and a determination value of the second integrated value and the threshold value is obtained by the comparison calculation function of the determination part; and the notification function will be activated according to the obtained determination value.

According to the above-mentioned configuration, in the present invention, in the magnetic body detector, the magnetic sensors are arranged not only in the right and left but in the front and rear of the gate; a difference in the detection signal of a magnetic body that moves in the direction passing through the gate and another magnetic body that moves in the direction not passing through the gate is separated by the front-to-rear ratio calculating algorithm; and a detected value of the non-passing magnetic body is controlled.

Further, for the present invention, in the magnetic body detector, it is configured to be equipped with an object detection function for detecting a passage or an approach to the gate by an object, and only when the object is detected by the object detection function, the notification function is activated.

When a user passes through the shield door, it is needless to say, he/she passes through the gate of the magnetic body detector installed in front of the shield door. In the meantime, when the user simply approaches the shield door, he/she does not pass through the gate of the magnetic body detector. Therefore, if the passage of the gate of the magnetic body detector is detected, it becomes ascertained that the user has an intention to pass through the shield door. Using an object detection sensor for detecting passage or approach of the object, a function for notification is added only when a magnetic body is detected simultaneously with recognizing an object. With this method, an unnecessary notification will be reduced.

In addition, with the present invention, in the magnetic body detector, it is also possible to adopt the configuration where three or more magnetic sensors are vertically arranged in with intervals within the sensor units in the sensor part; concurrently, the intervals in between the magnetic sensors become narrower downward from the upper side.

Adoption of such configuration enables shortening of the distance between the magnetic sensor and the magnetic body, for an object where a position of a magnetic body is generally arranged at a lower side, and the detection sensitivity of the magnetic body can be improved.

In addition, the present invention, in the magnetic body detector, can adopt the configuration where a second sensor unit comprising at least one or more magnetic sensors are additionally arranged at the lower side of an object to be detected; concurrently, a second calculating part comprising the calculation function, the threshold value input function and the comparison calculation function is established; and a logical addition calculation function is established.

In the magnetic body detector with the above-mentioned configuration, a calculated value in the output signal of the magnetic sensor established in the second sensor is calculated by the calculation function; a threshold value (second threshold value) is entered by the threshold value input function; a determination value (second determination value) of the calculated value and the second threshold value is obtained by the comparison calculation function; a logically added value of the determination value and the second determination value is obtained by the logical addition calculation function; and the notification function will be activated according to the obtained logically-added value.

Adoption of such configuration enables shortening the distance between the magnetic sensor and the magnetic body for an infusion stand or the like passing through the gate center, and detection sensitivity of the magnetic body can be improved.

Further, in addition, the present invention, in the magnetic body detector, can adopt a configuration where a conversion circuit for converting an analog output quantity of the magnetic sensor into a digital quantity is installed very close to each magnetic sensor.

Electronic noises can be referred as a cause that misleads the determination about whether or not a magnetic body is present. An electric noise enters due to mutual inductance M formed with a cable and an electric noise source. In the case that the distance between the magnetic sensor and the calculating part is long, they have to be connected with a long cable. However, since the long cable has a big mutual inductance in principle, the electric noises are superimposed to the detection output of the magnetic sensor. As a result, the determination about whether or not a magnetic body is present is misled.

If the magnetic sensor and the calculating part are adjacent, since the cable becomes shorter, the mutual inductance M becomes smaller and it is possible to reduce electric noises. However, because the magnetic sensor has to be installed to a gate, it is impossible to shorten the cable. Then, it is effective to be equipped with a conversion circuit for converting an output signal of the magnetic sensor, which is an analog value, into a digital value very close to the magnetic sensor. Using the digital value, even if a cable is long, as long as the transmission quality is secured, noises will not be affected.

In addition, the present invention can adopt, in the magnetic body detector, a configuration where the power supply circuits are established as many as the magnetic sensors, and the power supply circuits are installed very close to each of the magnetic sensors and the conversion circuits.

When power fluctuation occurs to the power supply for supplying power to the magnetic sensor, the fluctuation affects the output signal. In the case of a long cable, because of a resistance component R, when a load current fluctuates, it causes the fluctuation of power supply voltage. Then, the power supply circuit is established very close to the magnetic sensor, and thus even if the load current fluctuates, it becomes possible to stably supply electric power to the magnetic sensor.

In addition, the present invention can adopt, in the magnetic body detector, such a configuration an electric current detecting function for measuring a circuit current, a control function for controlling an electric current flowing into the electric current detecting function to be constant, and a dummy electric current function for flowing a dummy electric current by the control function; and the dummy electric current function is connected to the electric current detecting function, and a total of the circuit electric current and a dummy electric current is constant. By adoption of such configuration, the fluctuation of the consumption current in the circuit is restrained and the entire consumption current can be kept constant, so that malfunction of the magnetic sensor can be restrained.

In addition, the present invention, in the magnetic body detector, can adopt the configuration where a function for varying the threshold value is established.

Adoption of such configuration enables restraint of malfunction of the magnetic body detector by setting an appropriate determination threshold value fit to steady magnetic noise in an environment where the magnetic body detector is used.

In addition, the present invention, in the magnetic body detector, can adopt a configuration equipped with a third threshold value input function for entering a third threshold value and a third comparison function for comparing an output value of the magnetic detection function and the third threshold value; and a third comparison result by the third comparison function enables the notification function.

Specifically, in the case of moving a large magnetic body, which must not be brought in, such as an iron oxygen bottle, to closer to the gate, even if there is no intention to pass through the gate, notification may be required. Therefore, it also becomes necessary to set the notification function regardless of the detection output of the object detection sensor.

According to the above-mentioned configuration, it becomes possible to set another value for a threshold value of the magnetic body detection to be notified, which is different from the threshold value to be used at the time of passing through the gate.

In addition, the present invention, in the magnetic body detector, can adopt the configuration where a second selection function for selecting a function for enabling the notification function according to the comparison result and another function for enabling the notification function according to the third comparison result is established.

There is also a case where only one of the magnetic body detection result at the time of detecting an object and the other magnetic body detection result at the time of not detecting any object is required depending on the environment the magnetic body is used. Further, there is also another case that both results are required. These can be solved to be selectably using a switch by adopting the above configuration relating to the present invention.

In addition, the present invention, in the magnetic body detector, can adopt a configuration where electric contact is established; concurrently, a function for opening/closing said electric contact by being synchronized with the notification function is included.

For the purpose of easily recognizing a warning even after passing through the gate, a notification means is established in the traveling direction. Then, in order to operate the notification means, this can be solved by establishing the electric contact and operating the notification means.

It is possible to provide the notification to a laboratory technician who stays at a control room in addition to a user who passes through the gate by establishing the notification means separately, as well. It is also possible to provide the notification to notify an administrator or the like inside and outside a hospital by using a communication means.

In addition, the present invention, in the magnetic body detector, can adopt a configuration where a door frame is established, and at least one or more of each functions in the magnetic body detector are incorporated into the door frame.

In order to reduce the installation cost, it is effective to use a means to incorporate all or a part of functions to the door frame itself. Since the functions are incorporated inside the door frame, the installation task is the same level as the task to install the door frame; therefore, it can be installed at low cost. Further, cables or the like will not be exposed to the outside, and the appearance is also improved.

Efficacy of the Invention

According to the magnetic body detector relating to the present invention, it is possible to use a supersensitive magnetic sensor under an environment with strong direct-current magnetic flux density B, it becomes is possible to detect a minute change in magnetic flux density delta B due to a small magnetic body.

Further, in the present invention, it is possible to configure a magnetic body detector with low cost and low power consumption without generating a magnetic field that affect the MRI diagnosis from a device and without establishing any step difference from the floor.

Further, in the present invention, since the effect of the change in magnetic flux density delta B to be generated according to movement of a magnetic body from in a distance or in the vicinity that does not pass through the gate can be controlled, it is easy to detect a magnetic body that passes through the gate, which is a target of detection.

Further, in the present invention, since the effect of the movement rate of the magnetic body can be also controlled, it is possible to increase reliability of the detection result of the magnetic body.

Further, in the present invention, since a notification is provided only when requirements are met, it is possible to increase effectiveness of notification.

Further, in the invention, since the distance from the magnetic sensor can be shortened even with the magnetic body that is often arranged at the lower side of the medical supplies, it is possible to increase the detection sensitivity.

Further, in the present invention, it is possible to control the malfunction caused by electric noise or an electric current flowing in a circuit.

Further, in the present invention, it is possible to control a malfunction by adapting to a steady magnetic noise environment.

Further, in the present invention, it is also possible to activate the notification function only when a magnetic body approaches to the gate even though the magnetic body does not pass through the gate.

Further, in the present invention, it is possible to set conditions to activate the notification function according to the environment where the magnetic body detector is used.

Further, in the present invention, it is possible to receive the notification information at a location other than the gate.

Further, in the present invention, it is possible to reduce installation cost and to improve the appearance.

BRIEF DESCRIPTION OF THE DRAWINGS

FIG. 30 is a schematic explanatory diagram showing an output result example when eight magnetic sensors do not detect a magnetic body.

FIG. 31 is a schematic explanatory diagram showing an output result example when eight magnetic sensors have detected a large magnetic body from a distance.

FIG. 32 is a schematic explanatory diagram showing an output result example when eight magnetic sensors do not detect a magnetic body.

FIG. 33 is a schematic explanatory diagram showing an output result example of the integration calculation function when eight magnetic sensors have detected a large magnetic body from a distance.

FIG. 39 is a schematic explanatory diagram showing an output result example of the alternating-current component calculation function when a small magnetic body in the vicinity using eight magnetic sensors is not detected.

FIG. 40 is a schematic explanatory diagram showing an output result example of the alternating-current component calculation function when a large magnetic body from a distance using eight magnetic sensors is detected.

FIG. 43 is a schematic explanatory diagram showing an output result example of the in-phase signal removal calculation function when a large magnetic body from a distance is detected using eight magnetic sensors.

FIG. 44 is a schematic explanatory diagram showing an output result example of the in-phase signal removal calculation function and the integration calculation function when a small magnetic body is detected using eight magnetic sensors.

FIG. 45 is a schematic explanatory diagram showing an output result example of the in-phase signal removal calculation function and the integration calculation function when a magnetic body is not detected using eight magnetic sensors.

FIG. 46 is a schematic explanatory diagram showing an output result example of the in-phase signal removal calculation function and the integration calculation function when a large magnetic body is detected using eight magnetic sensors.

FIG. 48 is a schematic explanatory diagram showing an output result example when a passing magnetic body is detected using two magnetic sensors.

FIG. 49 is a schematic explanatory diagram showing an output result example when a non-passing magnetic body is detected using two magnetic sensors.

FIG. 50 is a schematic explanatory diagram showing an output result example and a front-to-rear ratio calculation when a passing magnetic body and a non-passing magnetic body are detected using two magnetic sensors.

FIG. 53 is a schematic explanatory diagram showing a front-to-rear ratio calculating output result example when the non-passing magnetic body is detected using two magnetic sensors.

FIG. 54 is a schematic explanatory diagram showing a front-to-rear ratio calculating output result example when the passing magnetic body is detected using sixteen magnetic sensors.

FIG. 55 is a schematic explanatory diagram showing a front-to-rear ratio calculating output result example when the non-passing magnetic body is detected using sixteen magnetic sensors.

FIG. 56 is a schematic explanatory diagram showing a positional relationship among a gate, a passing magnetic body and a non-passing magnetic body.

FIG. 57 is a schematic explanatory diagram showing a front-to-rear ratio calculating output result example when the magnetic body passing outside a gate is detected using sixteen magnetic sensors.

FIG. 61 is a schematic explanatory diagram showing an output result example when the magnetic body passing outside a gate is detected using eight magnetic sensors at the right side.

FIG. 62 is a schematic explanatory diagram showing an output result example when the magnetic body passing outside a gate is detected using eight magnetic sensors at the left side.

FIG. 63 is a schematic explanatory diagram showing an in-phase calculation functional part in the functional configuration example for notifying a magnetic body using right and left in-phase calculation function.

FIG. 66 is a schematic explanatory diagram showing an in-phase calculation output result example when a magnetic body passing outside a gate is detected using eight magnetic sensors at the right side.

FIG. 67 is a schematic explanatory diagram showing an in-phase calculation output result example when a magnetic body passing outside a gate is detected using eight magnetic sensors at the left side.

FIG. 72 is a schematic explanatory diagram showing a calculation result example by a right and left in-phase ratio calculation output when a passing magnetic body is detected using sixteen magnetic sensors at the left side.

FIG. 73 is a schematic explanatory diagram showing a calculation result example by a right and left in-phase ratio calculation output when a magnetic body passing outside a gate is detected using sixteen magnetic sensors at the left side.

FIG. 74 is one functional block diagram of the magnetic body detector relating to the present invention.

FIG. 75 is a schematic explanatory diagram showing one configuration mode of the magnetic body detector relating to the present invention.

FIG. 86 is a schematic explanatory diagram showing one configuration mode of magnetic body detector relating to the present invention.

FIG. 87 is a schematic explanatory diagram showing a positional relationship between an electric wire and a magnetic sensor.

BEST MODE FOR CARRYING OUT THE INVENTION

Figure 1:
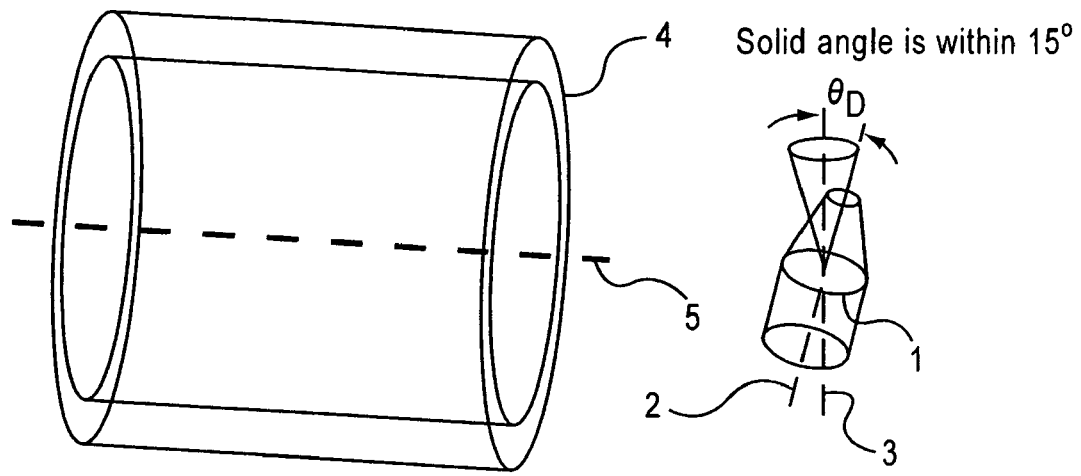
FIG. 1 is a schematic explanatory diagram showing one configuration mode of the magnetic body detector relating to the present invention.

The magnetic body detector relating to the present invention detects a minute change in magnetic flux density delta B without saturation by setting the detection axis of a magnetic sensor in a horizontal direction or a vertical direction. Further, a plurality of magnetic sensors simultaneously operated and arranged around the periphery of the detection space remove an in-phase component of the change in magnetic flux density delta B due to the movement of the magnetic body in a distance; concurrently, detects magnetic energy generated due to not the magnitude of the change in magnetic flux density delta B to be affected by the movement rate, but by passage, and a presence of a magnetic body is determined. Further, whether a magnetic body is moving toward the gate direction or not is determined according to the rate of magnitude of the change in magnetic flux density delta B detected by the magnetic sensors arranged in the front and rear. In addition, a distance of to a magnetic body is determined from the in-phase signal component of an amount of change in magnetic flux density delta B detected by the magnetic sensors arranged right and left of the gate, and whether the magnetic body is passing through the inside of the gate or the outside of the gate is determined. Further, only when requirements are met according to the object detection sensor, a notification is provided. Further, the magnetic sensors are arranged in unequal intervals by utilizing the characteristic where since iron, which is a general magnetic body, is a heavy substance, it is arranged at the lower side, and a detection value of the lower side of magnetic body is improved. Further, in the case of a magnetic body, such as an infusion stand, by utilizing the characteristic where iron, which is a heavy substance, is often used for a pedestal, the distance between the magnetic body and the magnetic sensor is moved closer by arranging the magnetic sensor under the floor, and a detection value of the magnetic body is improved by increasing the output the magnetic sensor. Further, a malfunction caused by the electric noises and or an electric current flowing into a circuit is controlled. Further, the malfunction is controlled by being matched to the steady magnetic noise environment. Further, even if a magnetic body does not pass through the gate, it is also possible to activate the notification function only by approaching to the gate. Further, in the present invention, it is possible to set conditions to activate the notification function according to an environment where the magnetic body detector is used. Further, in the present invention, it is possible to receive the notification information at a location other than the gate, as well. Further, in the present invention, the greatest characteristic is to reduce the installation cost and to improve the appearance. Hereafter, embodiments of the magnetic body detector relating to the present invention will be described based upon drawings.

FIG. 1 is a schematic explanatory diagram showing a configuration mode of the magnetic body detector relating to the present invention. FIG. 1 is applied in the case that a central axis 5 of a magnet 4 is horizontal. FIG. 1 shows that the solid angle θD formed with a detection axis 2 and a vertical axis 3 of a magnetic sensor 1 is within 15 degrees. The horizontal axis 5 of the magnet 4 is mounted to be horizontal. Furthermore, the shapes of the magnetic sensor 1 and the magnet 4 do not show specific shapes but show patterns of functions.

Figure 2:
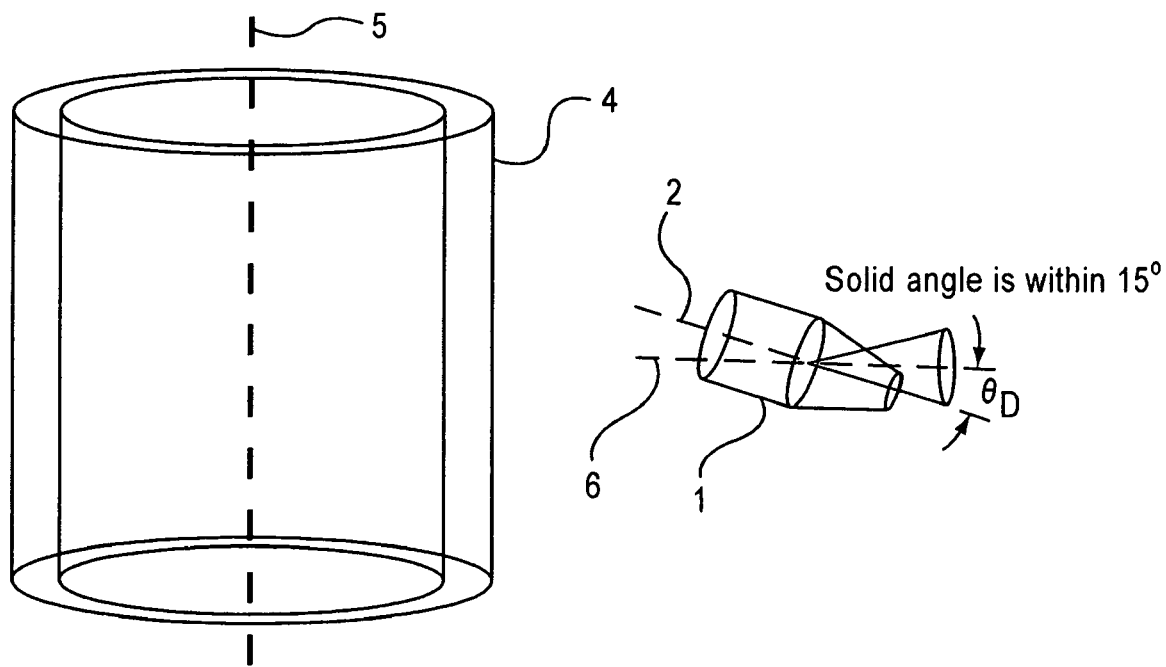
FIG. 2 is a schematic explanatory diagram showing another configuration mode of the magnetic body detector relating to the present invention.

FIG. 2 is another schematic explanatory diagram showing a configuration mode of the magnetic body detector relating to the present invention. FIG. 2 is applied in the case that a central axis 5 of a magnet 4 is vertical. FIG. 2 shows that the solid angle θD formed with the detection axis 2 and a horizontal axis 6 of the magnetic sensor 1 is within 15 degrees.

Next, it will be described that the configuration modes shown in FIG. 1 and FIG. 2 are effective in due order.

Figure 3:
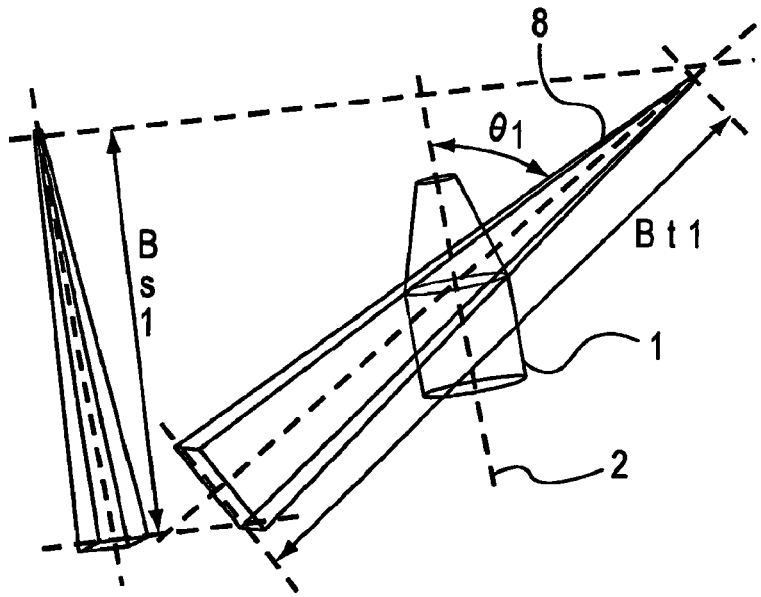
FIG. 3 is a schematic explanatory diagram showing magnetic flux density in the case of installing a magnetic sensor within a magnetic field.

First, the principle to detect a magnetic body 7 by the magnetic sensor 1 will be described. FIG. 3 shows a state where only the magnetic sensor 1 is installed within the magnetic field. A vector of the direct-current magnetic flux density B is expressed with a square pyramid as a pattern. Direct-current magnetic flux density 8 having a scalar amount Bt1 is applied to the magnetic sensor 1. The direction of the detection axis 2 and the direct-current magnetic flux density 8 is in the relation of solid angle θ1. What is detected by the magnetic sensor 1 is only a component in the direction of the detection axis 2, and this scalar amount is regarded as Bs1. Bt1 and Bs1 are expressed with the mathematical expression 2 mentioned below.

$$Bs1 = Bt1 \times \cos\theta1 \quad \text{[Mathematical Expression 2]}$$

Figure 4:
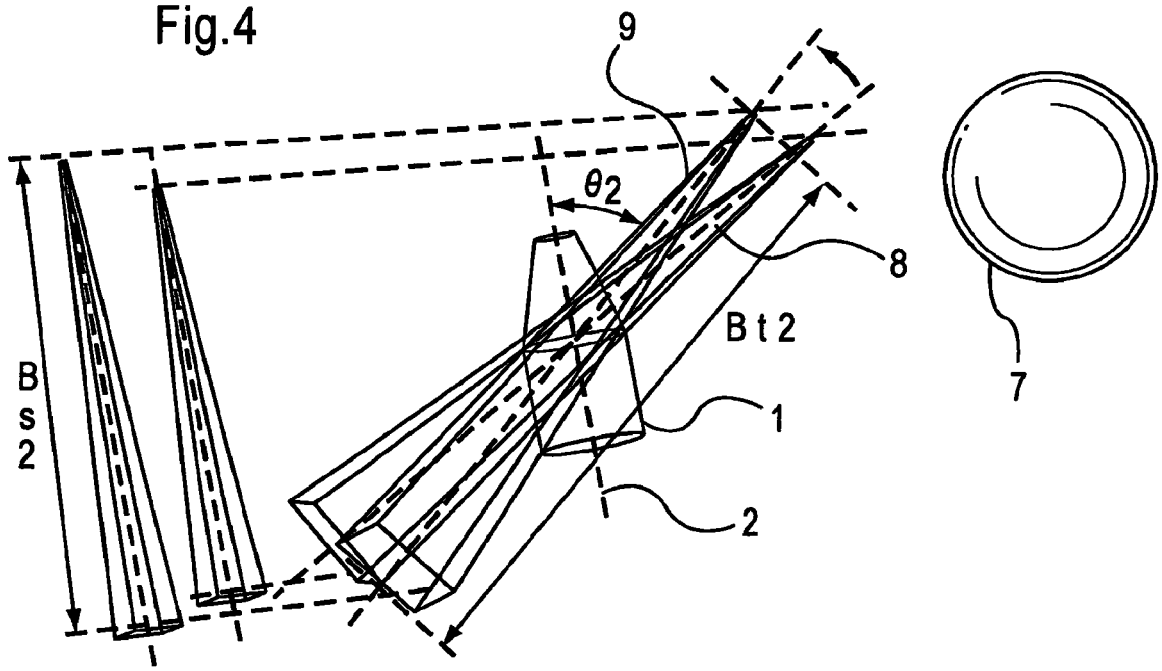
FIG. 4 is a schematic explanatory diagram showing magnetic flux density in the case of installing a magnetic sensor and a magnetic body within a magnetic field.

Next, a state where the magnetic body 7 enters into a magnetic field is shown in FIG. 4. The direct-current magnetic flux density 8 is changed to a direct-current magnetic flux density 9 due to the magnetic body 7. The scalar amount is changed from Bt1 to Bt2, and the solid angle is also changed from θ1 to θ2. As a result, the scalar amount Bs2 in the component in the direction of the detection axis 2 of the magnetic sensor 1 is changed as in Mathematical expression 3 mentioned below.

$$Bs2 = Bt2 \times \cos\theta2 \quad \text{[Mathematical Expression 3]}$$

Therefore, the amount of change delta Bs of the scalar amount of the component in the direction of the detection axis 2 of the magnetic sensor 1 can be expressed with Mathematical expression 4 by the magnetic body 7.

$$\Delta Bs = Bs2 - Bs1 \quad \text{[Mathematical expression 4]}$$

The amount of change delta Vo of the detection output of the magnetic sensor 1 is expressed with the following Mathematical expression 1 when a conversion coefficient is α:

$$\Delta Vo = \alpha \times \Delta Bs = \alpha \times (Bs2 - Bs1) \quad \text{[Mathematical Expression 5]}$$

A presence of a magnetic body can be determined by determining the value of delta Vo with one threshold value.

Herein, according to Mathematical expression 2, even if the direct-current magnetic flux density 8 having the same scalar amount Bt1 is applied, it is ascertained that the scalar amount Bs1 of the magnetic flux density in two directions of the detection axis 2 is changed is changed by the solid angle θ1 formed with the direct-current magnetic flux density 8 and the detection axis 2. If the direction of the direct-current flux density 8 and that of the detection axis 2 are matched, cos 0°=1, and the scalar amount Bt1 is all applied to the magnetic sensor 1. When the scalar amount Bt1 exceeds the dynamic range, which is the input tolerance of the magnetic sensor 1, it is saturated and an object cannot be detected. Furthermore, even in the case that the direction of the direct-current magnetic flux density 8 and that of the detection 2× are opposite from each other, cos 180°=−1 and it is similarly saturated.

In the meantime, if the direction of the direct-current magnetic flux density 8 is at right angles to that of the detection axis 2, cos 90°=0, and the scalar amount Bt1 will not be applied to the magnetic sensor 1. Therefore, no matter how great the scalar amount Bt1 is, the magnetic sensor 1 will never be saturated.

Not limiting to the magnetic sensor, a sensor with high resolution inevitably has small dynamic range. In order to operate the sensor without saturation, a direct-current component to be entered into the sensor has to be reduced. Therefore, in order to detect a small magnetic body, it is necessary to set the solid angle θ1 formed with the vector of the direct-current magnetic flux density 8 and the vector of the detection axis 2 of the magnetic sensor 1 at right angles or closed substantially right angles.

When the magnetic body detector is installed, if the direction of the direct-current magnetic flux density 8 is measured using a measuring scale and the solid angle θ1 formed with the detection axis 2 is adjusted so as to be at right angles, the above problems will be solved. However, the direction of the direct-current magnetic flux density 8 is infinite in variety according to the installation environment, and it is not constant. In order to adjust this, a measuring scale and specialized skills by an installer are required. In order to reduce overall cost including the installation expense, even if it is installed without a special measuring scale or skills, the magnetic sensor 1 with high resolution can be used under strong direct-current magnetic flux density environment.

Figure 5:
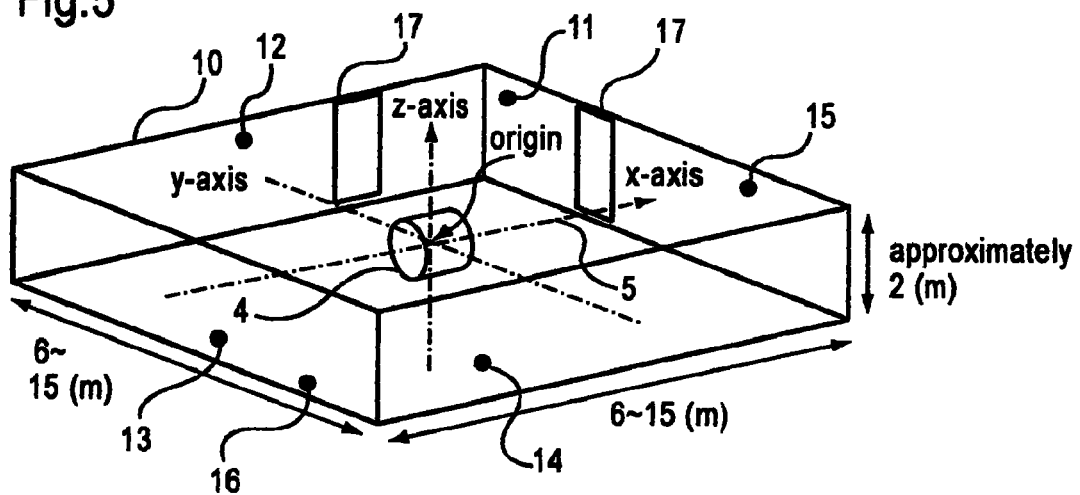
FIG. 5 is a schematic explanatory diagram showing an examination room where an MRI diagnostic system is installed.

FIG. 5 shows a pattern diagram of an examination room 10 where an MRI diagnostic system is installed. The central axis 5 of the magnet 4 in the MRI system is installed to be horizontal. Walls 11, 12, 13 and 14 surrounds four direction of the examination room 10, and a ceiling 15 and a floor 16 are situated in the upper side and bottom side, respectively. In order to reduce the direct-current magnetic density B leaking to outside of the examination room, width and depth of the examination room are approximately 6 to 15 m. The width, the depth and the shape vary according to the installation environment.

A shield door 17 is installed to any of the walls 11 to 14 of the examination room 10. Height and width of the shield door 17 are approximately 2 m and 1 to 1.4 m, respectively, and there is no great difference installation environment. The shield door 17 is installed in any of the walls 11 to 14; however, which wall the shield door 17 is installed is indefinite, and the relative position with the magnet 4 varies according to the installation environment. The actual height of the ceiling 15 is generally higher than the height of the shield door; however, since the magnetic body detector according to the present invention has no problem as long as it detects a magnetic body that passes through the shield door 17 and invades, equivalent height of the ceiling is approximately 2 m. The central axis 5 of the magnet 4 is installed to be horizontal, and this direction is referred to as an x-axis hereafter. The horizontal axis perpendicular to the x-axis is referred to as y-axis, and the vertical axis is referred to as z-axis hereafter. The intervals between the central axis 5 and the floor 16 are approximately 1 m, and there is no great difference between installation environments. Furthermore, the shape of the examination room in FIG. 5 is rectangular viewing from the upper side; however, as long as the walls 11 to 14 are substantially vertical, the shape will not be defined.

Figure 6:
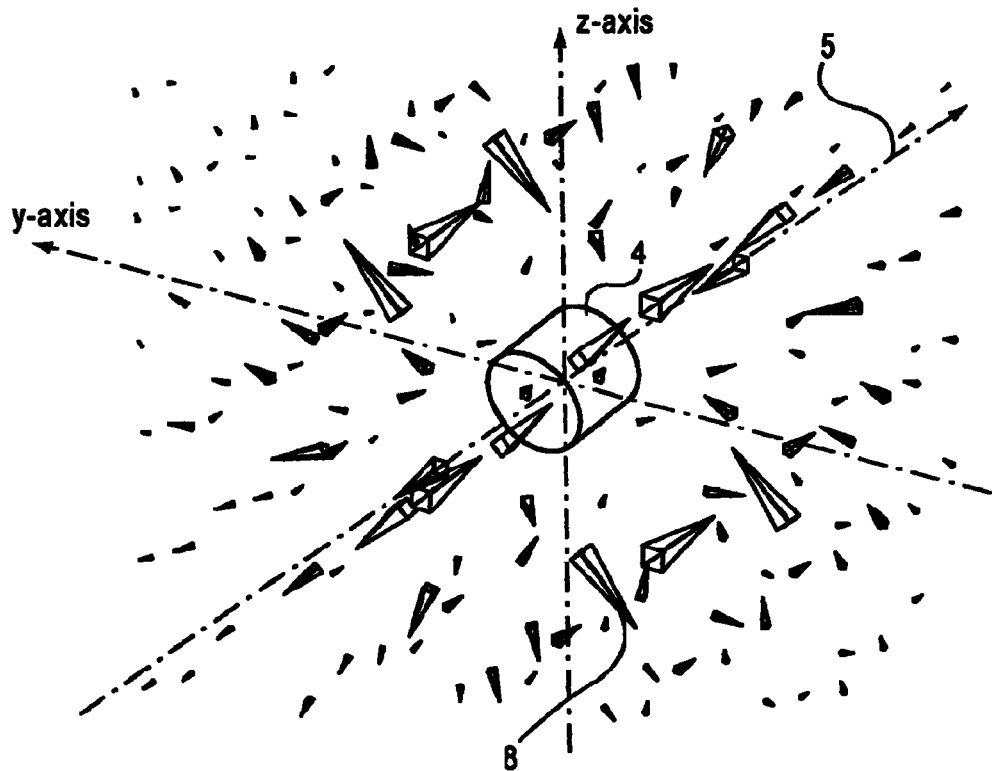
FIG. 6 is a schematic explanatory diagram sterically showing a vector of the direct-current magnetic flux density where a magnet is generated.

A vector 8 of the direct-current magnetic flux density B with a stereoscopic magnetic line where the magnet 4 whose central axis is installed to be horizontal is shown stereoscopically in FIG. 6. The vector 8 has various directions and scalar amounts depending upon the space expressed with the coordinate of x, y and z. For the scalar amount of the magnetic flux density leaking to outside of the examination room 10, a value of 500 μT or less is set as a recommended standard for installation. Hereafter, calculation is will be conducted using specific numerical values as an example; however, the numerical values, such as intensity of magnet or size of the examination room, are calculation examples, and the present invention may not be constrained to these numerical values.

In order to simulate a magnet equivalent to 1.5 T, approximately 4.4 MA/m2 of electric current is applied to a magnet 4 with 1 m of diameter and 1 m of length and a magnetic field is generated. The size of the examination room 10 for 500 μT or less, which is a recommended standard of the leaking direct-current magnetic flux density B, is 9 m in the x-axis direction and 7.2 m in the y-axis direction. Hereafter, the case where the shield door 17 is installed to the wall of such shape of examination room 10 is assumed and calculation is will be conducted. Furthermore, an origin of coordinates is set to the center of the magnet 4.

Figure 7:
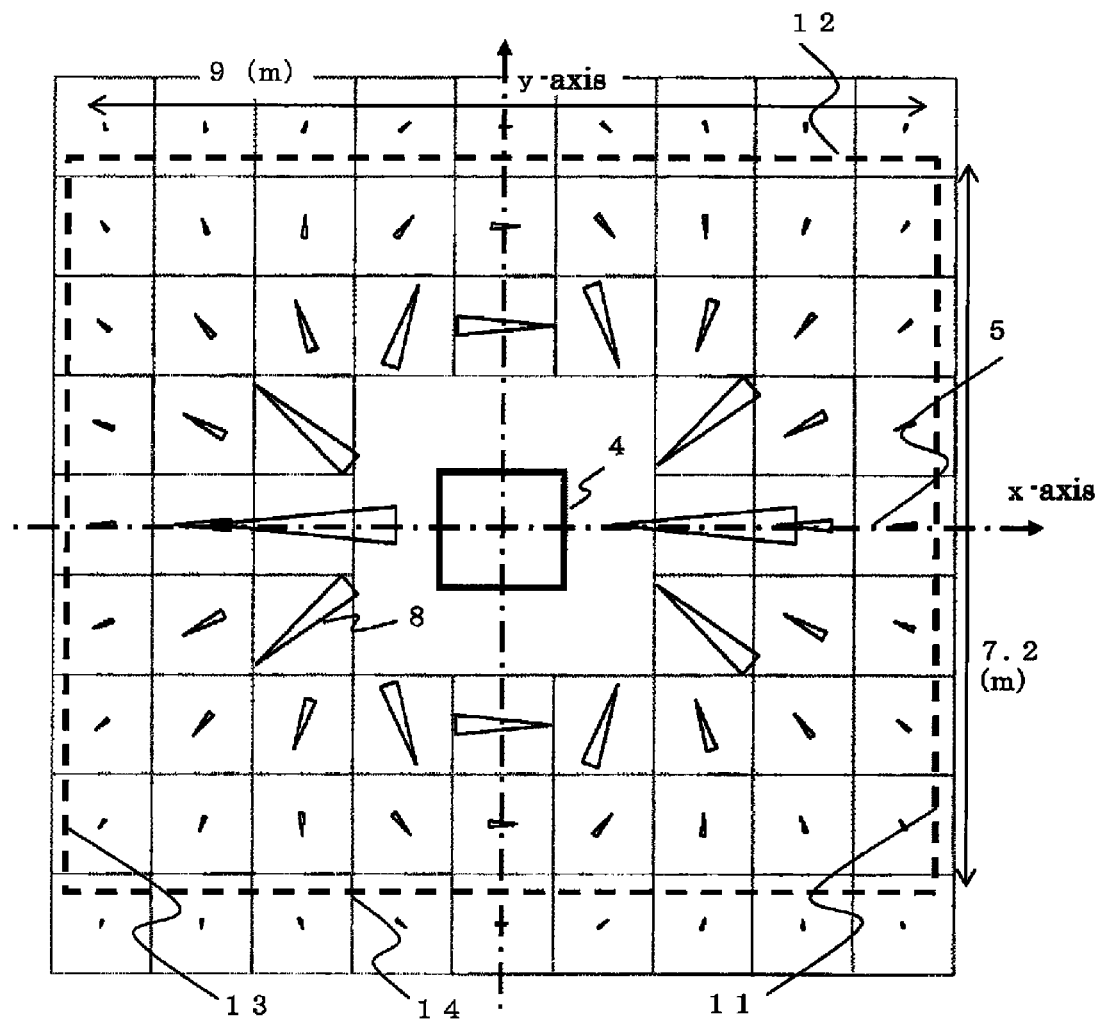
FIG. 7 is a schematic explanatory diagram showing a vector of the direct-current magnetic flux density on the plane with z=0.
Figure 8:
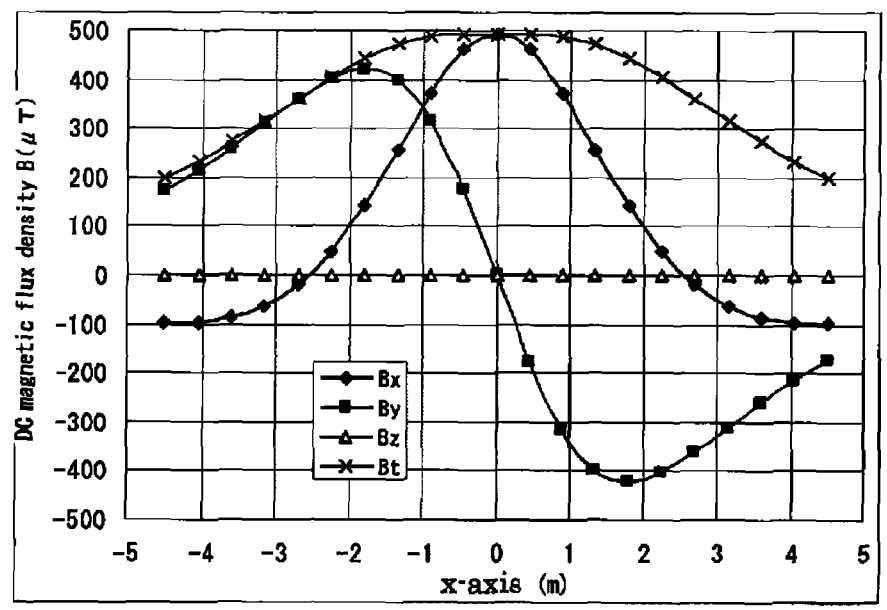
FIG. 8 is a graph showing the magnitude of the direct-current magnetic flux density in one wall.
Figure 9:
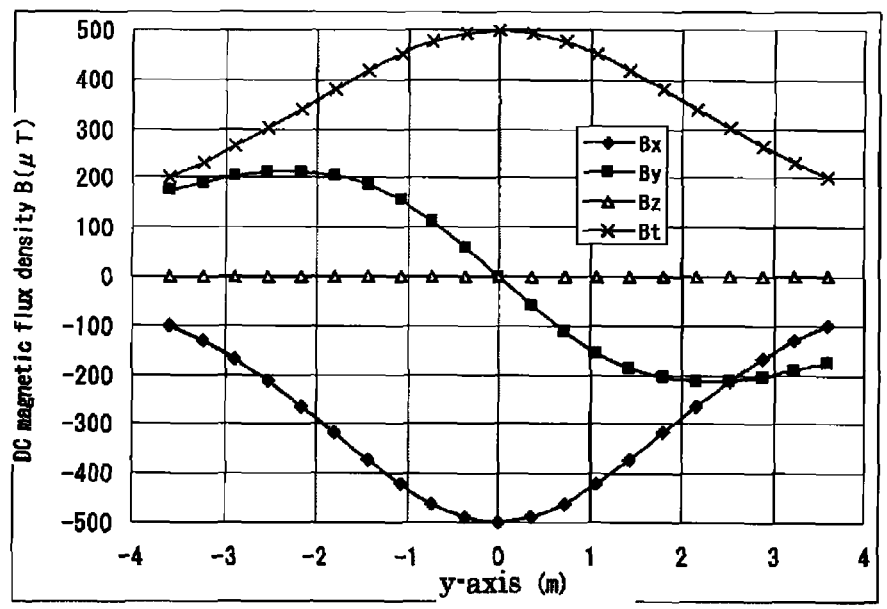
FIG. 9 is a graph showing the magnitude of the direct-current magnetic flux density in one wall.

FIG. 7 shows the vector 8 of the direct-current magnetic flux density B on the plane with z=0 of the examination room 10. FIG. 8 shows components in x, y and z directions and the direct-current magnetic flux density of the scalar amount Bx, By, Bz and Bt in the wall 11 shown in FIG. 7. Similarly, FIG. 9 shows the direct-current magnetic flux density of the scalar amount Bx, By, Bz and Bt in the wall 12. Further, the sighs of the walls 11 and 12 are inverted for the direct-current magnetic flux densities of the walls 13 and 14 and absolute values are the same.

According to FIG. 8 and FIG. 9, it is ascertained that the scalar amount Bt of the direct-current flux density is a larger value, 200 to 500 μT.

When the detection axis 2 of the magnetic sensor 1 is placed to be horizontal and it is installed in the x-direction or y-direction, the direct-current magnetic flux density to be applied to the direction of the detection axis 2 is a value of Bx or By. According to FIG. 8 or FIG. 9, the value of Bx or By is 0 μT depending upon a location, and its maximum value is 500 μT.

Therefore, in the case of horizontally installing the detection axis 2, in order to activate without saturation, for the dynamic range of the magnetic sensor 1, 500 μT or more is required. A sensor with a great dynamic range has inevitably low resolution. Therefore, even if a small magnetic body passes through the gate, this cannot be detected.

According to FIG. 8 and FIG. 9 again, the direct-current magnetic flux density Bz in the z-direction, i.e. in the vertical direction is always 0 at any position. This is not to generate the direct-current magnetic flux density B in the direction at right angles to each other with the central axis 5 of the magnet 4. Therefore, if the magnetic sensor 1 is arranged on the plane with z=0 and the detection axis 2 is placed in the z-axis direction, which is a vertical direction, the direct-current magnetic flux density in the direction of the detection axis 2 is Bz=0 regardless of the installation position of the shield door 17.

Therefore, if the detection axis 2 of the magnetic sensor 1 is installed in the vertical direction on the plane with z=0, even though a magnetic sensor with a small dynamic range is used, it will not be saturated. If the magnetic sensor has high resolution even if its dynamic range is small, it is possible to detect a small magnetic bodies.

However, in order to arrange the magnetic sensor 1 on the plane with z=0, the central axis 5 of the magnet 4 is measured and the position of the magnetic sensor has to be matched thereto. In the actual installation task, specialized knowledge is required for this task, and it is unrealistic. It is necessary to be premised that the distance from plane with z=0 to the magnetic sensor 1 will not be 0 according to various factors.

Figure 10:
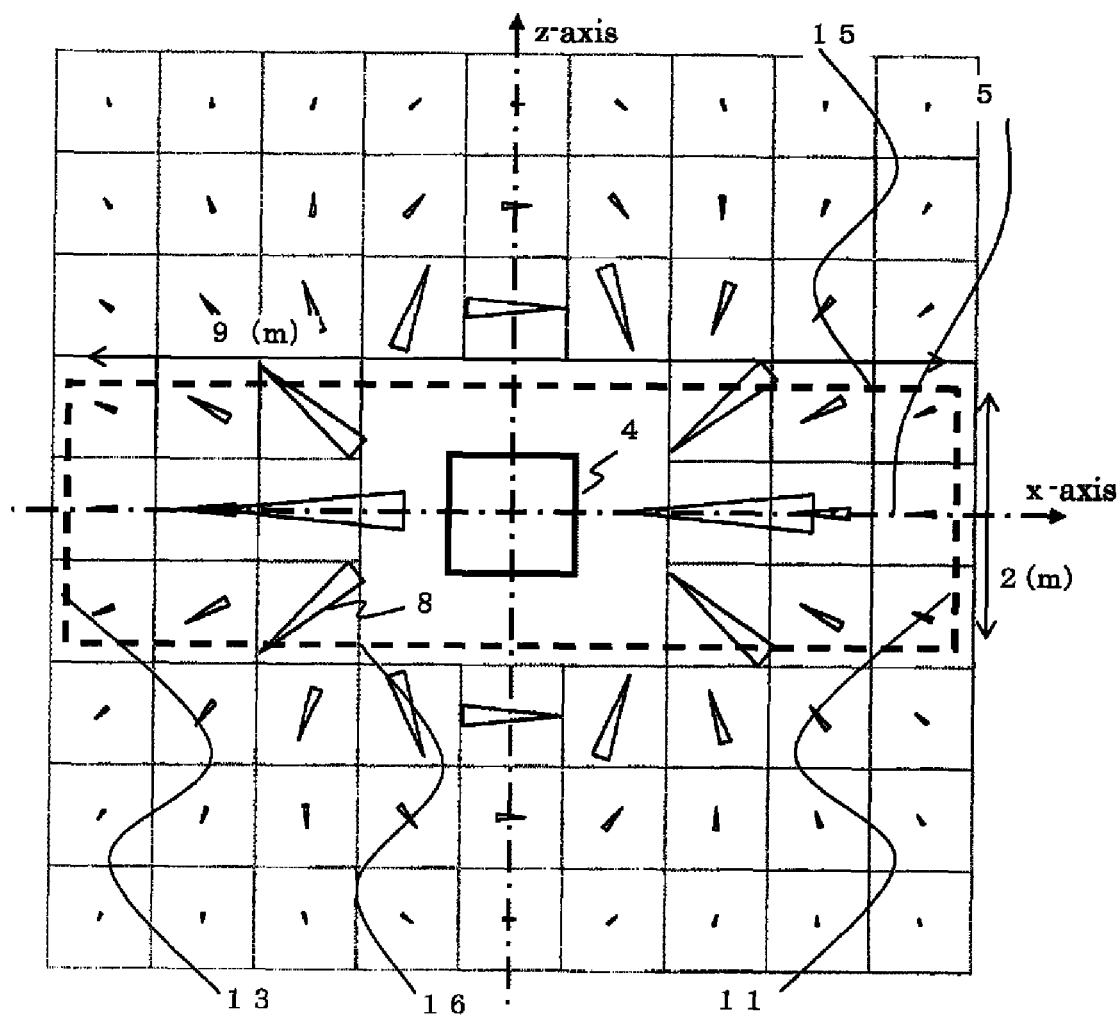
FIG. 10 is a schematic explanatory diagram showing a vector of the direct-current magnetic flux density on the plane with y=0.

From another viewpoint, the vector 8 of the direct-current magnetic flux density B on the front face with y=0 of the examination room 10 is shown in FIG. 10. The direction of the vector 8 and the scalar amount of the direct-current magnetic flux density B to be generated are exactly the same as FIG. 7. However, the distance to the structure, which is the ceiling 15 and the floor 16, is different.

Figure 11:
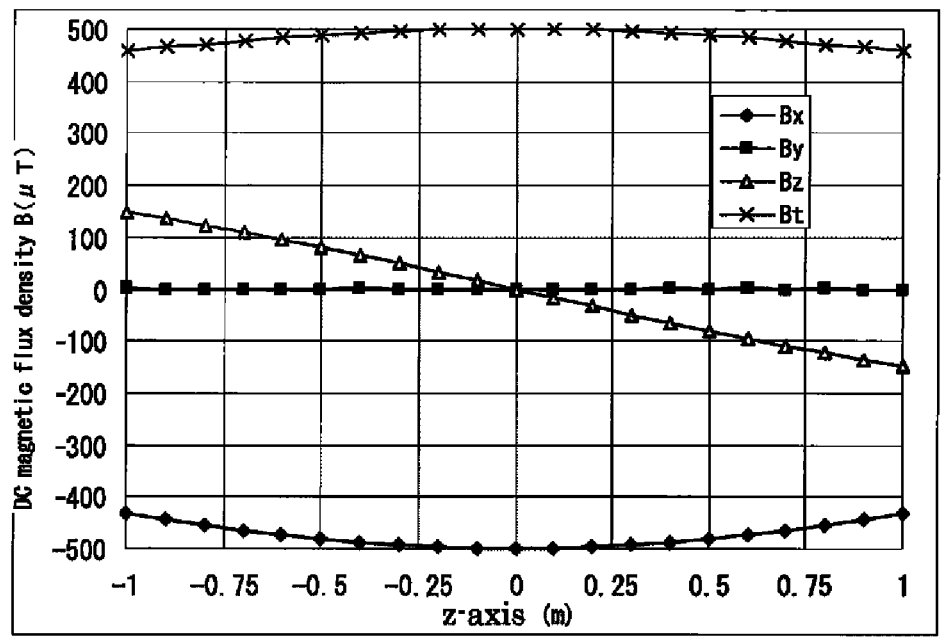
FIG. 11 is a graph showing the magnitude of the magnetic flux density in one wall.
Figure 12:
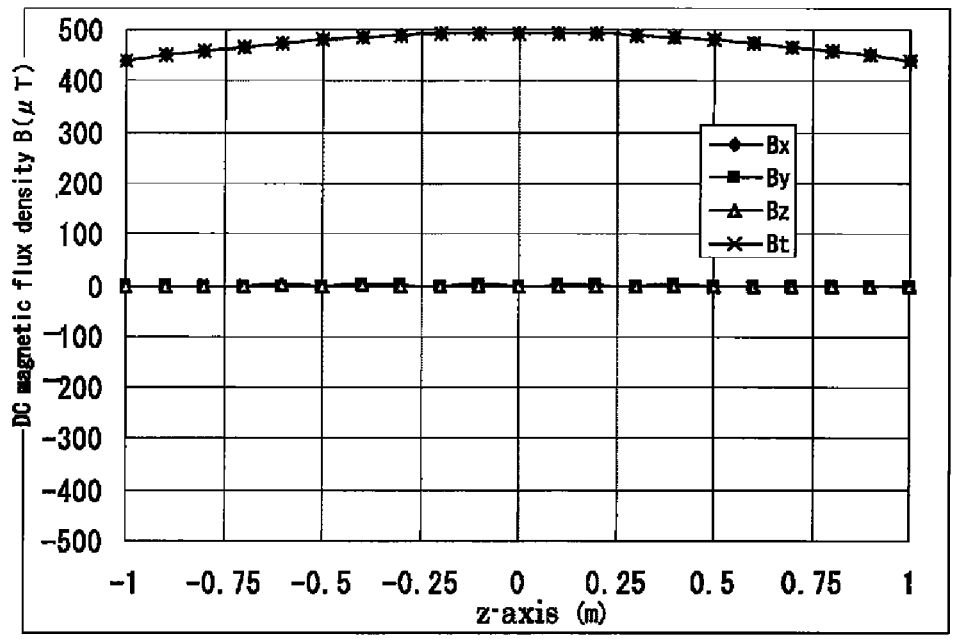
FIG. 12 is a graph showing the magnitude of the magnetic flux density in one wall.

FIG. 11 shows the direct-current magnetic flux density Bx, By, Bz and Bt in the wall 11 when y=0. Further, FIG. 12 shows the direct-current magnetic flux density Bx, By, Bz and Bt in the wall 11 12 when x=0. Furthermore, the signs of the walls 11 and 12 are inverted for the direct-current magnetic flux densities of the walls 13 and 14 and absolute values are the same.

As shown in FIG. 11, it is ascertained that the ceiling 15, which is furthest from the central axis 5, i.e. the position of z=1 m and the floor 16, i.e. the position of z=−1 m, the maximum value of Bz is 150 μT, and this is a smaller value than the maximum value of Bx and By, 500 μT.

In the case of installing the detection axis 2 of the magnetic sensor 1 to the vertical axis 3, the value of the direct-current magnetic flux density Bz to be applied to the detection axis 2 becomes smaller than that in the case of installing the detection axis 2 in the horizontal direction. This is because the distance between the central axis 5 of the magnet and the ceiling 15 or the floor 16 is shorter than the distance from the walls 11 to 14. As the coordinate of z is away from z=0, the value of the direct-current magnetic flux density Bz becomes greater; however, this will be smaller value than Bx and By.

Figure 13:
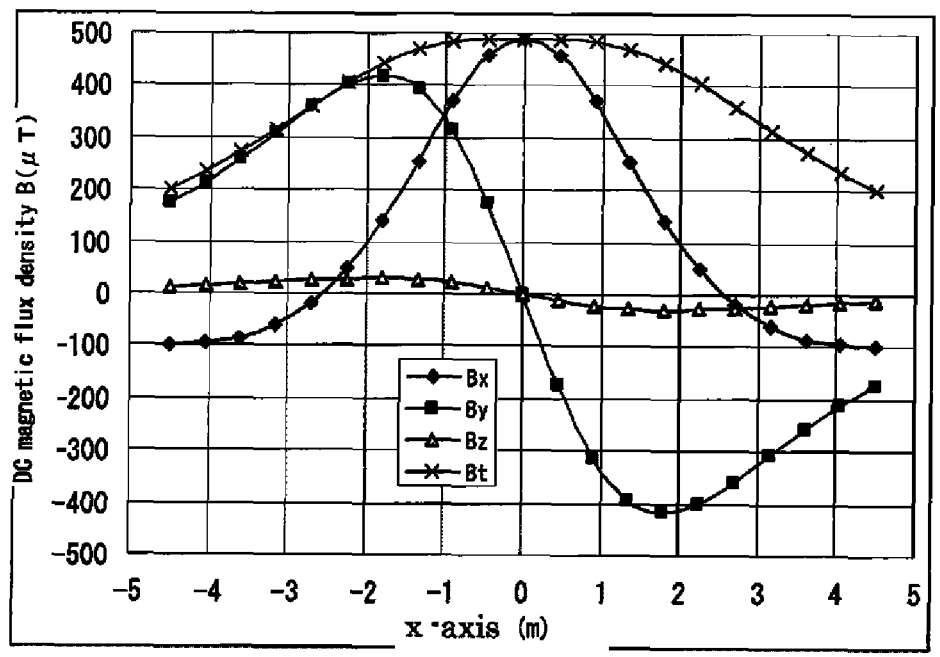
FIG. 13 is a graph showing the magnitude of the magnetic flux density in one wall.
Figure 14:
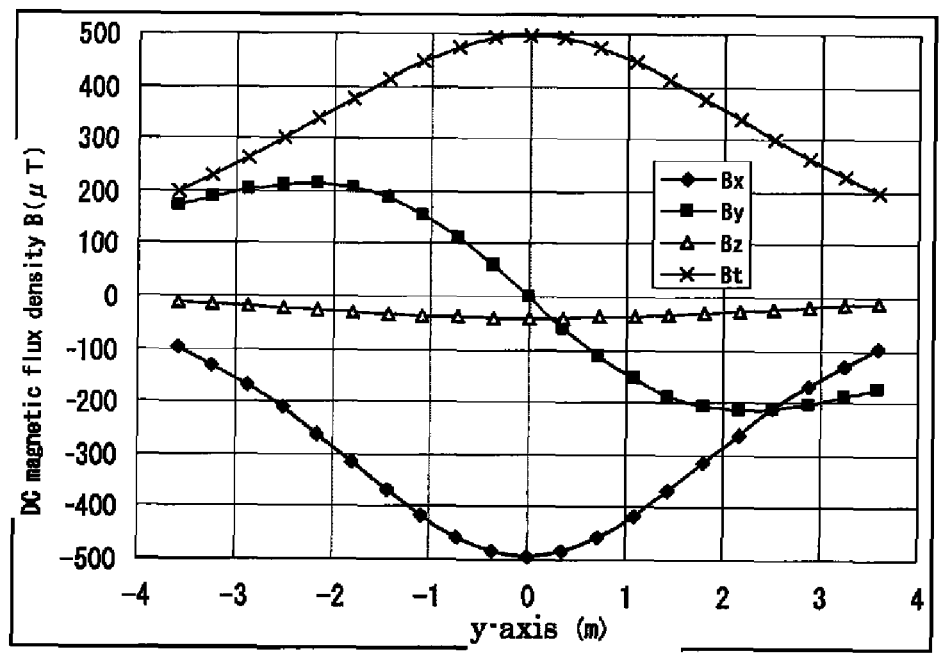
FIG. 14 is a graph showing the magnitude of the magnetic flux density in one wall.

The maximum tolerance of the installation position of the magnetic sensor 1 and the central axis 5 of the magnet 4 is regarded at as 0.25 m, and results of calculation of the direct-current magnetic flux density Bx, By, Bz and Bt in the case of installing the magnetic sensor 1 at the position of the walls 11 and 12 with z=0.25 m are shown in FIG. 13 and FIG. 14. Furthermore, the sign of the magnetic flux density at the position with z=−0.25 m is changed but the absolute value is the same.

According to FIG. 13 and FIG. 14, it is ascertained that the absolute value of the maximum value of the direct-current magnetic flux density Bz in the vertical direction is 50 μT. Therefore, compared to the case of installing the detection axis 2 in the horizontal axis direction, if the detection axis 2 is installed in the vertical axis direction, even if the magnetic sensor 1 with 1/10 of dynamic range is used, the detection action can be conducted without saturation. This means that compared to the case of installing the detection axis 2 in the horizontal axis direction, if the detection axis 2 is installed in the vertical axis direction, even if the magnetic sensor 1 having 10× of optical resolution is used, it can detect a small magnetic bodies without saturation.

As described above, installation of the detection axis 2 of the magnetic sensor 1 in the vertical direction enables using the magnetic sensor 1 without saturation even in the vicinity to the magnet 4 with strong direct-current magnetic flux density. Since it becomes possible to use the supersensitive magnetic sensor 1, it becomes possible to detect a small magnetic body.

Figure 15:
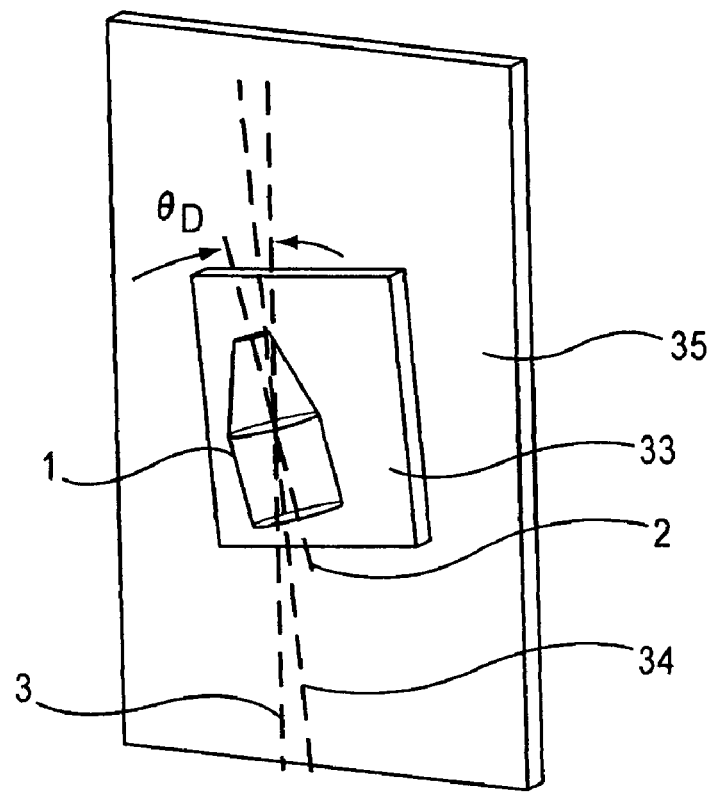
FIG. 15 is a graph showing a positional relationship between a magnetic sensor and a chassis and a wall.

However, as shown in FIG. 15, when the magnetic sensor 1 is mounted to a chassis 18, the detection axis 2 is not always agreed with a chassis axis 19 of the chassis 18. Similarly, when the chassis 18 is installed to the wall 20, the chassis axis 19 does not always align with the vertical axis 3. It is impossible to completely align the detection axis 2 with the vertical axis 3 because of an error, such as various tolerances.

Then, a tolerance θD to some degree shall be pre-set in the solid angle formed by the detection axis 2 and the vertical axis 3. However, if θD is excessively great, because the direct-current magnetic flux density Bs to be generated to the detection axis 2 of the magnetic sensor 1 is becomes greater, it is saturated and cannot be activated. If the direct-current magnetic flux density Bs in the detection axis direction is 30% or less of the direct-current magnetic flux density B, according to Mathematical expression 1, the solid angle θD formed with the detection axis 2 of the magnetic sensor 1 and the vertical axis 3 should be 15 degrees or less. As long as the solid angle θD is within this range, it is difficult to be saturated.

The above-mentioned explanation is applied in the case of installing the central axis 5 of the magnet 4 in the horizontal direction. However, among open-type MRI diagnostic systems, as shown in FIG. 2, there are some systems where the central axis 5 of the magnet 4 is installed in the vertical direction. In such MRI diagnostic system, the direct-current magnetic flux density B in the vertical direction is greater and the direct-current magnetic flux density B in the horizontal direction is smaller. Therefore, in the case of installing the detection axis 2 of the magnetic sensor 1 in the vertical direction, it is saturated and cannot be activated.

In the environment where the central axis 5 of the magnet 4 is installed in the vertical direction, the detection axis 2 of the magnetic sensor 1 is horizontally installed. Because an installation tolerance similarly exists, the solid angle θD formed with the detection axis 2 of the magnetic sensor 1 and the horizontal axis 6 should be 15 degrees or less. It becomes difficult to be saturated as long as within this range.

The direction of the detection axis 2 of the magnetic sensor 1 varies according to the installation direction of the central axis 5 of the magnet 4. Therefore, it is impossible to apply one type of magnetic body detector to two types of MRI diagnostic systems. However, since two types of MRI diagnostic systems will never be used at the same location, this is not particularly a problem.

There is no problem as long as the solid angle with the detection axis 2 of the magnetic sensor 1 is 15 degrees or less with regard to the vertical axis or the horizontal axis; however, taking the special environmental condition into consideration, there is no problem even if a function for adjusting an angle is established, so there is no problem.

Further, if the function for adjusting an angle is used in order to address two types of MRI diagnostic systems having different central axes from each other, there is no problem.

As the a magnetic sensor used in the present invention, as long as the magnetic sensors does not to generate a magnetic field by itself, such as an MR sensor other than a magnetic coil, an MI sensor, a flux gate sensor or a hall element, the problems about the magnetic interference, the step difference, the cost and the power consumption can be solved.

Next, detection of a small magnetic body by a plurality of magnetic sensors relating to the present invention will be described hereafter.

The change in magnetic flux density delta B at the position of the magnetic sensor generated by the magnetic body complicatedly varies due to various parameters.

The value greatly changes according to magnetic permeability, a shape, a dimension or a direction of the magnetic body. Further, this value greatly changes according to a distance from the magnetic sensor or the direction, as well. These cannot be expressed with simple mathematical expressions basically according to the physical laws; however, because the actual shape or the like is complicated, they cannot be simply obtained. An extremely complicated analysis is required.

One of important parameters among these is a distance between a magnetic body and a magnetic sensor. As the a basic laws of physics, the change in magnetic flux density delta B is inversely proportional to the square of distance between the magnetic body and the magnetic sensor. Due to these this laws of physics, the magnetic sensor greatly reacts to the magnetic body at the position close to the magnetic sensor; however, the reaction to the magnetic body at a further position is small.

In actuality, due to complicated parameters, the reaction will not be as in the simple calculation; however, it basically follows the law.

When the height of the shield door is approximately 2 m and width is approximately 1.4 m, and in the case of installing the magnetic sensor to one corner, the distance to an opposing corner is approximately 2.4 m.

When a magnetic body passes very close to the magnetic sensor, the magnetic sensor greatly reacts. However, in the case of passing the opposing corner, only an extremely small reaction is confirmed. This phenomenon is to be determined by the change in magnetic flux density delta B determined according to a distance, and there is no relation with to the type and sensitivity of the magnetic sensor.

Therefore, in the case that a magnetic body passes through the position far from the magnetic sensor by accident, there is a possibility that this cannot be detected.

Figure 16:
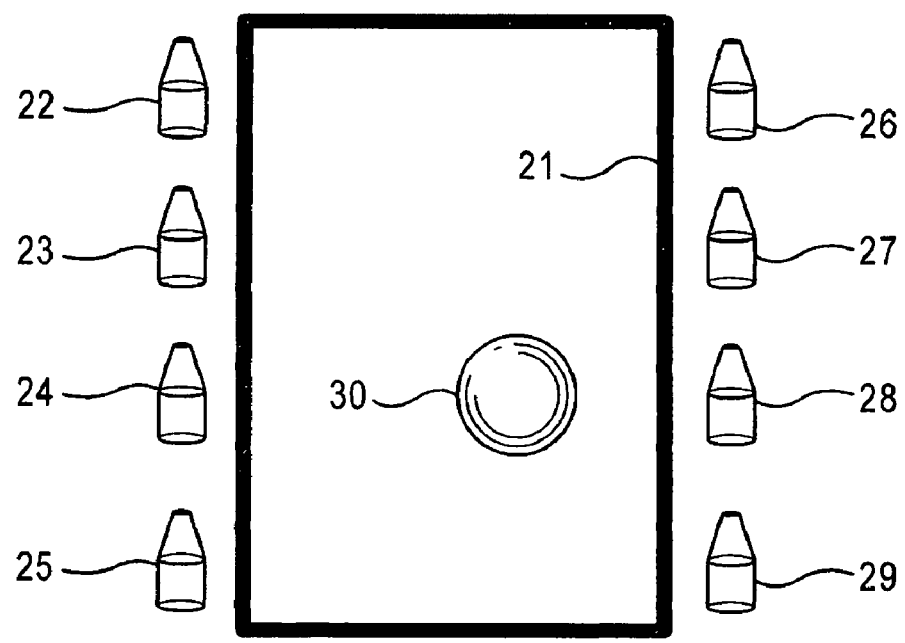
FIG. 16 is a schematic explanatory diagram showing one configuration mode of the magnetic body detector relating to the present invention.

Then, as shown in FIG. 16, a plurality of magnetic sensors 22 to 29 are installed around the periphery of a gate 21, which is equivalent to the shield door. A passing magnetic body 30 passes through the gate 21.

In FIG. 16, eight magnetic sensors are shown; however, the as-needed quantity is established. Further, the gate 21 means space where a user or a substance passes and the passing magnetic body 30 is detected. Therefore, the gate 21 does not have to be configured with a concrete structure.

Which position of the gate 21 the passing magnetic body 30 passes through is indefinite. However, wherever the magnetic body passes through, it approaches to either one of the magnetic sensors 22 to 29. When the passing magnetic body 30 passes through the center of the gate 21, it is the furthest position from the magnetic sensors 22 to 29; however, this is merely approximately 70 cm, which is one-half of approximately 1.4 m, width of the gate 21.

Compared to approximately 2.4 m, width distance across corner in the case that the number of magnetic sensor is one, since the distance becomes approximately 0.3 times, the change in magnetic flux density delta B becomes 11.8 times greater.

Even if the passing magnetic body 30 and one magnetic sensor are far from each other, as long as other magnetic sensor is close, it is possible to detect the passing magnetic body 30. Therefore, there is no problem as a detection function of the entire device.

As described above, the change in magnetic flux density delta B is inversely proportional to the square of the distance between the magnetic body and the magnetic sensor. Therefore, it is impossible to detect an entire gate, which is a space where a magnetic body passes, by one sensor. This space should be detected by establishing the magnetic sensors at both right and left sides of the gate. The change in magnetic flux density delta B at the position of the magnetic sensor can be four times by reducing the maximum distance between the magnetic body and the magnetic sensor to ½.

As described above, it becomes possible to detect the passing magnetic body 30 by installing a plurality of magnetic sensors 22 to 29 around the periphery of the gate 21.

Next, control of the effect of the change in magnetic flux density delta B to be generated due to the movement of a magnetic body in a distance or in the vicinity that does not pass through the gate and control of the effect of movement rate of a magnetic body according to the calculation relating to the present invention will be described hereafter.

Figure 17:
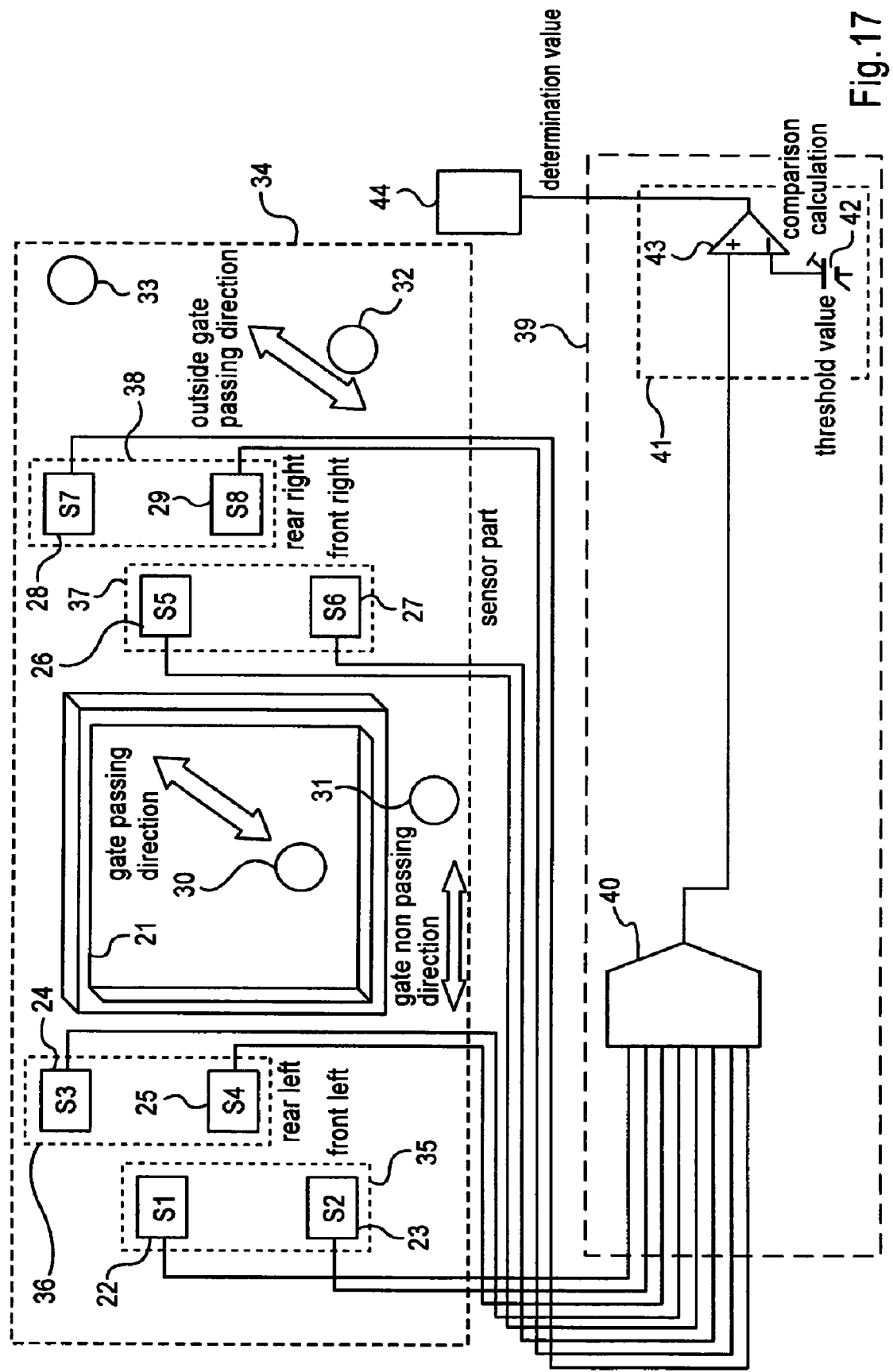
FIG. 17 is a schematic explanatory diagram showing one configuration mode of the magnetic body detector relating to the present invention.

FIG. 17 shows a block diagram of this magnetic body detector.

A sensor part 34 is composed of four sensor units 35 to 38 arranged in the front, rear, right and left of the gate 21. A plurality of magnetic sensors 22 to 29 are built into the sensor units 35 to 38. In FIG. 17, two magnetic sensors built into one sensor unit are shown; however, it is equipped with the as-needed quantity. The passing magnetic body 30 is a magnetic body that passes through the gate 21. A non-passing magnetic body 31 is a magnetic body that does not pass through the gate 21. A gate outside magnetic body 32 is a magnetic body that passes through the outside the gate 21. A far magnetic body 34 is a magnetic body far from the gate 21. An operating part 39 is composed of a magnetic signal processing part 40 and a determination part 41 of the magnetic sensor. The determination part 41 is composed of a threshold value input function 42 for entering a threshold value and a comparison calculation function 43.

A notification function 44 is a function for notifying a warning to a user. As a means of notification, methods such as by a light or sound are available. Further, there is a method using a plurality of means. There is another method of notification such that the location where notification is provided is not only at one location but at a plurality of locations.

The present magnetic body detector detects the passing magnetic body 30, and if the detection value is a threshold value or more, the notification function 44 is activated.

However, the magnetic body being in the sensor part 34 is not only the passing magnetic body 30. The non-passing magnetic body 31, the gate outside passing magnetic body 32 and the far magnetic body 33 and the like are being in the sensor part. When these are detected and the notification function 44 is activated, an unnecessary notification occurs frequently. When an unnecessary notification occurs frequently by the magnetic bodies 31 to 33, a user determines that this magnetic body detector malfunctions. When a user receives unnecessary notifications is successively, the a user may not trust this magnetic body detector or may ignore or may stop the function.

In this state, when the passing magnetic body 30 actually passes through the gate 21 and is brought in the MRI examination room, there is a risk a user may ignore the notification resulting in a the magnet attraction accident.

According to the above-mentioned reasons, the notification is activated about the passing magnetic body 30; however, it is ideal not to activate the notification for the non-passing magnetic body 31, the gate outside passing magnetic body 32 and the far passing magnetic body 33. Therefore, it is desirable to detect only the passing magnetic body 30, but not to detect other magnetic bodies.

However, the magnetic sensors 22 to 29 detect a magnetic body no matter where the magnetic body is located. This is magnetic law of physics, and it is impossible to detect only the passing magnetic body 30 in principle.

Although it is impossible to allow the magnetic sensors 22 to 29 to detect only the passing magnetic body 30; however, it is possible to extract characteristics of detection signals of non-passing magnetic body 31, the magnetic body passing outside a gate 32 and the far magnetic body 33, and to control them.

In this magnetic body detector, this signal processing is conducted by a signal processing part 40.

Further, the passing magnetic body 30 does not always move at the same speed. It may move fast, or may move slowly.

In the case of moving fast, for the change in magnetic flux density delta B, an amount of change is great; however, it will be restored in a short time. In the meantime, in the case of moving slowly, the change in magnetic flux density delta B changes for a long time; however, an amount of change is small. This phenomenon is also based upon the laws of physics, and it is impossible to change this.

Regarding the difference in the movement rate of the magnetic body, the difference is controlled by signal processing of these using the signal processing part 40.

Next, it will be described that the configuration and mode shown in FIG. 17 is effective, in due order.

At first, a basic method where the notification function 44 is activated according to the detection signal of one magnetic sensor 22 will be described hereafter.

Figure 18:
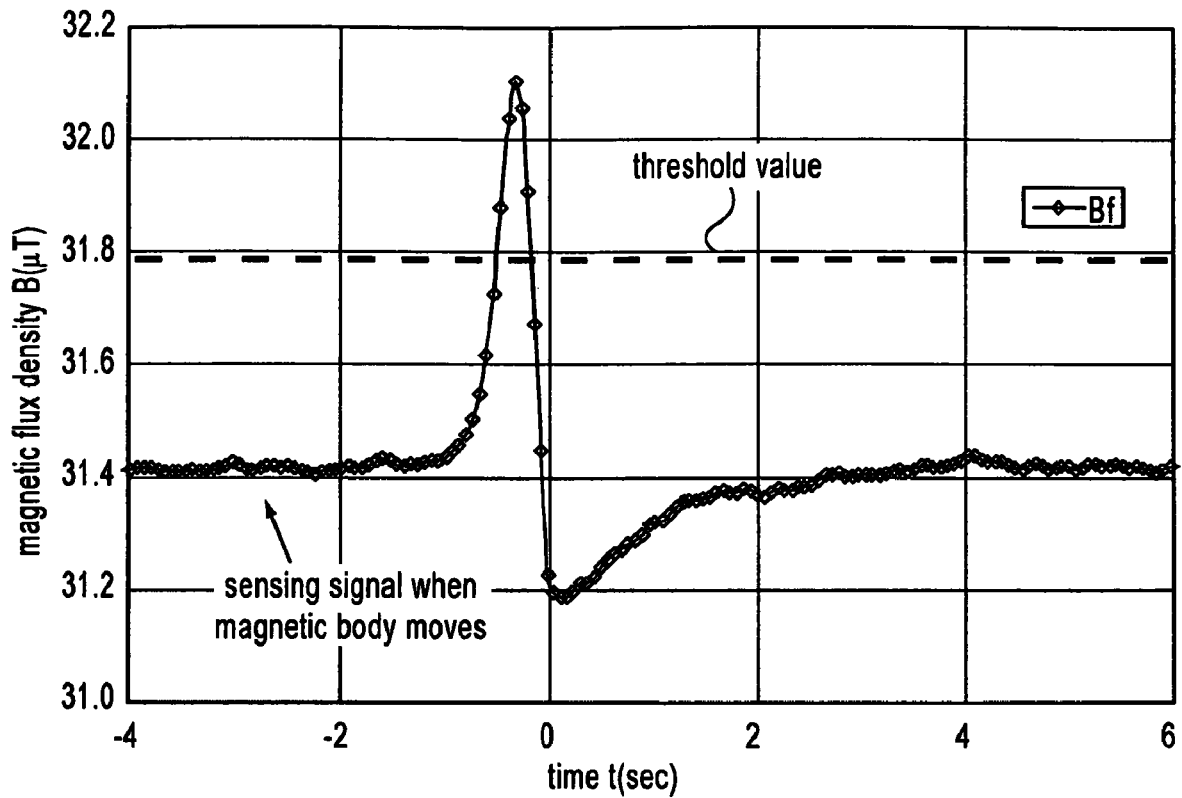
FIG. 18 is a schematic explanatory diagram showing an output result example when a magnetic sensor detects a magnetic body.

FIG. 18 shows a change in magnetic flux density Bf at the time of moving the passing magnetic body 30 to one direction in the vicinity of the magnetic sensor 22. Approximately 30 μT of geomagnetism exists on earth, and if there is no strong magnet in the vicinity, the magnetic flux density B changes in the condition where this geomagnetism is applied. As it is obvious from FIG. 7, the output signal Bf of the magnetic sensor 22 is changed centering on 31.4 μT.

Figure 19:
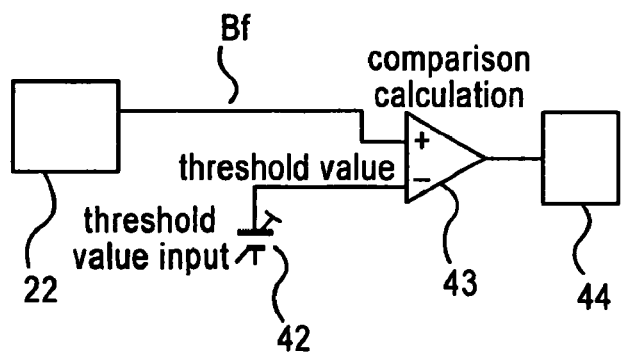
FIG. 19 is a schematic explanatory diagram showing a functional configuration example for notifying a magnetic body using a comparison function.

As a method for most simply detecting this signal, there is a configuration using the comparison function 43 as shown in FIG. 19. A detection signal Bf of the magnetic sensor 22 and a threshold value entered by the threshold value input function 42 are determined using the comparison function 43, and the notification function 44 is activated. According to FIG. 18, if the threshold value is set at approximately 31.8 μT, it is possible to detect the magnetic body 30 and notify the detection.

However, a plurality of magnetic sensors 22 to 29 are established so as to obtain a sufficient change in magnetic flux density delta B even if the passing magnetic body 30 passes through any position of the gate 21.

Figure 20:
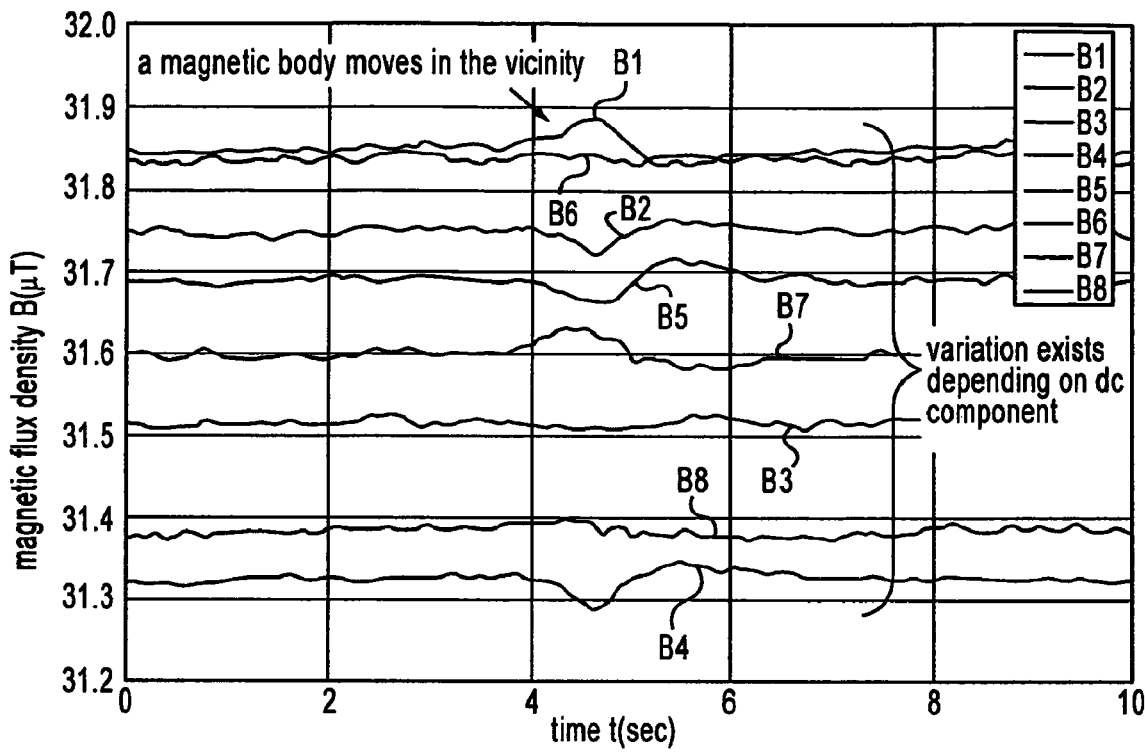
FIG. 20 is a schematic explanatory diagram showing an output result example when eight magnetic sensors detect a small magnetic body in the vicinity.

FIG. 20 shows outputs Bn of eight magnetic sensors 22 to 29 indicated with B1 to B8 as an example. As shown in FIG. 20, the center of the output of each magnetic sensor varies from 31.3 to 31.9 μT. This is because the magnetic sensor is an industrial product, the variation is not zero. Further, geomagnetism changes to some degree according to time. The magnetic sensor itself has a temperature characteristic and variation with time, and the center of output is not always constant. Further, although output values of eight magnetic sensors are shown in FIG. 20, the quantity is not defined as long as a plurality of magnetic sensors are used. Therefore, in the configuration shown in FIG. 19, the threshold value input functions 42 are established as many as the magnetic sensors, and they have to be always adjusted one by one. This adjustment requires specialized knowledge, and it is extremely difficult for an ordinary user to adjust the function, and this is not realistic.

Figure 21:
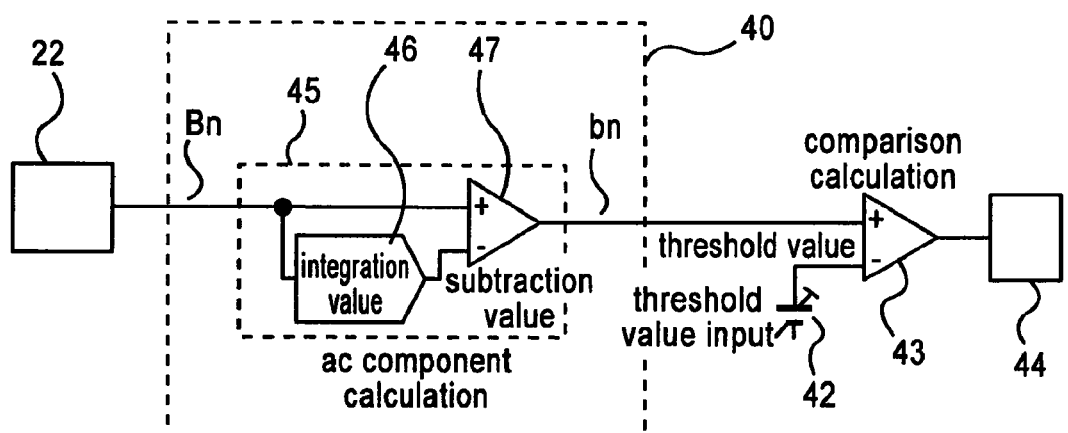
FIG. 21 is a schematic explanatory diagram showing a functional configuration example for notifying a magnetic body using an alternating-current component calculation function.

A fundamental reason to be a problem in the configuration shown in FIG. 19 is to generate variation to the direct-current component in the output Bn of the magnetic sensor. Then, as shown in FIG. 21, this can be solved by establishing an alternating current component calculation function 45 for extracting only an alternating-current component among the detection signals of the magnetic sensor. As a specific configuration method for the alternating-current component calculation function 45, a method of combining an integration function 46 and a subtraction function 47, a method of removing a direct-current component electrically using a capacitor and resistor, etc. are available.

Figure 22:
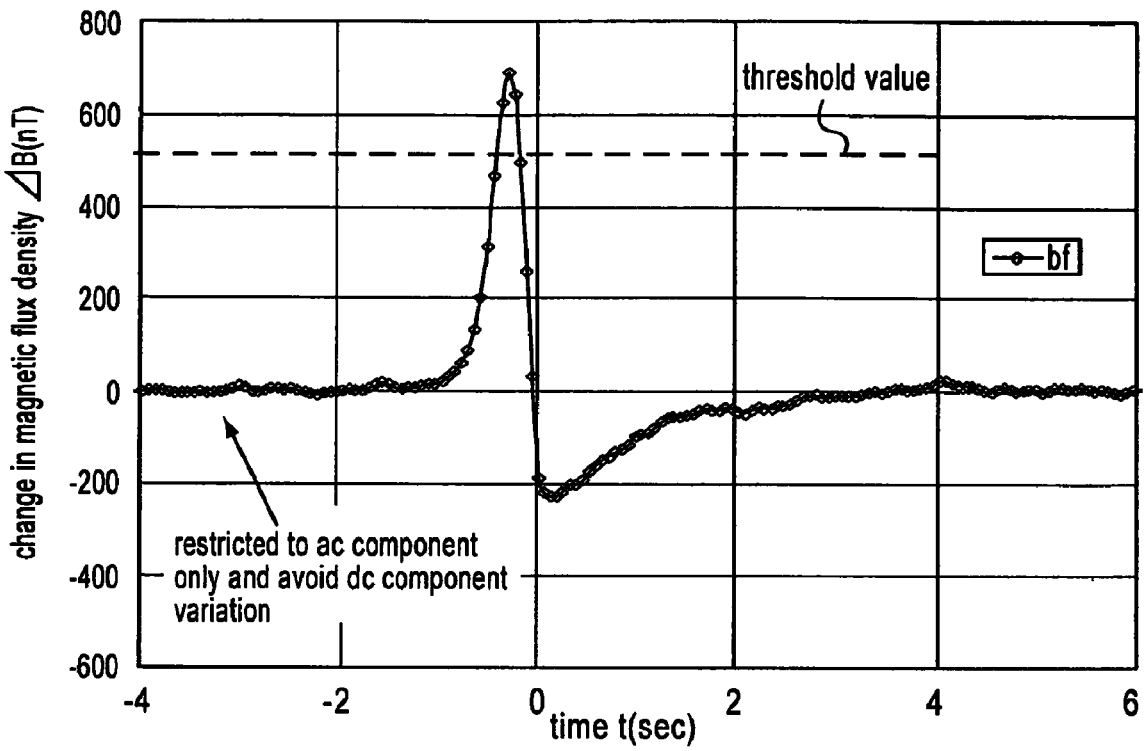
FIG. 22 is a schematic explanatory diagram showing an output result example of the alternating-current component calculation function.
Figure 23:
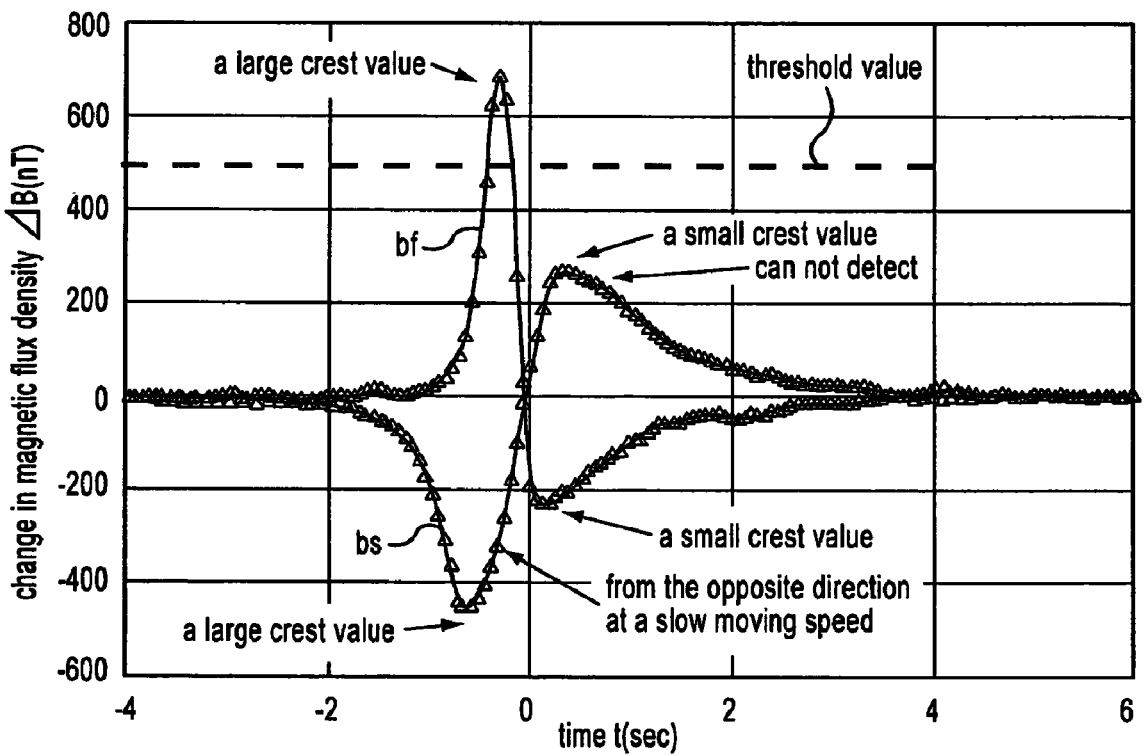
FIG. 23 is a schematic explanatory diagram showing an output result example of the alternating-current component calculation function of a magnetic body that moves from an opposite direction at slow speed.

FIG. 22 shows an alternating-current component signal bf of the magnetic flux density Bf to be obtained using the configuration shown in FIG. 21. Because there is no direct-current component, if the threshold value is set at approximately 500 nT, it is possible to determine the presence of the passing magnetic body 30. If this configuration is used, even if a plurality of magnetic sensors is established, it becomes unnecessary to adjust a threshold value one by one. However, the traveling direction of the passing magnetic body 30 is not always the same; there is also a case where it moves from the opposite direction. Further, the movement rate is not also uniform, and it may be faster and slower. FIG. 23 shows an alternating-current component bs of the output Bs of the magnetic sensor in the case that the passing magnetic body 30 moves from the opposite direction shown in FIG. 18 at slower speed.

As shown in FIG. 23, the polarity of bs whose crest value is large is at a negative side. When the threshold value is set at approximately 500 nT, bf can be detected; however, it is impossible to detect bs.

Figure 24:
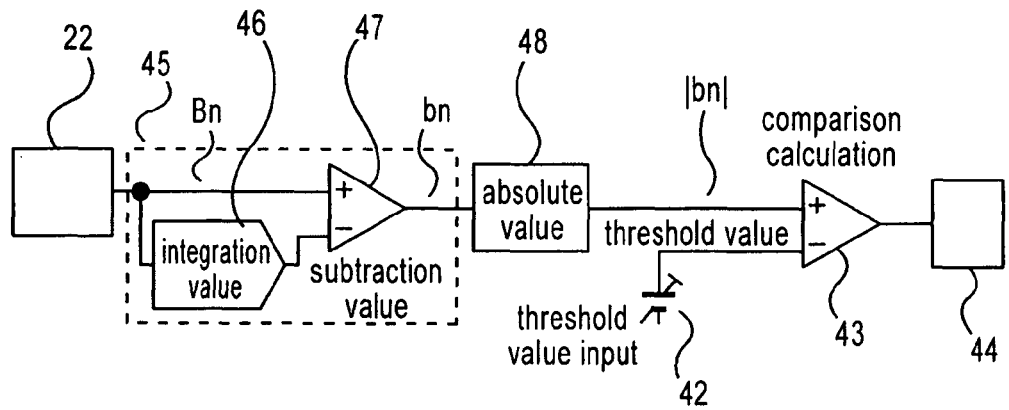
FIG. 24 is a schematic explanatory diagram showing a functional configuration example for notifying a magnetic body using an absolute value calculation function.

As a method where even if the passing magnetic body 30 moves from any direction, the magnetic body is detected with a larger crest value, a method of establishing an absolute value calculation function 48 as shown in FIG. 24 is available. As the configuration method of the absolute value calculation function 48, in addition to the method of numeric operation, a method of configuration electrically using a diode bridge, etc. is available.

Figure 25:
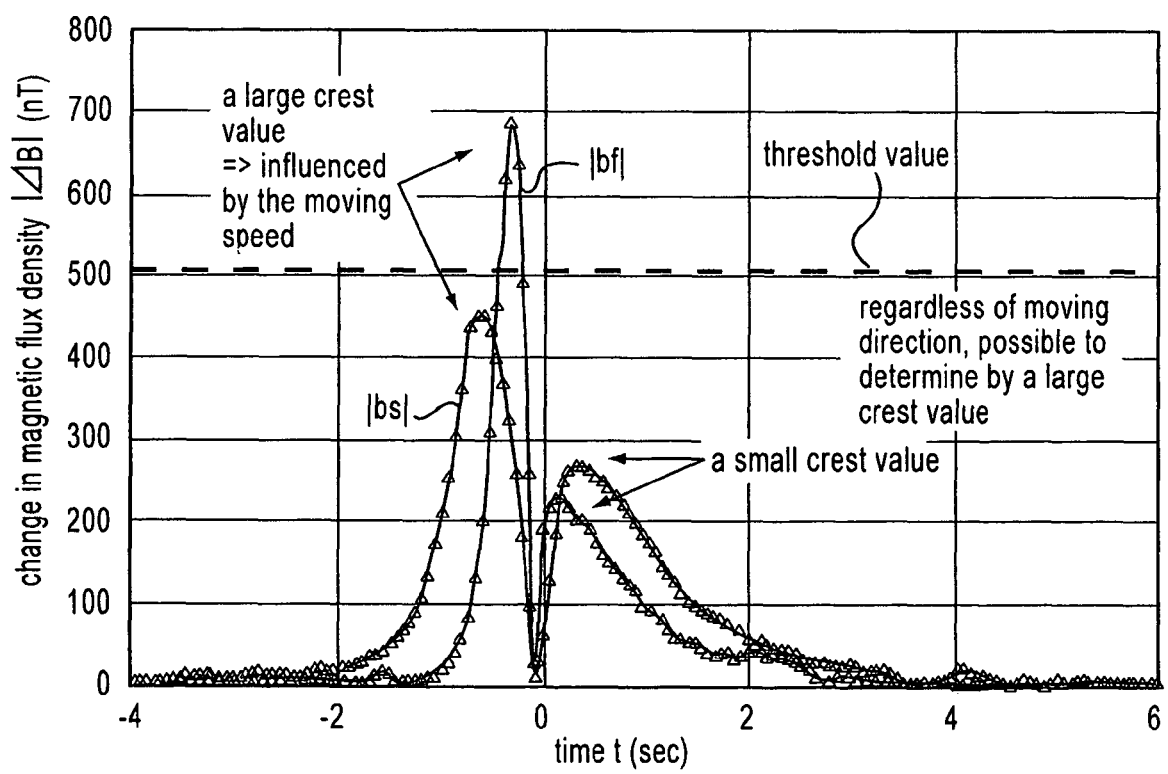
FIG. 25 is a schematic explanatory diagram showing an output result example of the absolute value calculation function.

FIG. 25 shows outputs |bf| and |bs| in the case of adding the absolute value calculation function 48 in FIG. 24. As shown in FIG. 25, even if the passing magnetic body 30 moves from any direction, it is possible to detect the magnetic body with a large crest value.

However, the signal |bs| in the case that the movement rate of the passing magnetic body 30 is slow has a smaller crest value than the signal |bf| in the case that the movement rate is faster. This is because the time period required for passage is longer in bs regardless of the same energy to be generated by moving the passing magnetic body 30 in bf and bs, the crest value becomes smaller.

Figure 26:
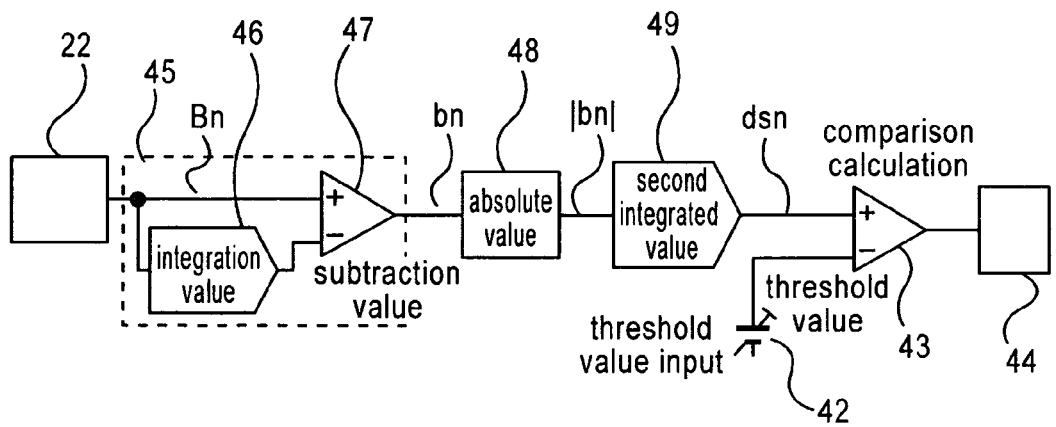
FIG. 26 is a schematic explanatory diagram showing a functional configuration example for notifying a magnetic body using an integration calculation function.

Then, the configuration to add an integration calculation function 49 for integrating |bn| with time is shown in FIG. 26. As a configuration method of the integration calculation function 49, in addition to the method for math calculation, a method of electrically comprising a capacitor and a resistor is available.

Figure 27:
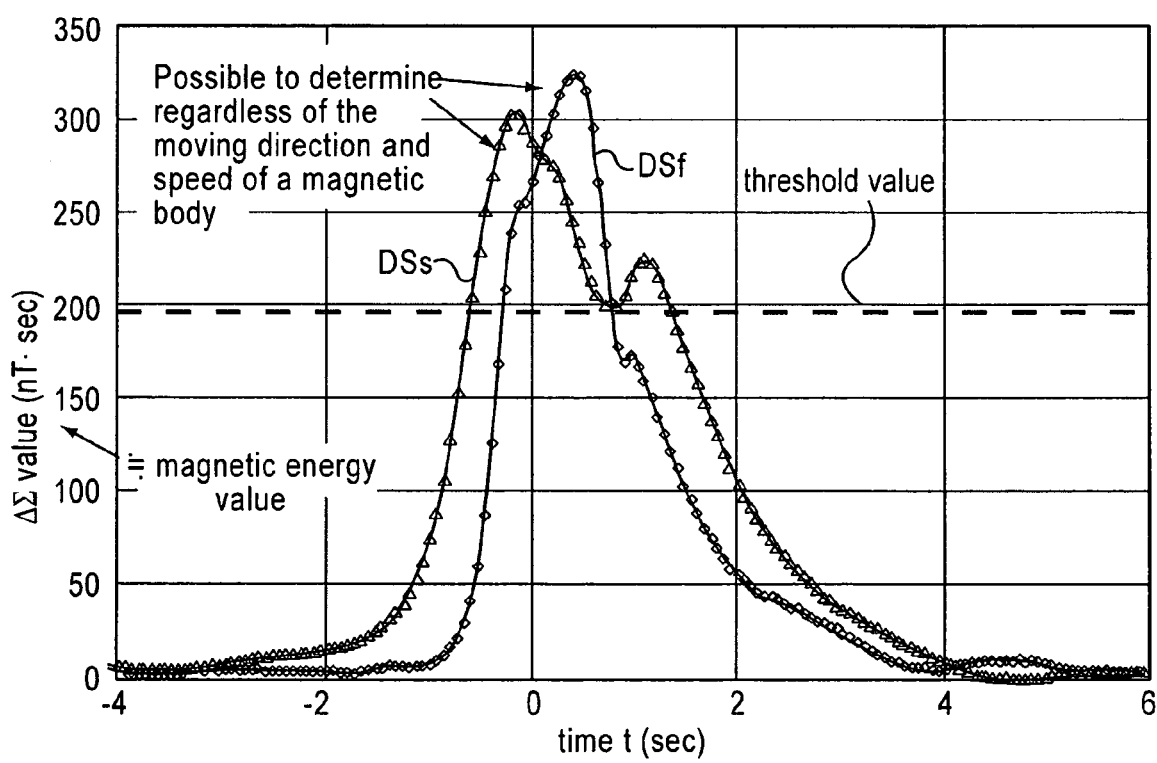
FIG. 27 is a schematic explanatory diagram showing an output result example of the integration calculation function.

FIG. 27 shows outputs DSf and DSs in the case of adding the integration calculation function 49 in FIG. 26. According to FIG. 27, the effect of the movement rate of the passing magnetic body 30 is controlled and substantially the same value is indicated. In the case of FIG. 20, if the threshold value is set at approximately 200 nT·sec, it is possible to detect both DSf and DSs. As described above, an operating technique to integrate (sigma) an amount of change (delta) is referred to as delta-sigma operating method.

Figure 28:
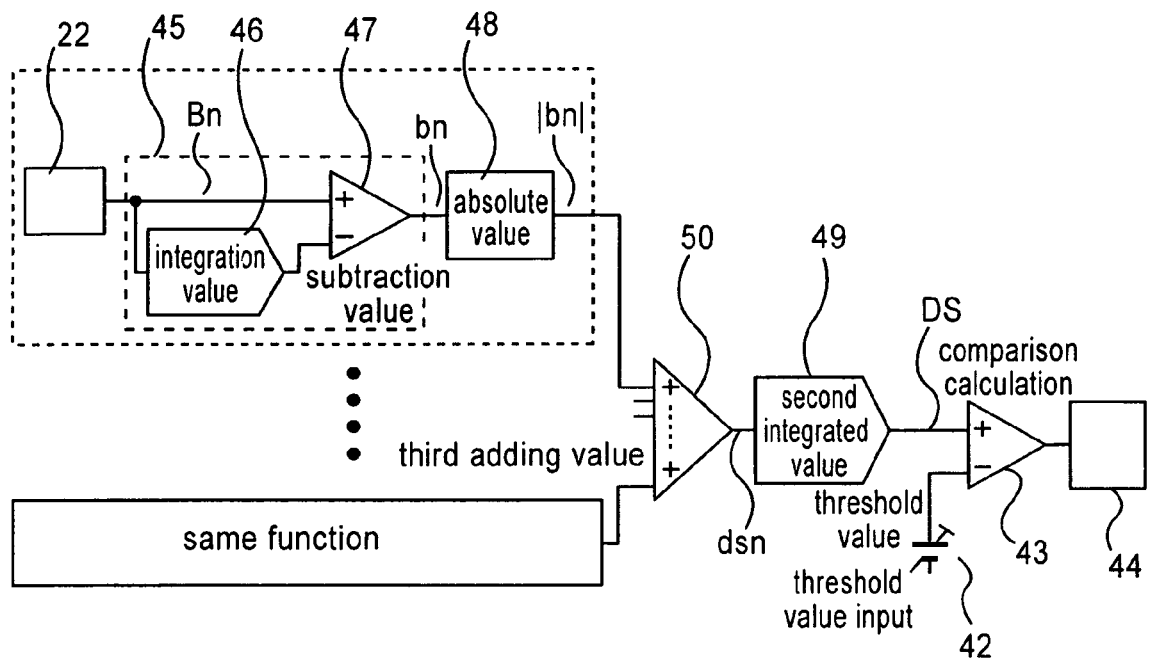
FIG. 28 is a schematic explanatory diagram showing a functional configuration example for notifying a magnetic body using a plurality of magnetic sensors.

FIG. 28 shows a configuration in the case of establishing a plurality of magnetic sensors. A plurality of functional blocks 45 for alternating-current calculating processing of each magnetic sensor and a plurality of absolute value calculation functions 48 are established; these output signals |bn| are added using an addition function 50; a delta-sigma value DS is obtained using an integration calculation function 49; and they are compared by the comparison function 43. Even if the order of the adding calculation and multiplying calculation is reversed, the same result is obtained. Herein, after the adding calculation, the multiplying calculation is performed. With this method, it becomes possible to detect a magnetic body by controlling the effects of the position where the passing magnetic body 30 passes through the gate 21, a traveling direction and movement rate.

Figure 29:
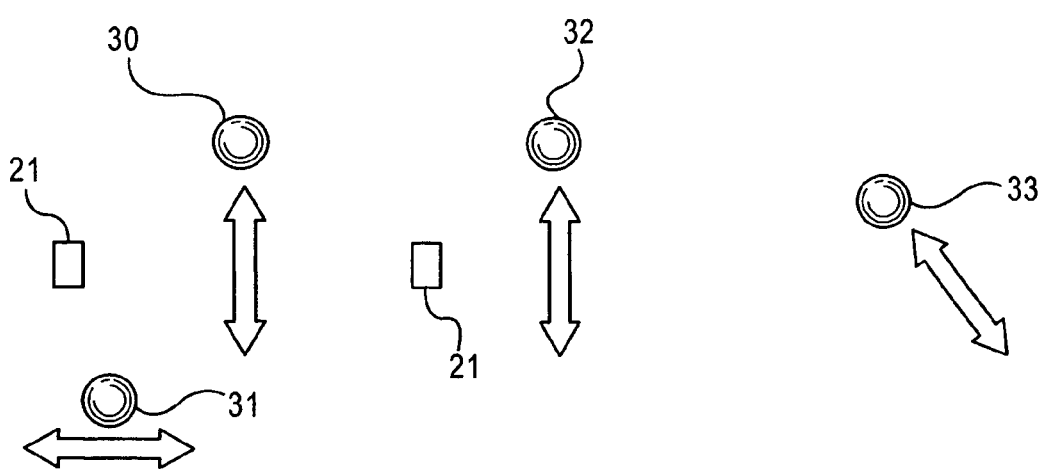
FIG. 29 is a schematic explanatory diagram showing a positional relationship among a gate, a passing magnetic body, a non-passing magnetic body, a magnetic body passing outside a gate and a far magnetic body.
Figure 3:
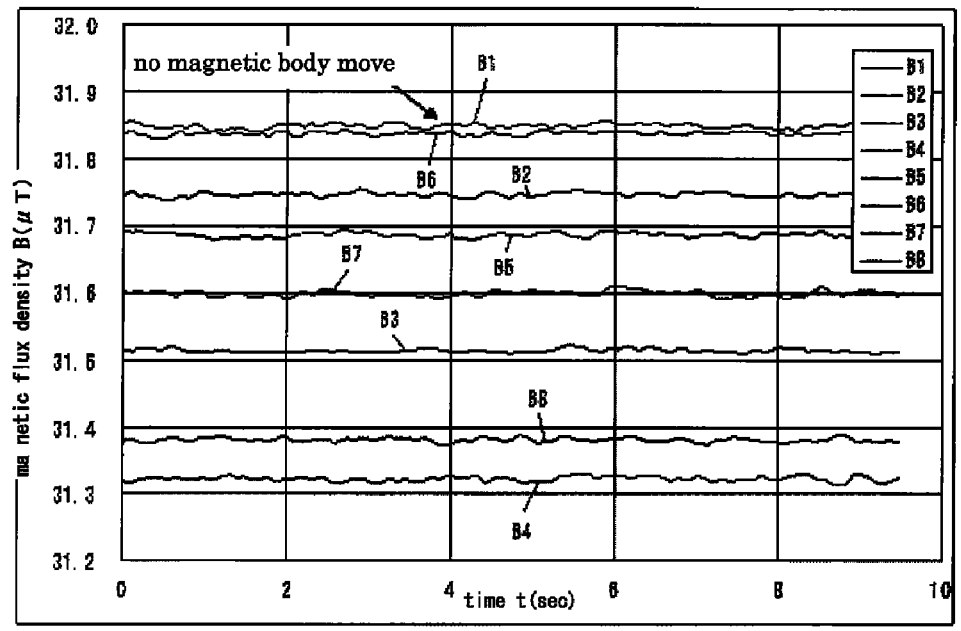
Figure 3:
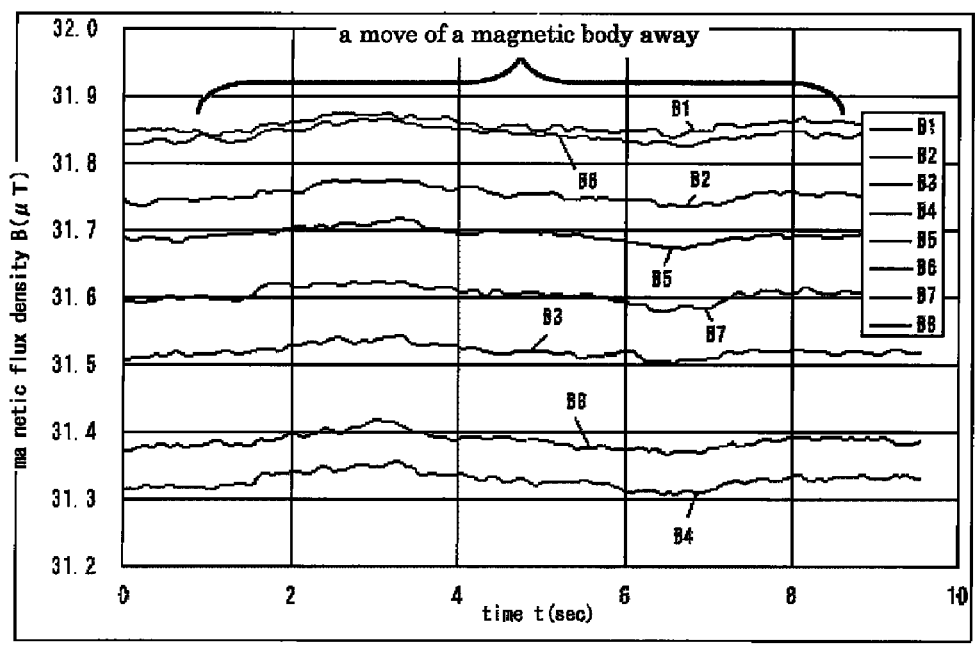
Figure 3:
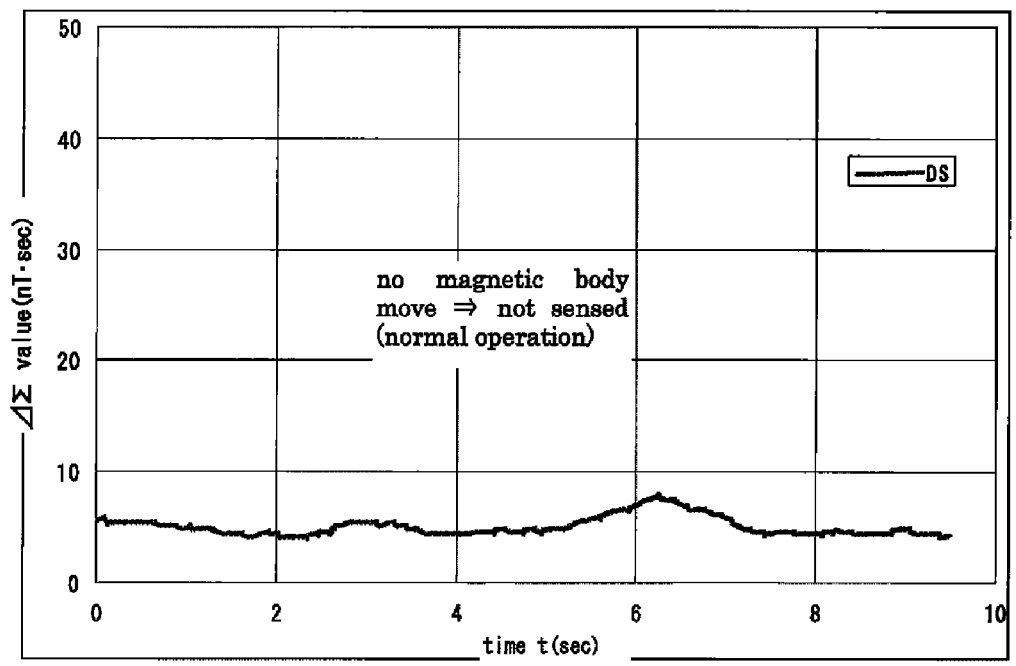
Figure 3:
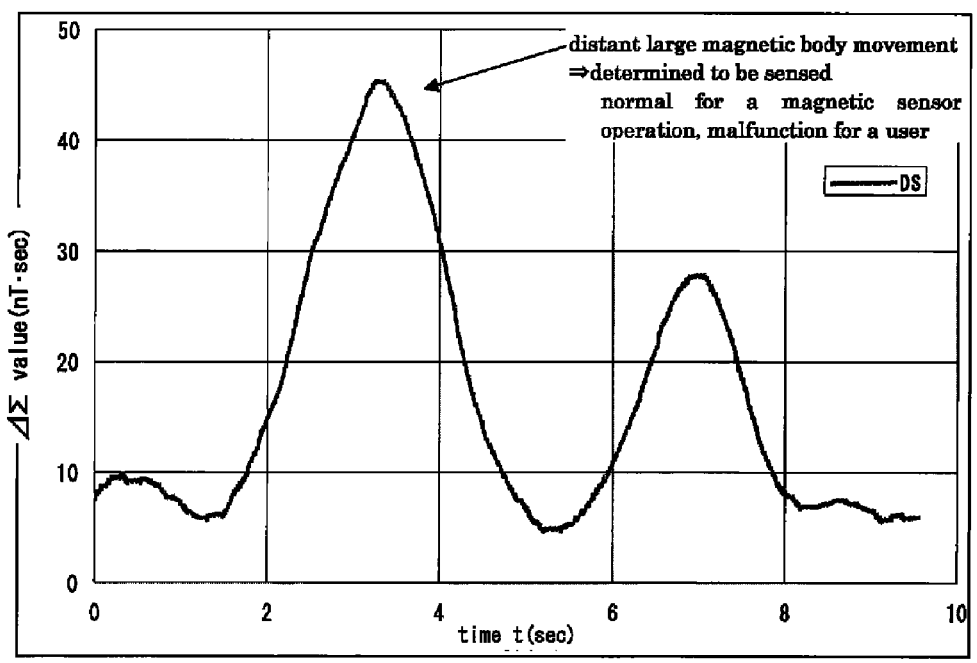

As described above, it is possible to detect a magnetic body by calculating a change in magnetic flux density at the location where the magnetic sensors are installed. However, a magnetic body that changes magnetic flux density does not always pass through the gate 21. FIG. 29 shows a planar positional relationship of the gate 21 and various magnetic bodies. As shown in FIG. 29, a magnetic body desired to be detected for a user is only the passing magnetic body 30 that passes through the gate.

At the same time when a user who does not have a magnetic body passes through the gate 21, in the case that another magnetic body moves, the magnetic sensor detects a change in magnetic flux density and notifies the detection. As a result, since the user does not have any magnetic body, he/she determines that the magnetic body detector has malfunctioned. If this situation is repeated many times, the reliability to the magnetic body detector will be lowered. In actuality, even if a user has a magnetic body and this is notified, the possibility where he/she brings in the magnetic body by ignoring the notification becomes higher. Therefore, it is desirable not to detect the non-passing magnetic body 31 that does not pass through the gate 21, the magnetic body passing outside a gate 32 that passes through outside the gate and the far magnetic body 33 from a distance.

For users, the passing magnetic body 30 is a useful signal S; however, the non-passing magnetic body 31, the magnetic body passing outside a gate 32 and the far magnetic body 33 are useless noises N. Therefore, it is desirable to detect only the passing magnetic body 30 that passes through the gate 21 and to ignore all other magnetic bodies. However, the magnetic sensor is not a device to be activated by understanding an intention of the users, and is a device to detect a change in magnetic flux density. Whether a user considers the magnetic body as the signal S or the noise N is utterly irrelevant, and if there is a change in magnetic flux density, this is detected.

The magnetic sensor itself has no function to determine which magnetic body has caused the change in magnetic flux density. Therefore, it is theoretically impossible to completely remove magnetic bodies, which are useless to the user, and the only way is to control them. The present invention provides a means to control other than the passing magnetic body 30 that passes through the gate 21 according to a position of the magnetic sensor and operation.

Next, the control of the effect of the far magnetic body 33 will be described.

FIG. 30 shows the signals Bn of eight magnetic sensors when a magnetic body hardly moves, and FIG. 31 shows a signal Bn of each magnetic sensor when the large far magnetic body 33 moves from a distance. Comparing between FIG. 30 and FIG. 31, it appears there is hardly a difference. However, the DS values, the calculation process shown in FIG. 28 is performed to these signals, are shown in FIG. 32 and FIG. 33. In FIG. 32 where the magnetic body hardly moves, the DS value is small; however, in FIG. 33 where the far magnetic body 33 moves, it is ascertained that the DS value is larger.

From the user's viewpoint, it is desirable to detect only the passing magnetic body 30 in the vicinity that passes through the gate 21 as the signal S, and not to detect the far magnetic body 33 far from the gate 21 as the noise N. However, viewing from a single unit of magnetic sensor, both are the same signal, and they cannot be distinguished with the operating processing in FIG. 28.

Figure 34:
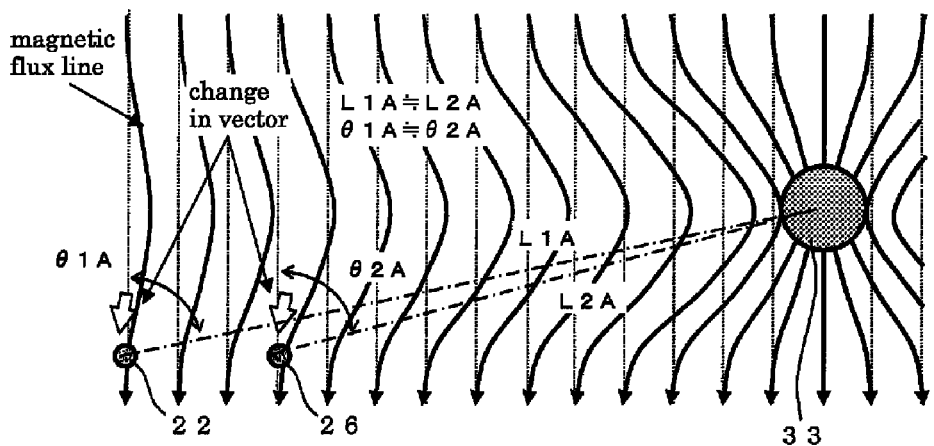
FIG. 34 is a schematic explanatory diagram showing a change of the magnetic flux density by a large magnetic body arranged away from two magnetic sensors.

Herein, FIG. 34 shows a pattern diagram of magnetic flux lines, which change according to the large far magnetic body 33 positioned far from the magnetic sensor 22 and the magnetic sensor 26. The magnetic flux lines greatly change in the vicinity of the large far magnetic body 33; however, vector changes B1A and B2A of the magnetic flux density at the positions of the magnetic sensor 22 and the magnetic sensor 26 are small. Further, the scalar amounts of the vector change B1A and B2A of the two magnetic flux lines are substantially the same.

Figure 35:
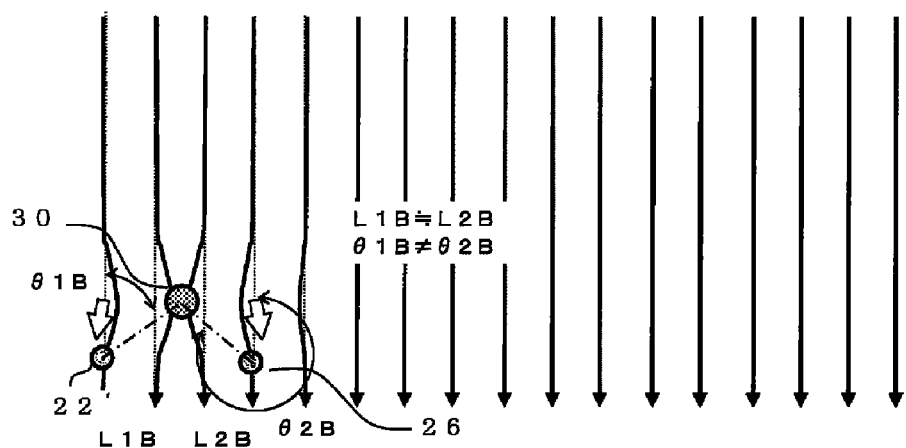
FIG. 35 is a schematic explanatory diagram showing a change of the magnetic flux density by a small magnetic body arranged in the vicinity in between two magnetic sensors.

Further, FIG. 35 shows a pattern diagram of the magnetic flux lines that are changed by a small passing magnetic body 30 positioned in the vicinity of and between the magnetic sensor 22 and the magnetic sensor 26. Since the passing magnetic body 30 is small, the vector changes B1B and B2B in the magnetic flux lines at the positions of the magnetic sensor 22 and the magnetic sensor 26. Further, the scalar amounts of the vector changes B1B and B2B of the two magnetic flux lines are substantially the same.

A change in the scalar amounts at the positions of the magnetic sensor 22 and the magnetic sensor 26 shown in FIG. 34 and FIG. 35 are substantially the same, and they cannot be distinguished. This is because the distances L1A and L2A to the magnetic bodies and L1B and L2B are substantially the same.

However, the vector change in the magnetic flux line of the magnetic sensor 22 and the vector change in the magnetic flux line at the position of the magnetic sensor 26 in FIG. 34 and FIG. 35 are opposite in direction. In other words, it is characterized such that the changes in vectors B1A and B2A to be generated by the far magnetic body 33 shown in FIG. 34 are in phase; however, the changes in vectors B1B and B2B to be generated by the passing magnetic body 30 in the vicinity shown in FIG. 35 are not in phase. This is because the angles θ1A and θ2A with the magnetic body are substantially the same; however, there are a great difference between θ1B and θ2B.

Figure 36:
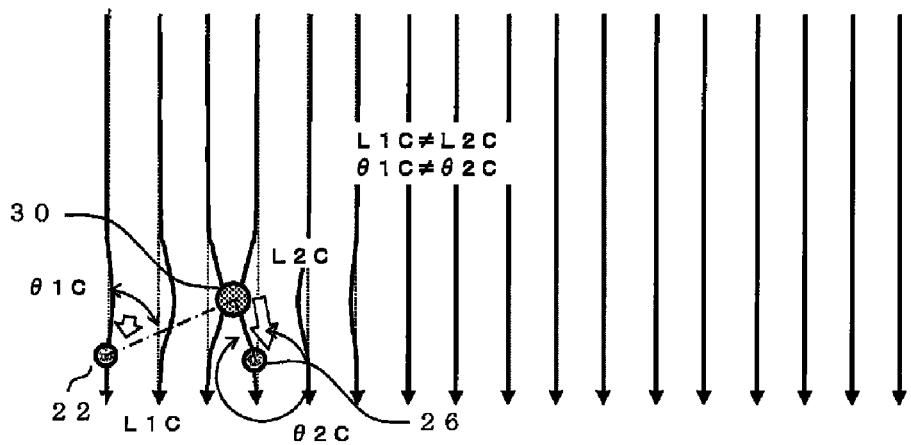
FIG. 36 is a schematic explanatory diagram showing a change of the magnetic flux density by a small magnetic body arranged in the vicinity of either of two magnetic sensors.

FIG. 36 shows a pattern diagram of the vectors of the magnetic flux lines to be changed by the small passing magnetic body 30 at the positions in the vicinity and one-sided of the magnetic sensor 22 and the magnetic sensor 26. The scalar amounts of the vector changes B1C and B2C of the two magnetic flux lines are not the same. In other words, it means that the magnitudes of the in-phase components are not the same.

According to the results shown in FIG. 34, FIG. 35 and FIG. 36, it is ascertained that the change in magnetic flux density B to be generated by the far magnetic body 33 is substantially in-phase and substantially the same magnitude. Therefore, subtracting the in-phase component from each magnetic sensor, it becomes possible to control the effect of the far magnetic body 33. In order to remove the in-phase signal, after the alternating-current component calculation as shown in FIG. 32, the signals are removed using the in-phase signal removal function 51. The in-phase signal removal function 51 is a function to subtract an averaged value bav, which is an in-phase component, from the alternating-current component bn of each magnetic sensor.

The in-phase signal removal function 51 is composed of the in-phase calculation functions 52 as many as the magnetic sensors, the addition calculation function 53 and the division calculation function 54. The in-phase calculation function 52 is composed of the subtraction calculation function 55. The alternating-current components bn of all of the magnetic sensors are added by the addition calculation function 53, and an average value bav, which is an in-phase component, is obtained by the division calculation function 54. If the average value bav is subtracted from the alternating-current component bn of each magnetic sensor using the subtraction calculation function 55, a signal bdn where the in-phase component is removed is obtained. As the configuration method of the in-phase signal removal function 51, a method of electrically forming with a subtraction circuit, an addition circuit and a resistance voltage divider is available in addition to a method of math operation.

Figure 38:
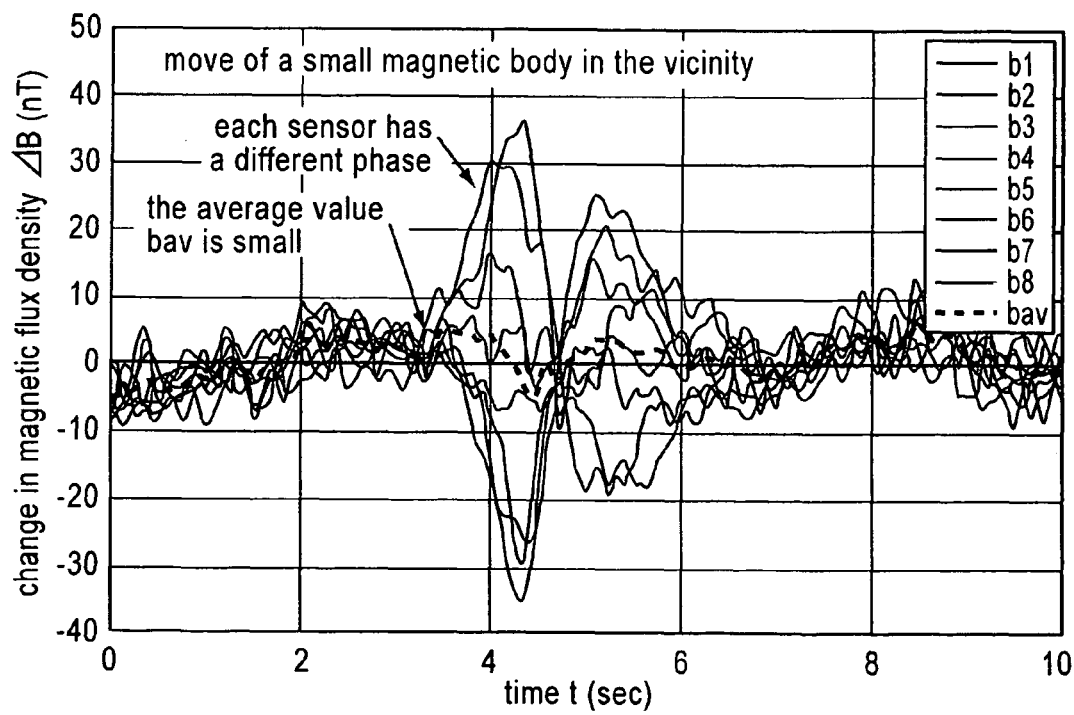
FIG. 38 is a schematic explanatory diagram showing an output result example of the alternating-current component calculation function when a small magnetic body in the vicinity using eight magnetic sensors is detected.
Figure 3:
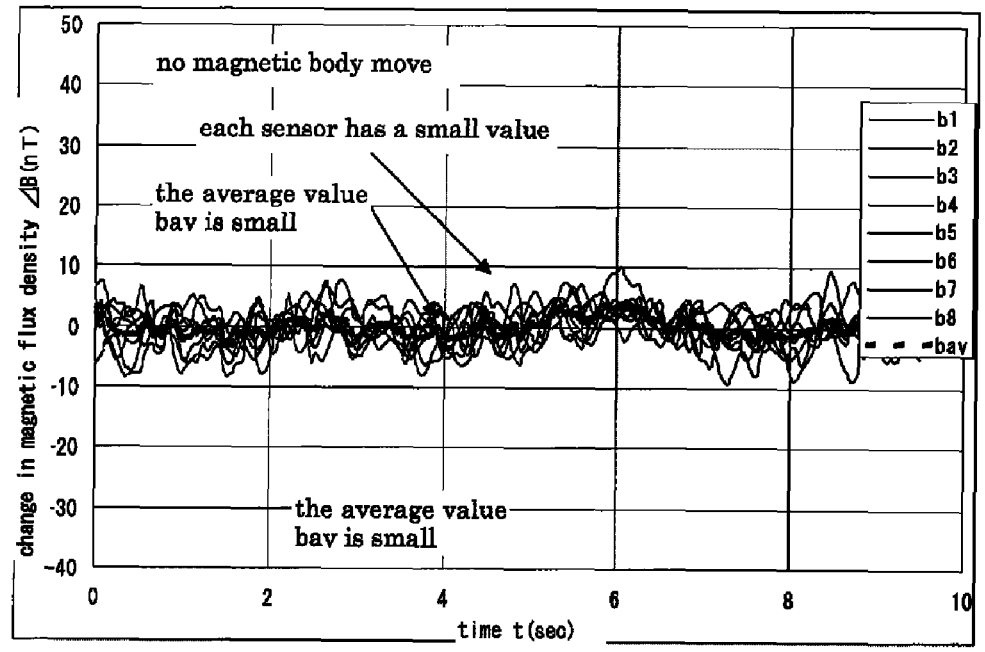
Figure 4:
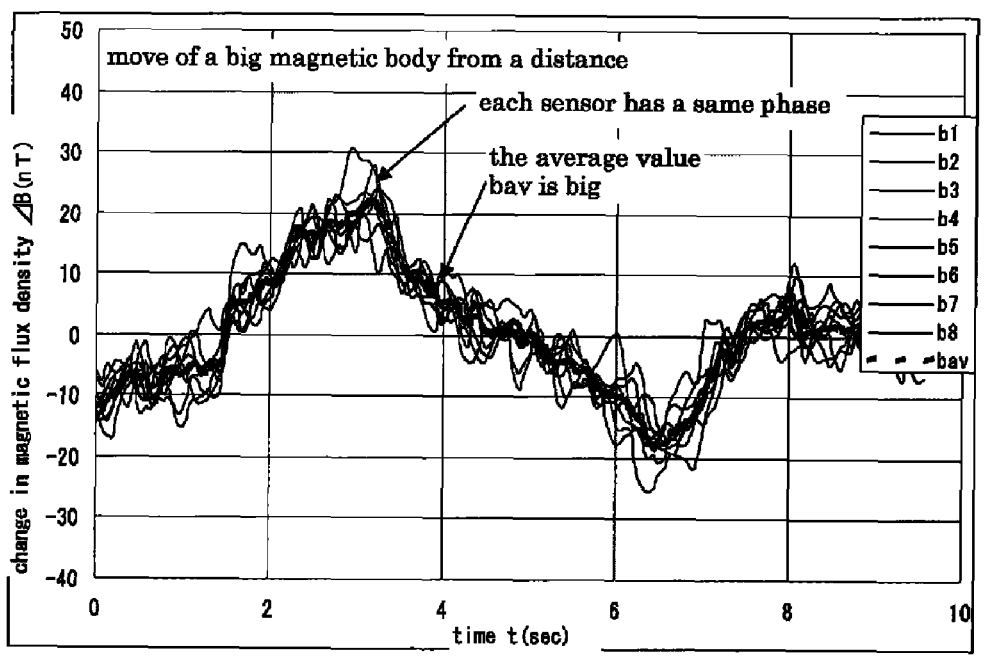

The alternating-current component signals bn of the eight magnetic sensors shown in FIG. 20, FIG. 30 and FIG. 31 and the average values bav, which are their in-phase components, are shown in FIG. 38, FIG. 39 and FIG. 40. In FIG. 38 in the case that the small passing magnetic body 30 in the vicinity is moved, the alternating-current component signals bn of sensor variously change, and the change in the average bav is small. In FIG. 39 in the case that the magnetic body hardly moves, the alternating-current component signal bn of each sensor variously changes and the change in the average bav is small. In FIG. 40 in the case that the large far magnetic body 33 in a distance is moved, it is ascertained that the alternating-current component signal bn of each magnetic sensor is substantially the same phase, and, it changes in the same magnitude, and the average value bav is similarly changed.

Figure 41:
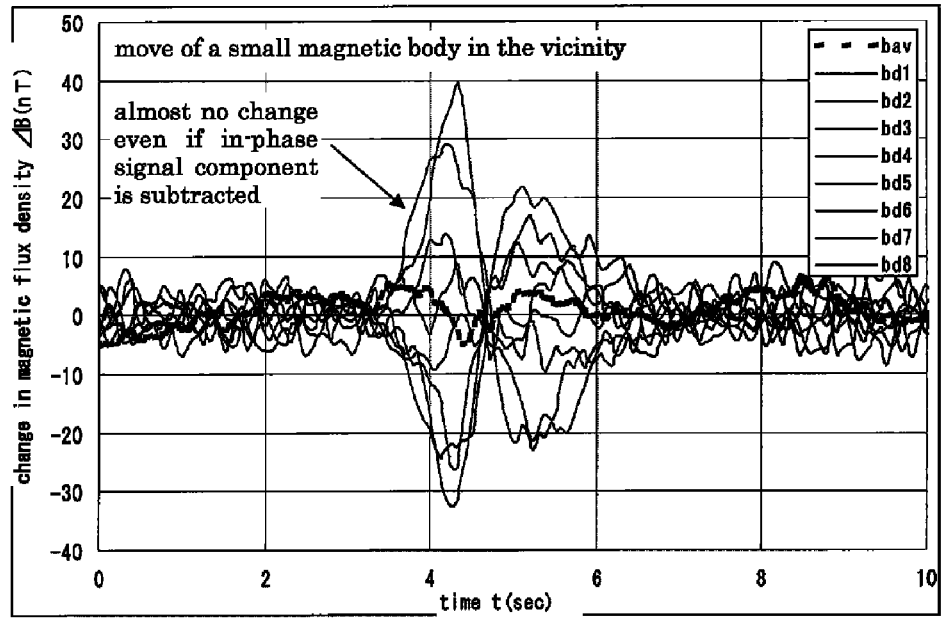
FIG. 41 is a schematic explanatory diagram showing an output result example of the in-phase signal removal calculation function when a small magnetic body in the vicinity is detected using eight magnetic sensors.
Figure 42:
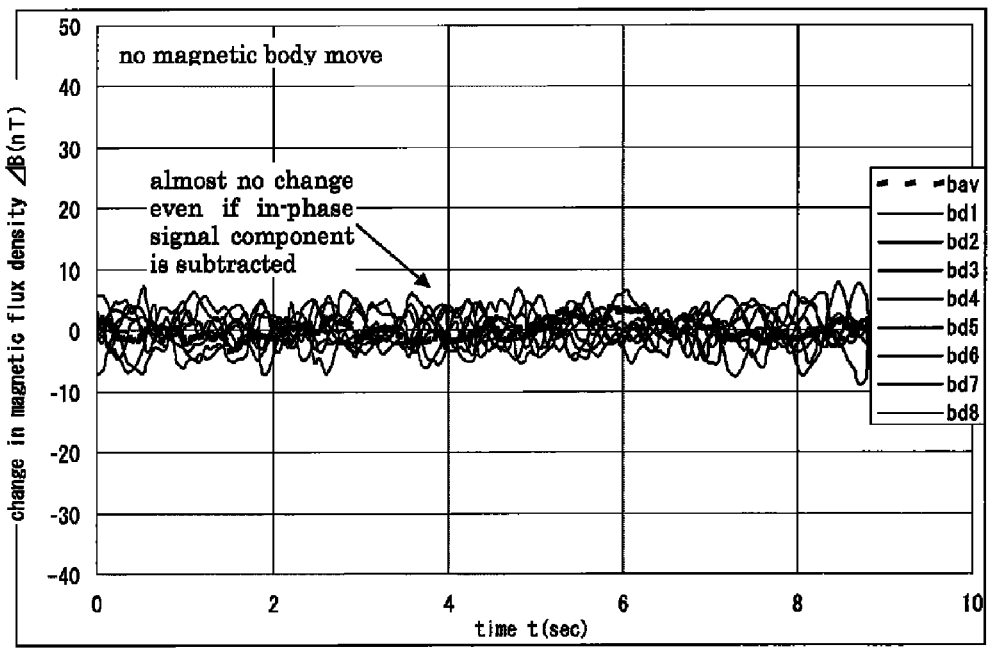
FIG. 42 is a schematic explanatory diagram showing an output result example of the in-phase signal removal calculation function when a magnetic body is detected using eight magnetic sensors.
Figure 4:
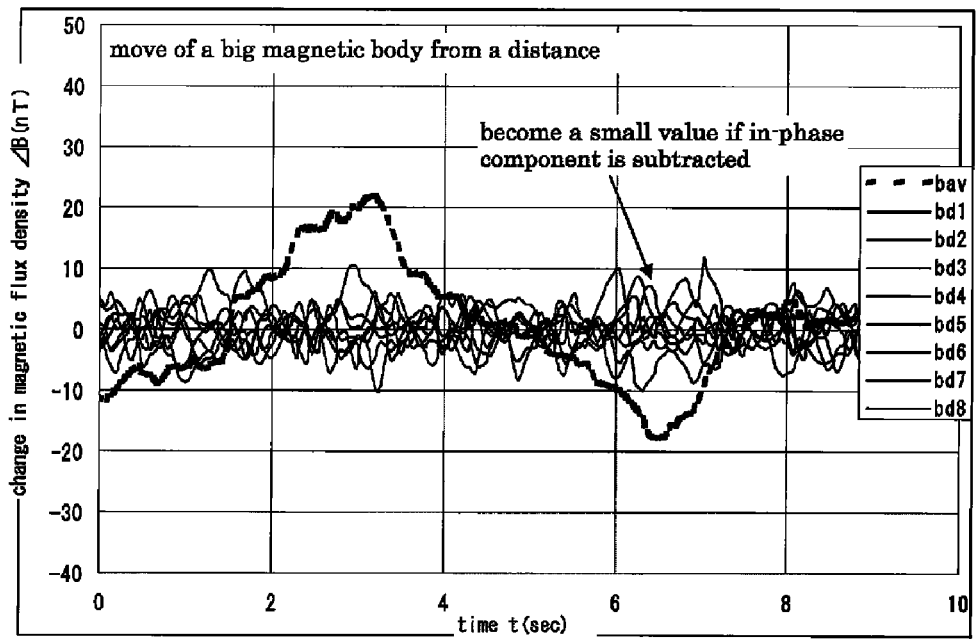
Figure 4:
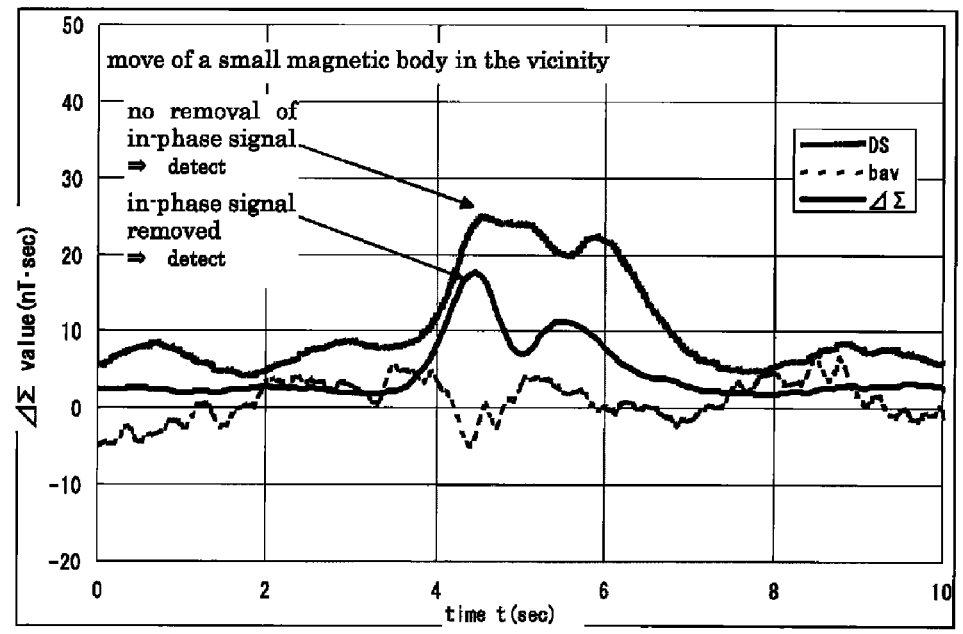
Figure 4:
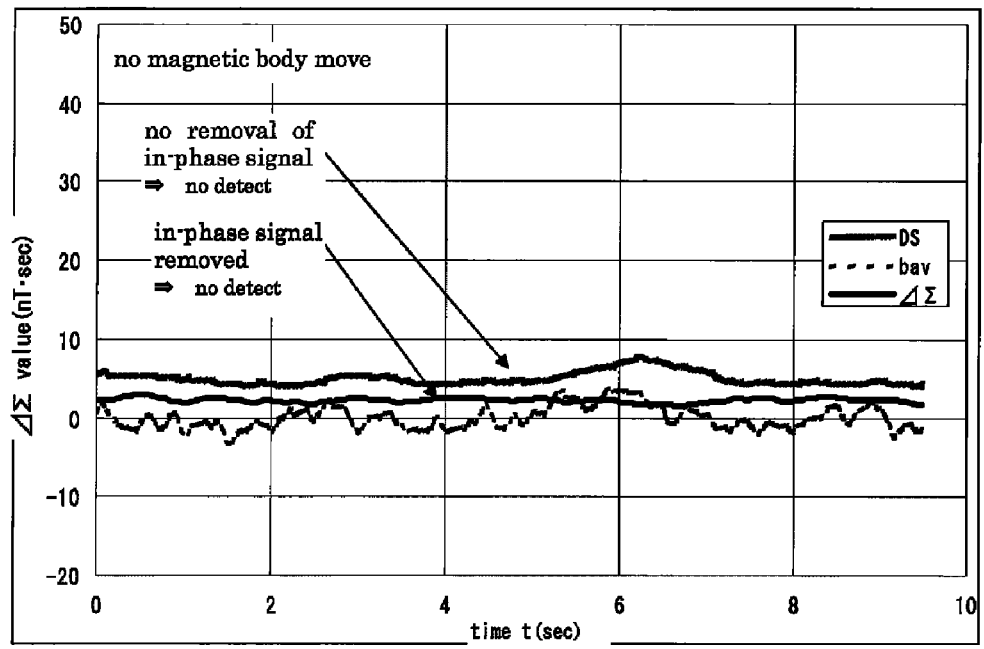
Figure 4:
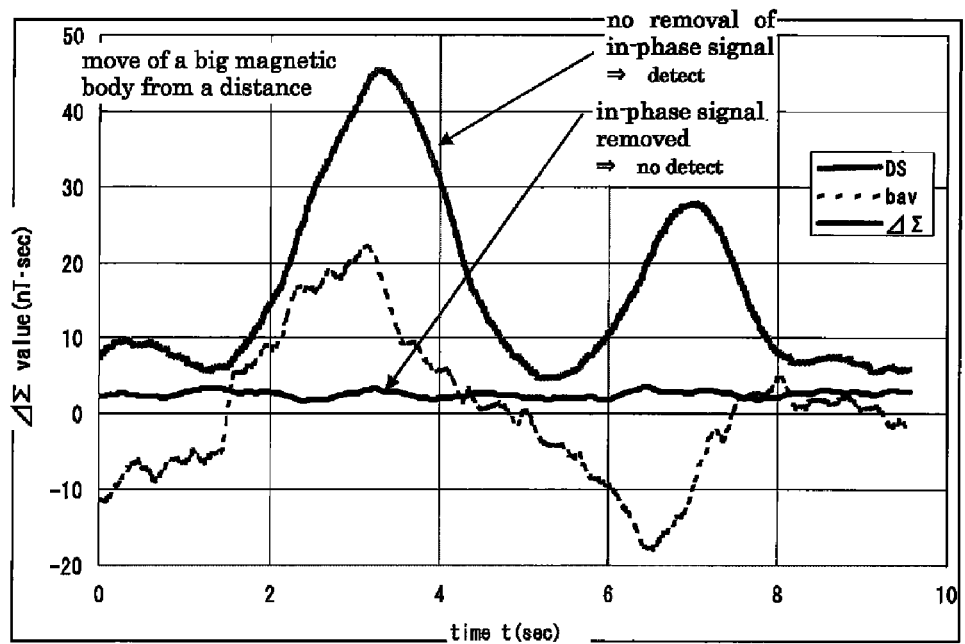

The in-phase signal removal calculated values bdn where the average value bav was subtracted from the alternating-current component signal bn of each magnetic sensor shown in FIG. 38, FIG. 39 and FIG. 40 are shown in FIG. 41, FIG. 42 and FIG. 43. It is ascertained that in FIG. 38 and FIG. 39 where the far magnetic body 33 does not move, waveforms of the alternating-current component signal bn and the in-phase signal removal calculated value bdn are hardly changed; however, in FIG. 43 where the far magnetic body 33 has moved, the in-phase signal removal calculated value bdn is drastically smaller.

Figure 37:
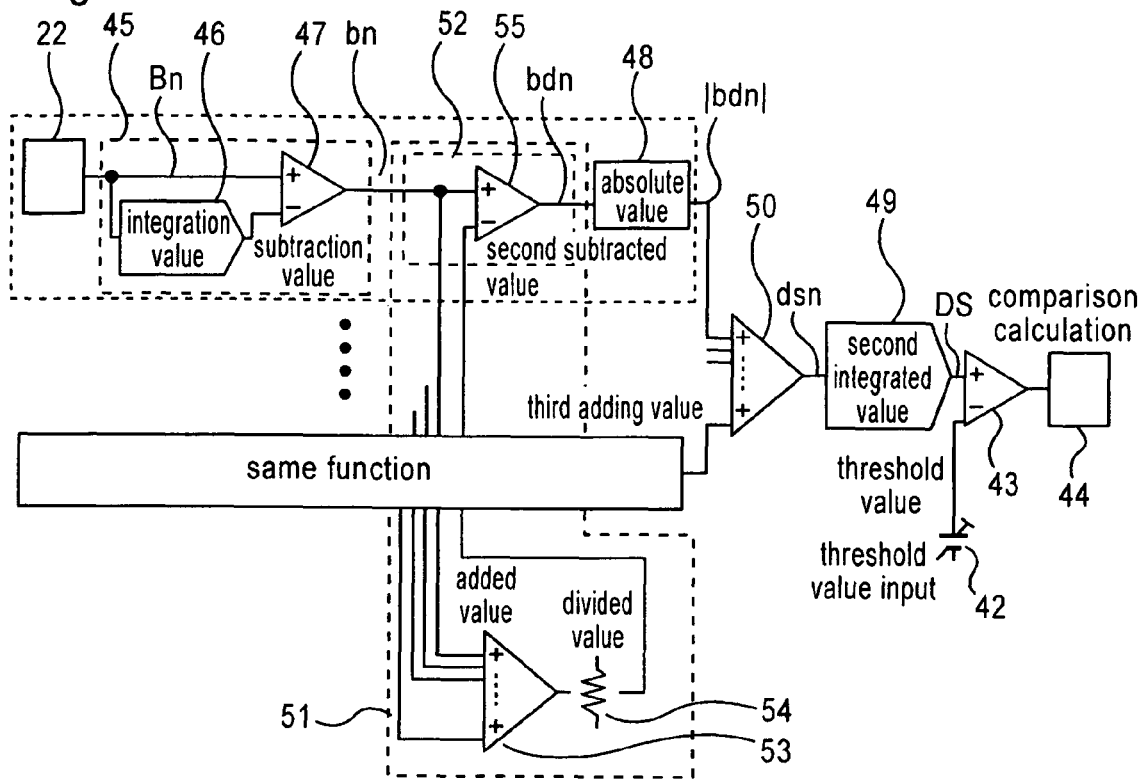
FIG. 37 is a schematic explanatory diagram showing a functional configuration example for notifying a magnetic body using an in-phase signal removal calculation function.

The DS value obtained by arithmetic processing, shown in FIG. 21, of the magnetic flux density Bn detected by the eight magnetic sensors shown in FIG. 20, FIG. 30 and FIG. 31 and the integrated value obtained by arithmetic processing shown in FIG. 37 are shown in FIG. 44, FIG. 45 and FIG. 46. According to FIG. 44, it is ascertained that in the case that the small passing magnetic body 30 in the vicinity is moved, it is possible to detect this by either arithmetic processing. According to FIG. 45, it is ascertained that in the case that the magnetic body is hardly moved, the magnetic body is not detected by neither of the arithmetic processing. According to FIG. 46, it is ascertained such that when the large far magnetic body 33 from a distance is moved, this is detected by the arithmetic processing shown in FIG. 28; however, this is not detected by the arithmetic processing shown in FIG. 37. It becomes possible to detect the passing magnetic body 30 in the vicinity, which is a signal S in the case of viewing from a user, by the arithmetic processing shown in FIG. 37, and to control the far magnetic body 33, which is a noise N.

Next, the front-to-rear ratio arithmetic algorithm for removing the non-passing magnetic body 31 that does not pass through the gate 21 among the control of the effect of the magnetic body in the vicinity relating to the present invention will be described.

Figure 47:
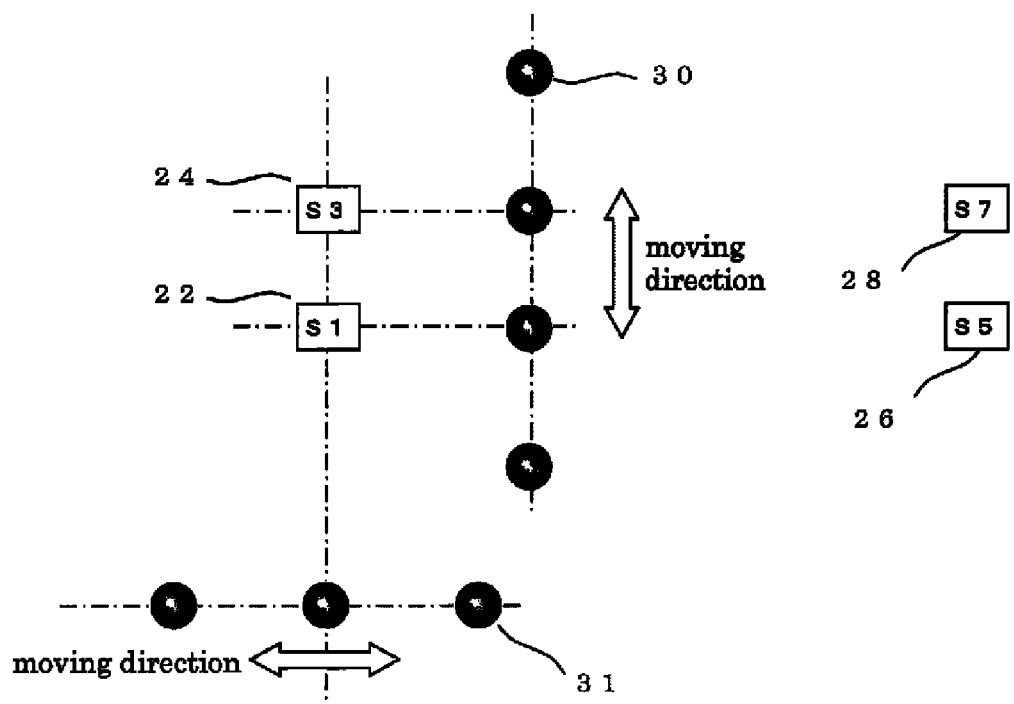
FIG. 47 is a schematic explanatory diagram showing a positional relationship among a gate, a passing magnetic body and a non-passing magnetic body.
Figure 4:
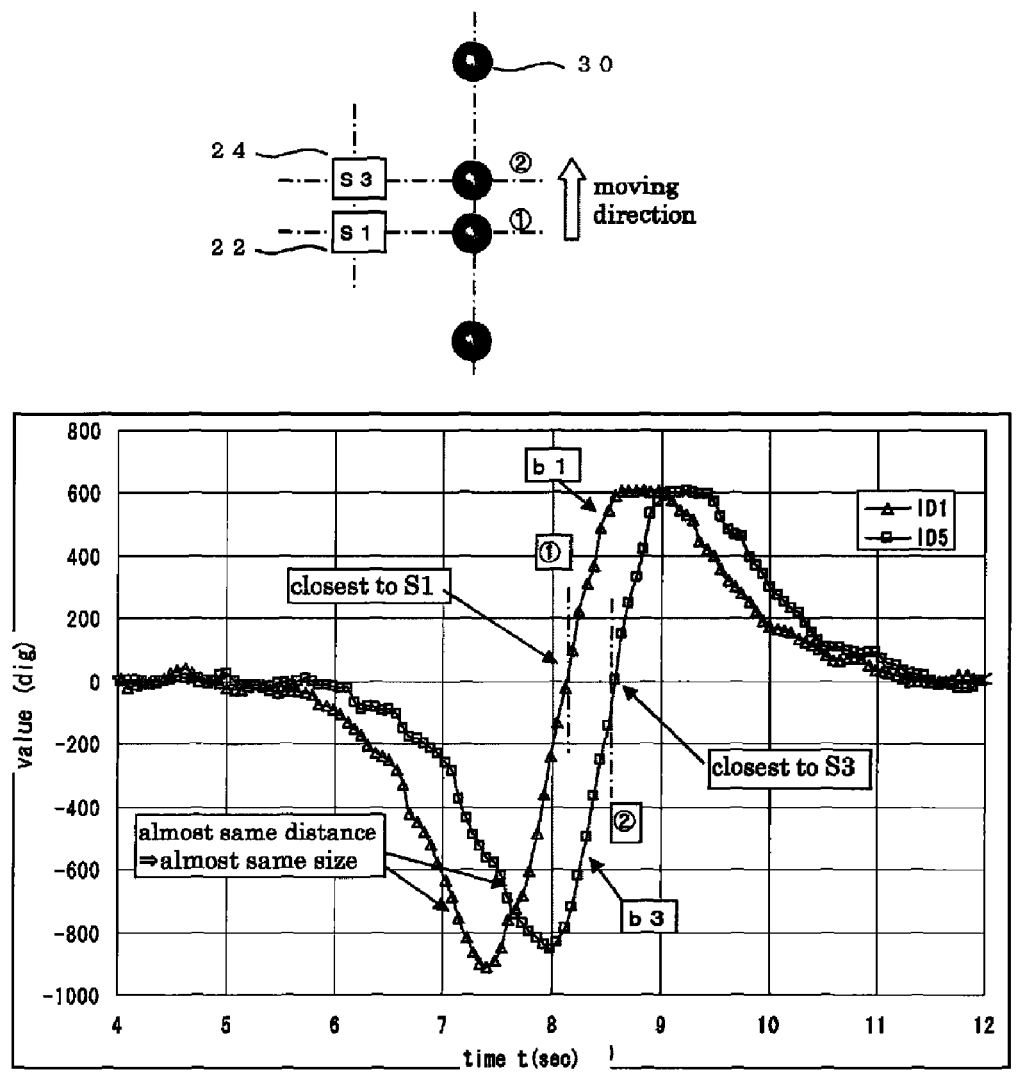
Figure 5:
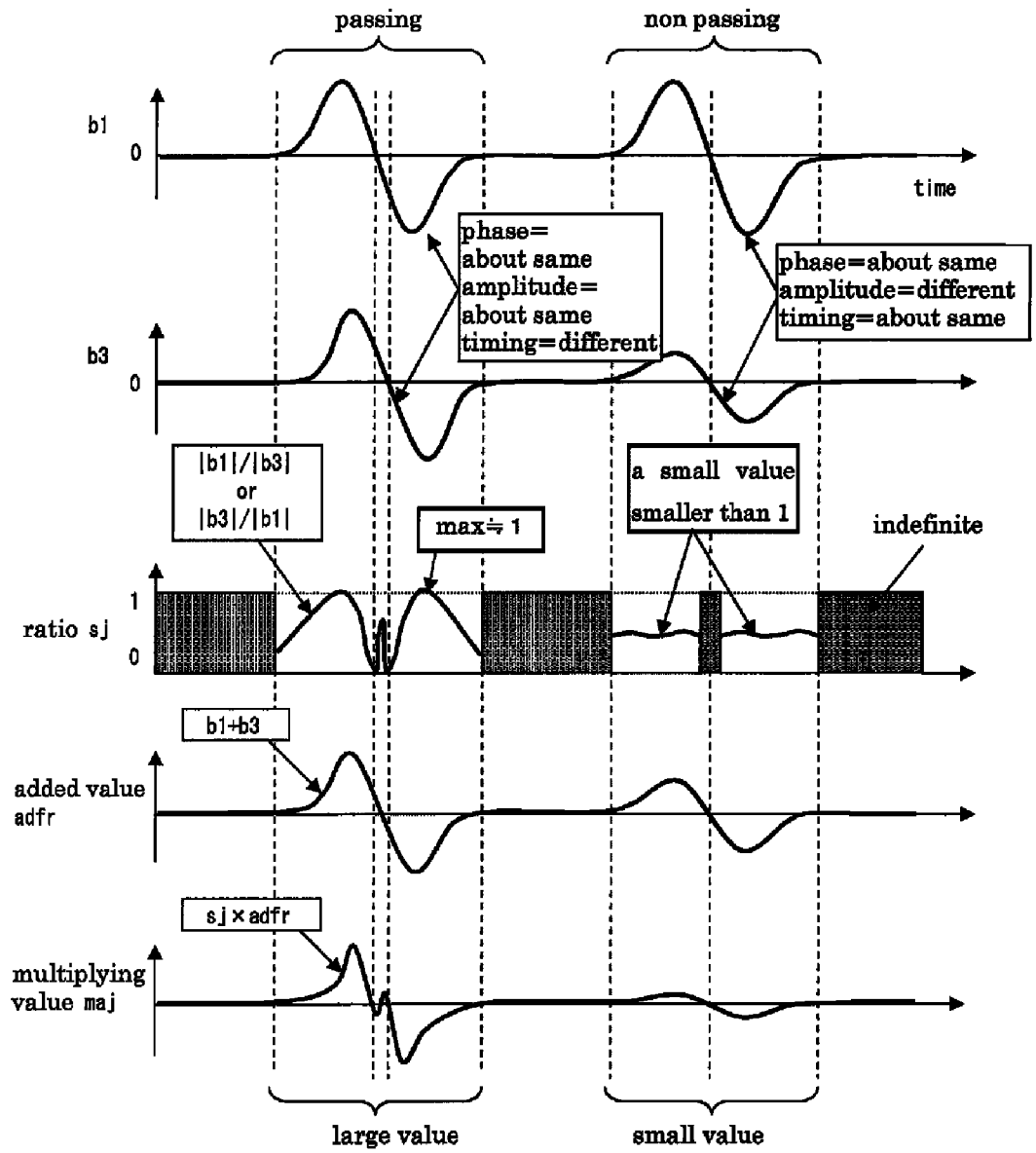

In the adjacent magnetic bodies, there are three types, the passing magnetic body 30 that passes through the gate 21, the non-passing magnetic body 31 that does not pass through the gate 21 and the magnetic body passing outside a gate 32 that passes through the outside of the gate 21. In the arithmetic algorithm shown in FIG. 37, it is impossible to distinguish these three types of the magnetic bodies. Between the passing magnetic body 30 that passes through the gate 21 and the non-passing magnetic body 31 that does not pass through the gate 21, the direction where a magnetic body moves is different. Therefore, a means to determine this direction should be established. Then, two magnetic sensor units are established in the front and rear of the gate 21. A planar pattern diagram for describing the action is shown in FIG. 47, and this will be described with reference to the magnetic sensors 22 and 24 in the upper left side. The passing magnetic body 30 and the non-passing magnetic body 31 move with regard to this magnetic sensor 22 and 24.

The alternating-current components b1 and b3 of the outputs of the magnetic sensors 22 and 24 when the passing magnetic body 30 is moved is shown in FIG. 48. According to FIG. 48, when the passing magnetic body 30 is moved, the waveforms of b1 and b3, which are substantially the same amplitude, the phase but with different timing, are outputted. This is because the direction and distance when the passing magnetic body 30 is situated the closest to the two magnetic sensors 22 and 24 are substantially the same, but the time period for the passing magnetic body 30 to be situated the closest to the two magnetic sensors 22 and 24 is different.

Next, the alternating-current components b1 and b3 of the outputs of the magnetic sensors 22 and 24 when the non-passing magnetic body 31 is moved are shown in FIG. 49. According to FIG. 49, in the case that the non-passing magnetic body 31 is moved, the waveforms b1 and b3, which are substantially the same phase, different amplitude, and substantially the same timing, are outputted. This is because the distance when the non-passing magnetic body 31 is situated the closest to the two magnetic sensors 22 and 24 is different, and the time period for the non-passing magnetic body 31 to be situated the closest to the magnetic sensors 22 and 24 is substantially the same.

In the passing magnetic body 30 and the non-magnetic body 31, as shown in FIG. 48 and FIG. 49, there is a difference between the alternating-current components b1 and b3 of the outputs of the magnetic sensors 22 and 24. Therefore, if this difference is extracted and a detection value according to the non-passing magnetic body 31 is controlled, the realization is possible.

A pattern diagram of the alternating-current components b1 and b3 in the output of the two magnetic sensors 22 and 24 at the time when the passing magnetic body 30 is moved and when the non-passing magnetic body 31 is moved is shown in FIG. 50. According to FIG. 50, when the passing magnetic body 30 is moved, a ratio sj of the amplitudes of b1 and b3 at the same time is close to 1. In the meantime, when the non-passing magnetic body 31 is moved, a ratio sj of the amplitudes of b1 and b3 at the same time becomes smaller than 1. Therefore, if the ratio of the amplitude of two signals is obtained, it is possible to determine whether the magnetic body is the passing magnetic body 30 or the non-passing magnetic body 31.

However, only with the ratio sj, the magnitude of change of b1 and b3 cannot be determined. Then, calculation using the ratio sj as a parameter is conducted.

As a calculating method, various methods can be assumed. Herein, a multiplied value maj where an added value adfr of b1 and b2 is multiplied by the ratio sj is used.

This calculating method is one example of the present invention, and there is no problem when another calculating method is used.

There are various methods for a method of obtaining the ratio sj, and as the simplest method, a method where a small value is divided by a large value, and an absolute value is obtained is available. In FIG. 50, b1 is a larger signal than b3; however, when the magnetic body does not pass through at the opposite position, b3 becomes greater than b1. Therefore, comparing the absolute values of b1 and b3, and it is necessary to divide a smaller value by a larger value. Further, there is a case that b1 and b3 becomes zero at the same time. Since it is impossible that a value is divided by zero, a special case where sj is forcibly adjusted to a value is required, as well. If an added value adfr of two signals is obtained and the added value is multiplied by the ratio sj, the multiplied value maj can be obtained.

Figure 51:
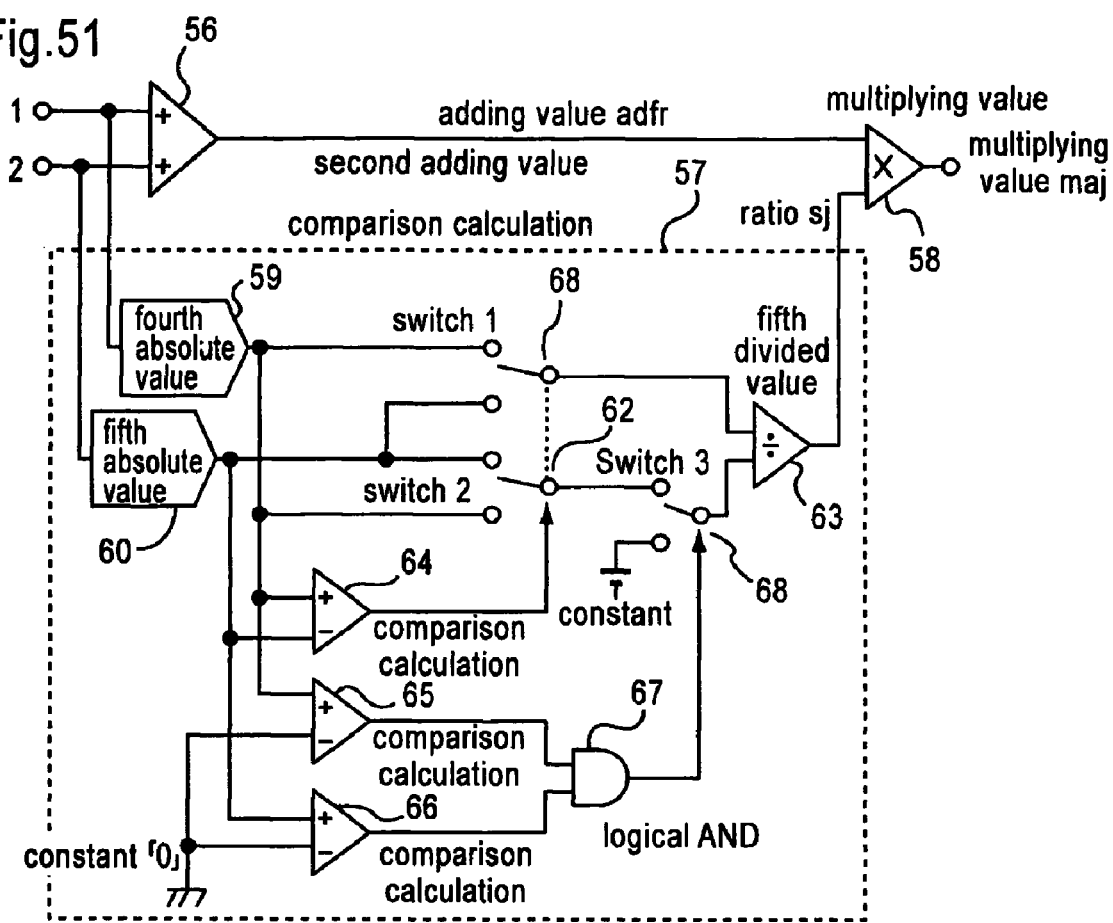
FIG. 51 is a schematic explanatory diagram showing a front-to-rear ratio calculation functional part of the functional configuration example for notifying about a magnetic body using the front-to-rear ratio calculation function.
Figure 52:
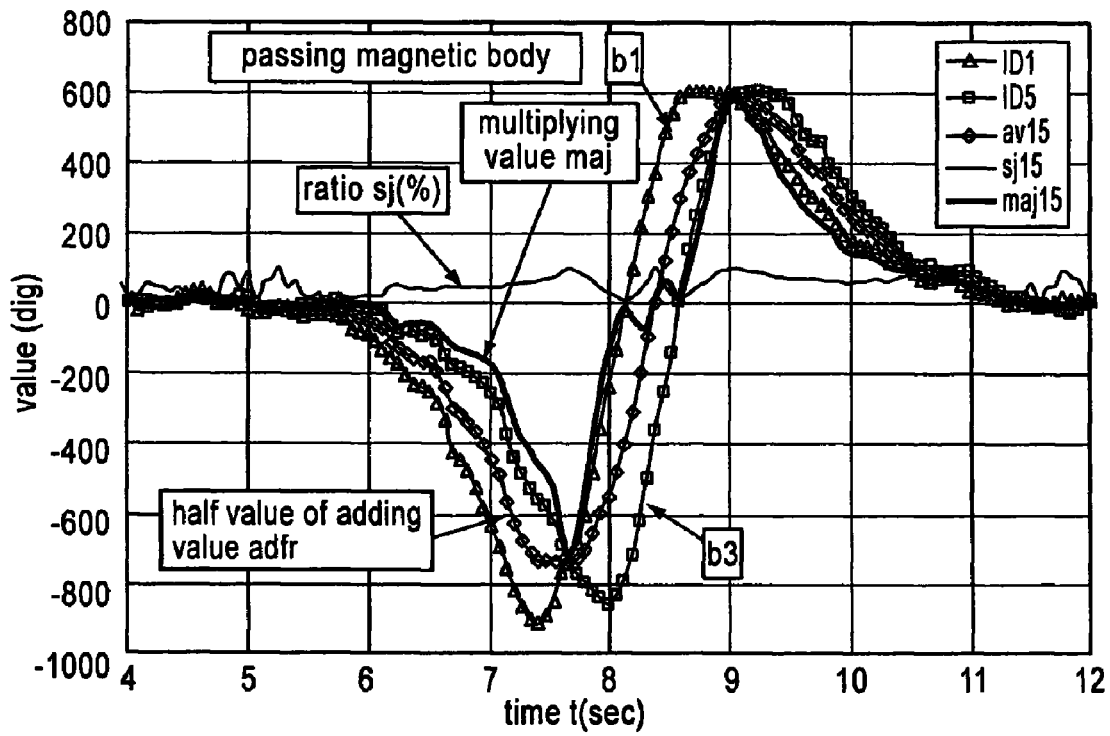
FIG. 52 is a schematic explanatory diagram showing a front-to-rear ratio calculating output result example when the passing magnetic body is detected using two magnetic sensors.
Figure 5:
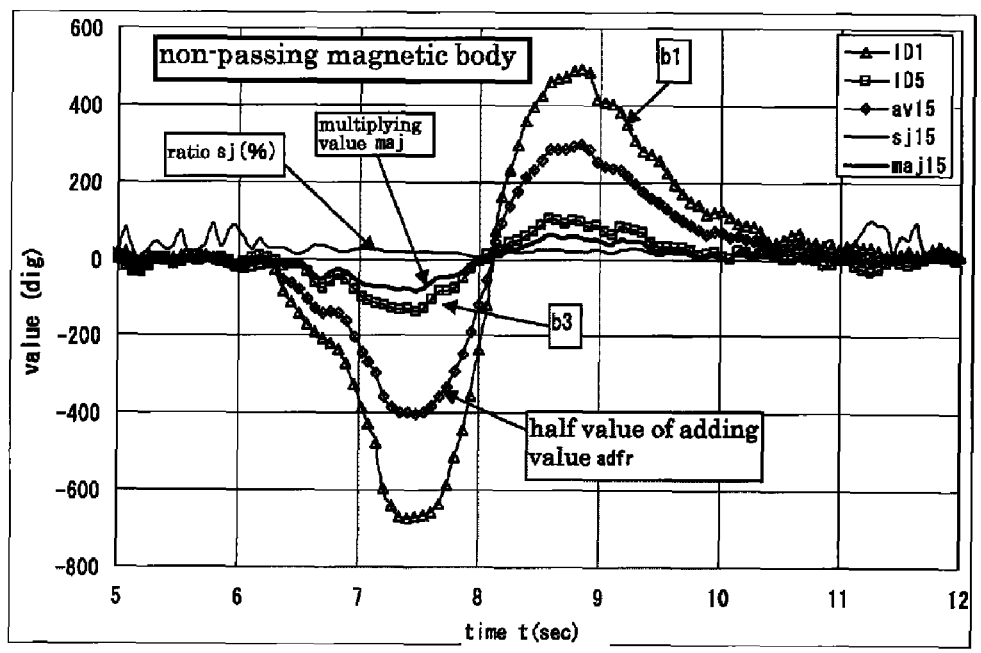
Figure 5:
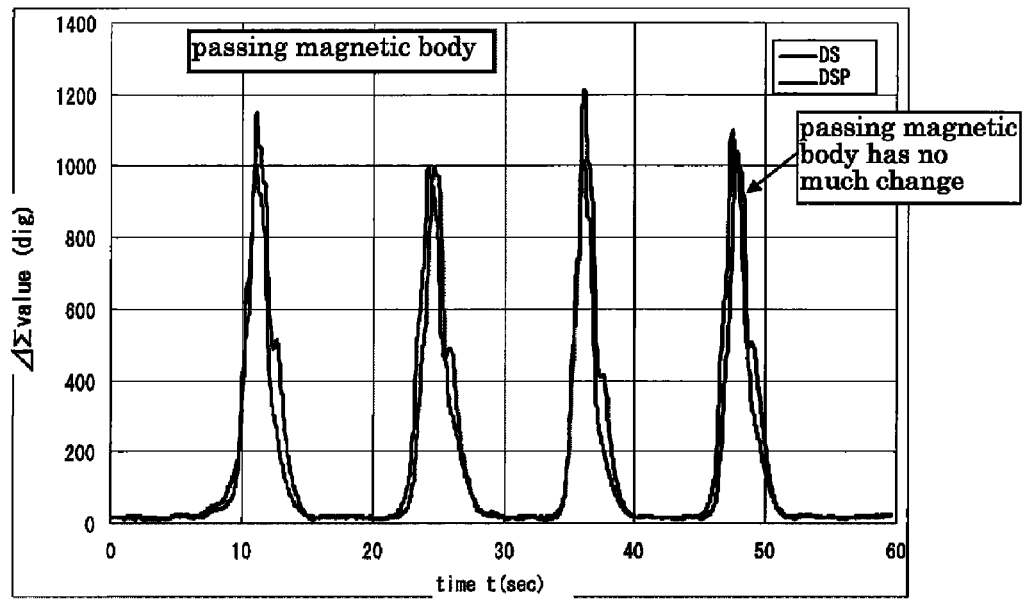
Figure 5:
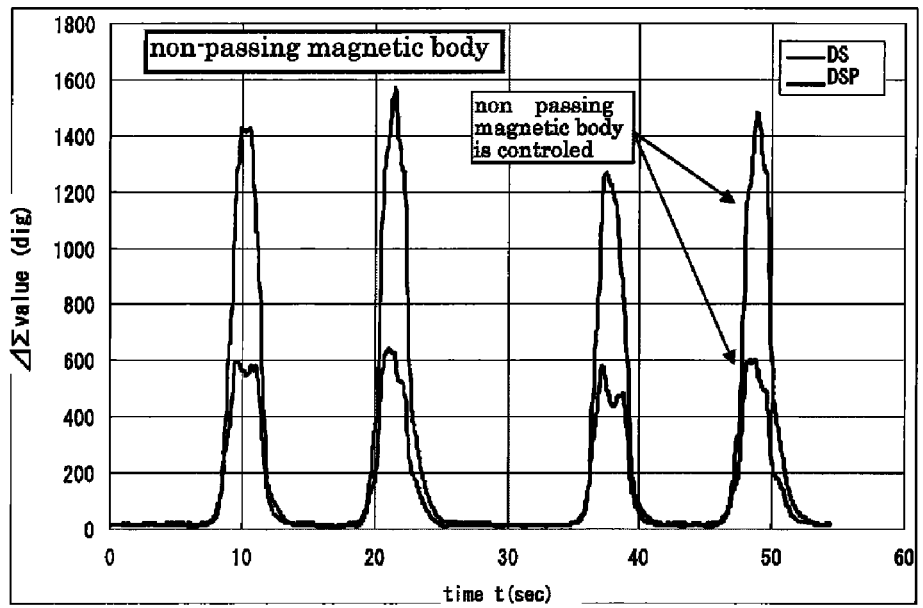
Figure 5:
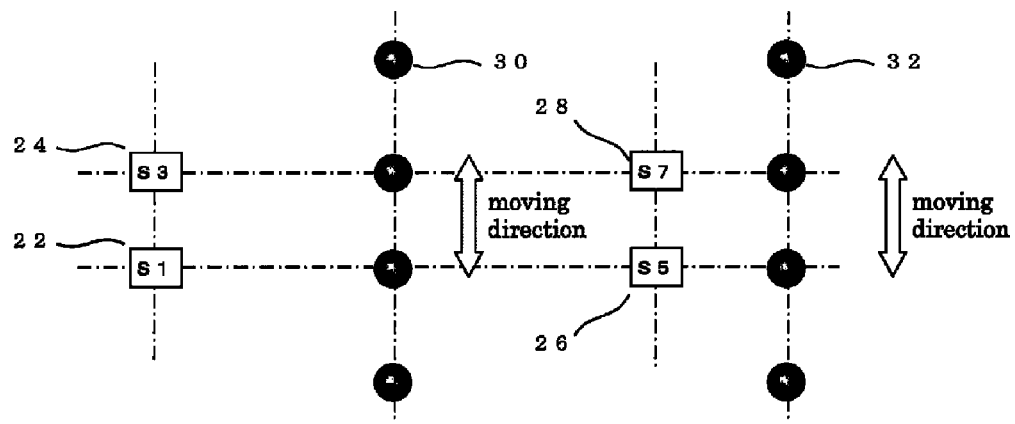
Figure 5:
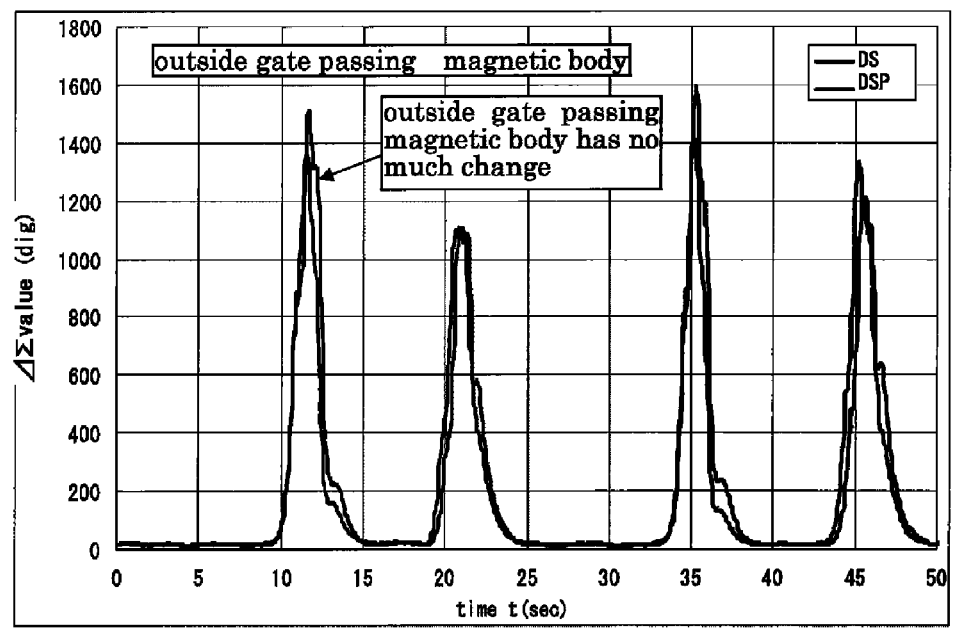

The alternating-current components b1 and b3 in the outputs of the magnetic sensors 22 and 24 become output signals, close to zero, in the case that no magnetic body is detected. Even if they are close to zero, because of a white noise component, the correlation between the values of b1 and b3 no longer exists. Therefore, the ratio sj becomes indefinite. Although the ratio sj is indefinite, since two added values adfr become close to zero, the multiplied value maj will become close to zero. Therefore, even if the ratio sj is indefinite, it will never control the arithmetic processing. As a method of obtaining the multiplied value maj, as shown in FIG. 51, the method can be composed of an addition calculation function 56, a ratio calculation function 57 and a multiplication calculation function 58. The ratio calculation function 57 can be conducted with an absolute value calculation function 59, an absolute value calculation function 60, a switch function 61, a switch function 62, a division function 63, a comparison function 44, a comparison function 65, a comparison function 66, a logical multiplication calculation function 67 and a switch function 68. Absolute values of two input signals are obtained by the absolute value calculation functions 59 and 60, and which one is greater is compared by the comparison calculation function 64. In accordance with the result, by using the switch functions 61 and 62, a smaller value of the compared absolute values is used for a numerator of the division function 63 and a larger value is used for a denominator. The ratio sj can be obtained by dividing the numerator by the denominator using the division calculation function 63. As a special case, two input signals are compared with zero using the comparison calculation functions 65 and 66, and the case where they simultaneously become zero is determined using the logical multiplication calculation function 67. In the case that it is determined to be simultaneously zero, a constant other than zero is used for the denominator using the switch function 68, and this prevents the division by zero. For these calculations, a method formed with an electric calculating circuit by a multiplication circuit or a division circuit is available in addition to a numerical calculation method.

For the waveforms of the passing magnetic body 30 and the non-passing magnetic body 31 shown in FIG. 48 and FIG. 49, the result of obtaining the multiplied value maj using the arithmetic algorithm shown in FIG. 51 is shown in FIG. 54 and FIG. 55. According to FIG. 54, when the passing magnetic body 30 is moved, it is ascertained that the multiplied value maj is a slightly smaller value than the original signals b1 and b3. In the meantime, according to FIG. 55, when the non-passing magnetic body 31 is moved, the multiplied value maj is a considerably smaller value than the original signals b1 and b3. Therefore, it is possible to control the non-passing magnetic body 31 by using the arithmetic algorithm shown in FIG. 51.

Calculation is conducted to all of the magnetic sensors 22 to 29 arranged in front and rear of the gate 21 by using the arithmetic algorithm shown in FIG. 51, and delta-sigma calculated value using the added value dsp is regarded as DSP.

A calculated value DS in the case that the passing magnetic body 30 is moved and the delta-sigma calculated value DSP using sixteen magnetic sensors are shown in FIG. 54, and another calculated value DS in the case that the non-passing magnetic body 31 is moved and the delta-sigma calculated value DSP are shown in FIG. 55. When the passing magnetic body 30 is moved according to FIG. 54, there is no significant difference between DS and DSP values. However, when the non-passing magnetic body 31 is moved according to FIG. 55, the DSP value is controlled compared to DS and becomes smaller. Therefore, the passing magnetic body 30 and the non-passing magnetic body 31 can be distinguished by the front-to-rear ratio arithmetic algorithm shown in FIG. 51. The non-passing magnetic body 31, which is unnecessary for a user, is controlled, and it is effective.

Next, among the control of the effect of the magnetic body in the vicinity relating to the present invention, the right and left in-phase removal arithmetic algorithm for removing the magnetic body passing outside a gate 32 will be described hereafter.

For magnetic bodies in the vicinity of the gate 21, which are unnecessary for a user, the magnetic body passing outside a gate 32 that passes through the outside of the gate can also be mentioned in addition to the non-passing magnetic body 30. FIG. 56 shows planar movements of the passing magnetic body 30 and the magnetic body passing outside a gate 32. The magnetic sensor shows only upper side as a pattern.

FIG. 57 shows the calculated value DS according to the arithmetic algorithm shown in FIG. 37 and the calculated value DSP according to the front-to-rear ratio arithmetic algorithm shown in FIG. 51 when the magnetic body passing outside a gate 32 is moved. According to FIG. 57, there is no significant difference between the DS and DSP values. Therefore, the front-to-rear ratio arithmetic algorithm shown in FIG. 51 is not effective for the magnetic body passing outside a gate 32. As shown in FIG. 56, the passing magnetic body 30 that passes through the gate 21 and the magnetic body passing outside a gate 32 move toward the same direction. Therefore, because there is no difference between both using the front-to-rear ratio arithmetic algorithm, it is impossible to distinguish this in principle.

Figure 58:
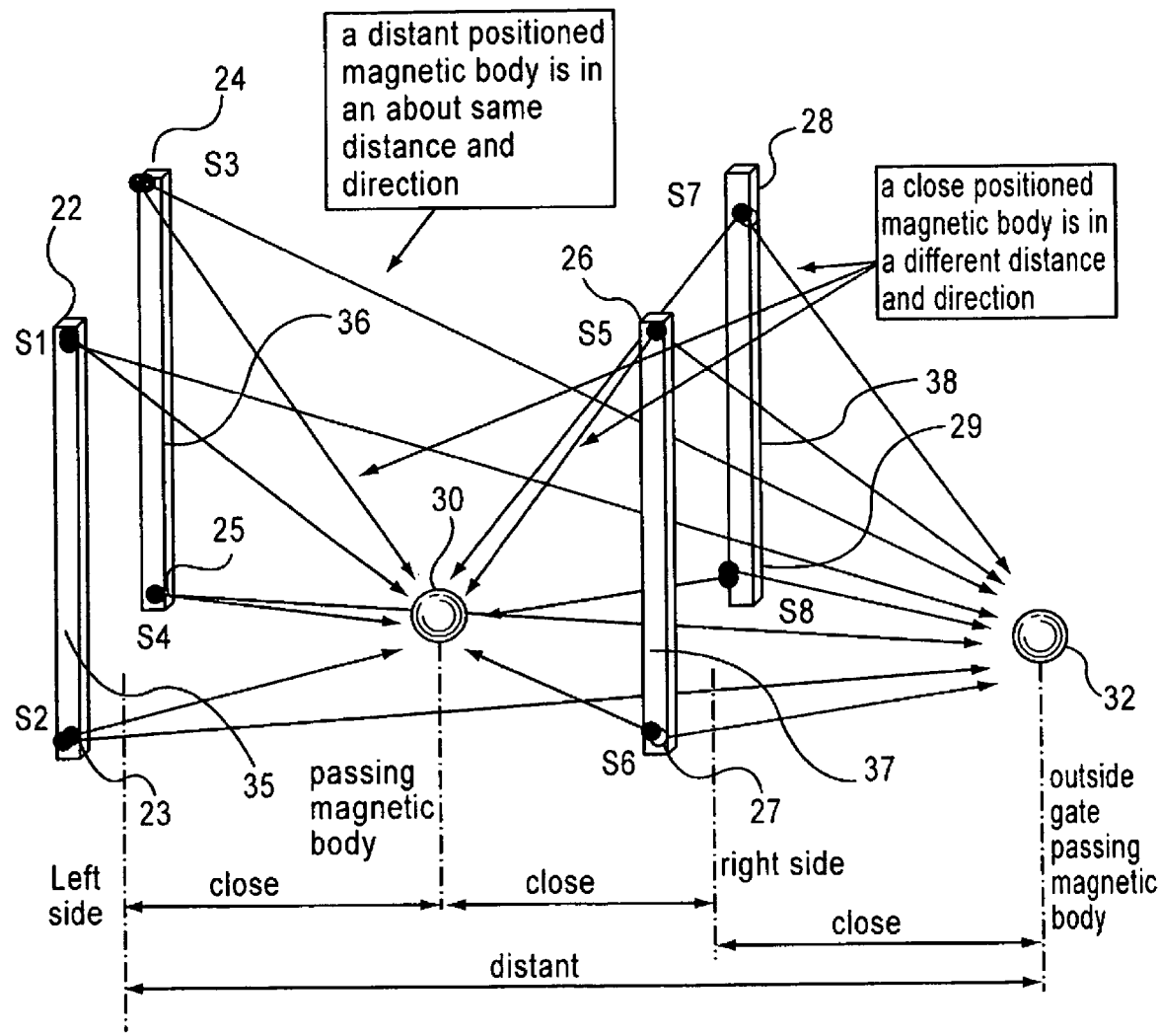
FIG. 58 is a schematic explanatory diagram showing a sterical positional relationship among a gate, a passing magnetic body and a magnetic body passing outside a gate.

Herein, a pattern diagram where the positional relationship among the sensor units 22 to 29, the passing magnetic body 30 and the magnetic body passing outside a gate 32 is sterically expressed is shown in FIG. 58. The distance between the passing magnetic body 30 and the magnetic sensors 22 to 29 is comparatively close. Therefore, the direction and distance from each of the magnetic sensors 22 to 29 to the passing magnetic body 30 are various.

The distance between the magnetic body passing outside a gate 32 and the magnetic sensors 26 to 29 is also comparatively close. Therefore, the direction and distance between the closer magnetic sensors 26 to 29 and the passing magnetic body 32 are various. However, the distance between the magnetic body passing outside a gate 32 and farther magnetic sensors 22 to 25 is comparatively far. Therefore, the direction and distance between farther magnetic sensors 22 to 25 and the magnetic body passing outside a gate 32 are substantially the same.

Figure 59:
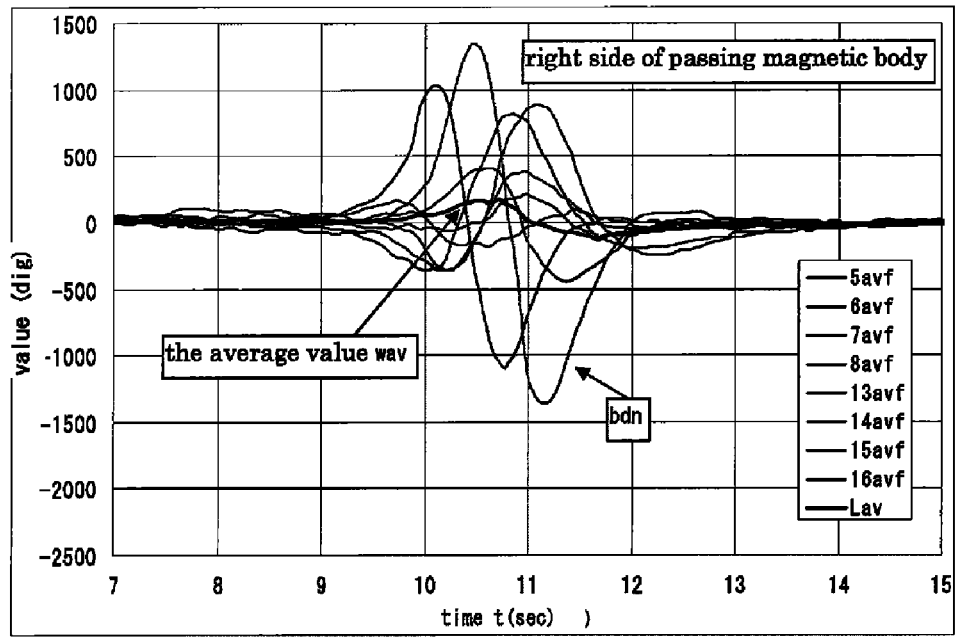
FIG. 59 is a schematic explanatory diagram showing an output result example when the passing magnetic body is detected using eight magnetic sensors at the right side.
Figure 60:
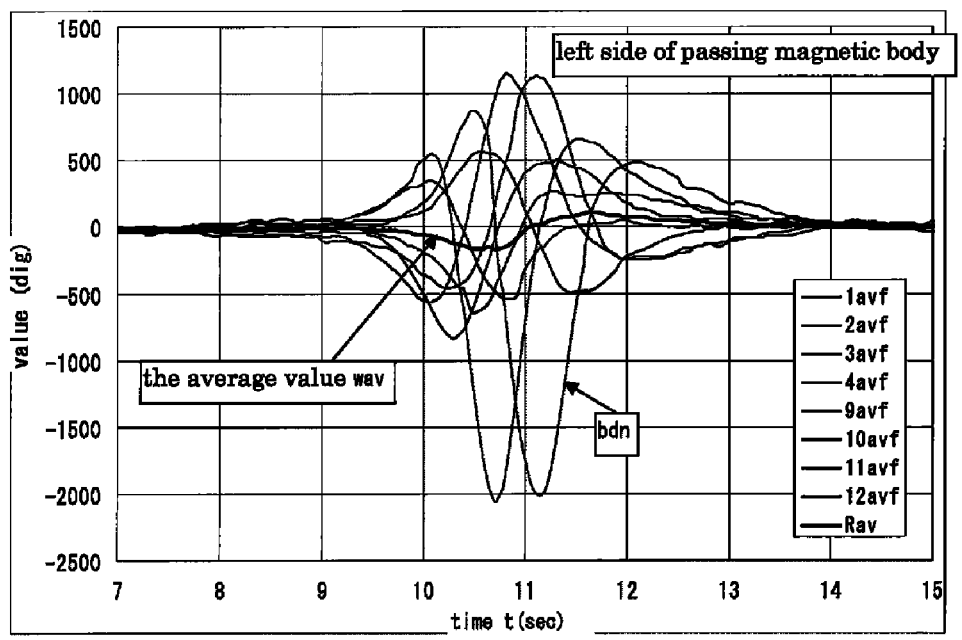
FIG. 60 is a schematic explanatory diagram showing an output result example when the passing magnetic body is detected using eight magnetic sensors at the left side.
Figure 6:
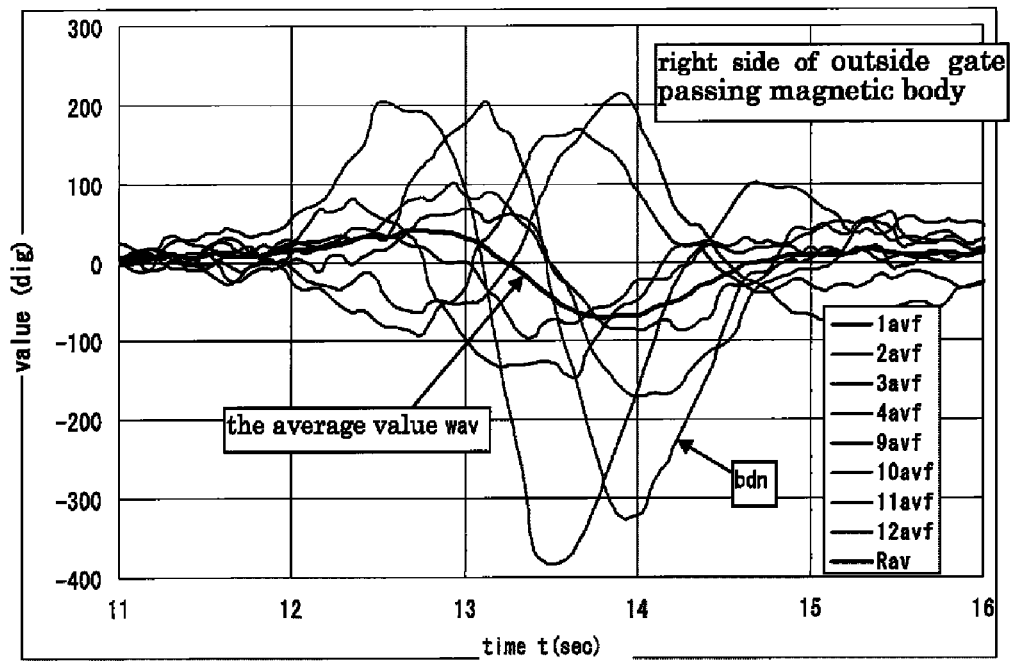
Figure 6:
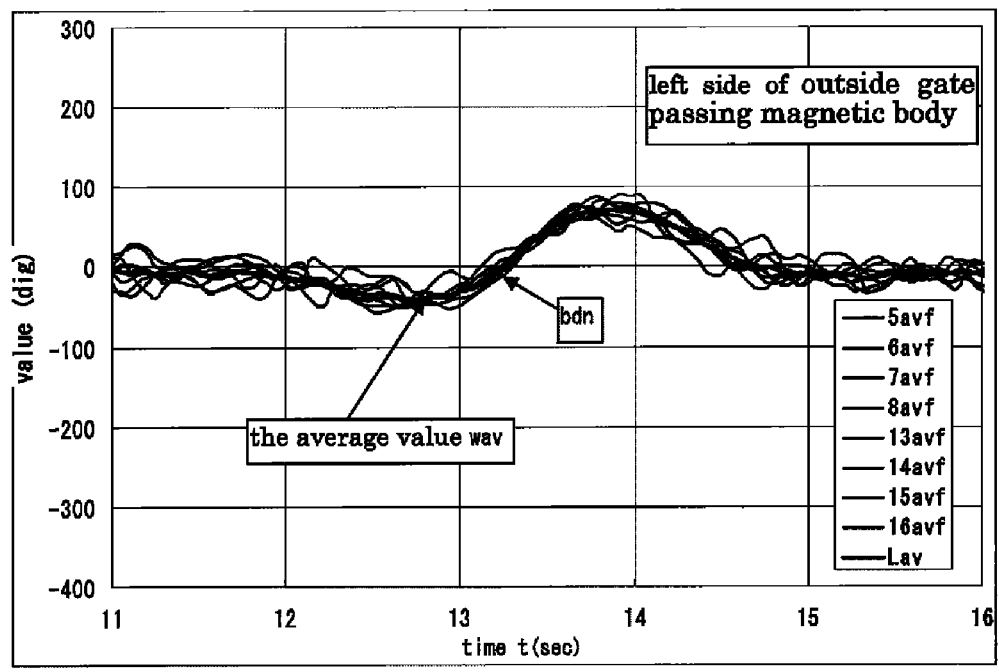
Figure 6:
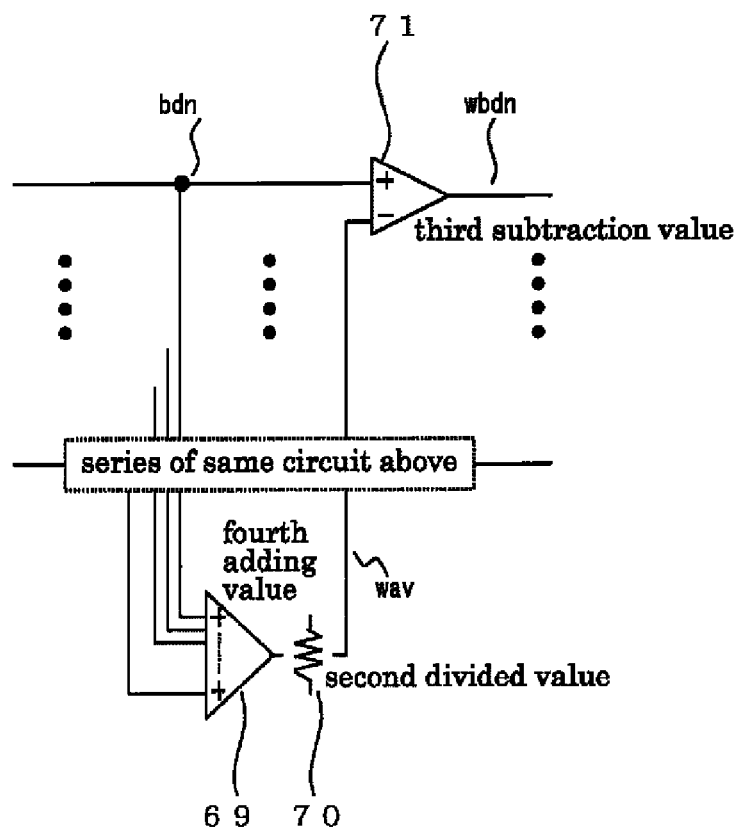

Under the condition where four magnetic sensors are established in one sensor unit, eight waveforms each of the signal bdn in right and left where far in-phase signals are removed when the passing magnetic body 30 is moved is shown in FIG. 59 and FIG. 60. Further, eight waveforms each of the signal bdn in right and left when the magnetic body passing outside a gate 32 is moved is shown in FIG. 61 and FIG. 62. As shown in FIG. 59 and FIG. 60, when the passing magnetic body 30 is moved, the phase and the amplitude of eight bdn in right and left are various. As shown in FIG. 61, when the magnetic body passing outside a gate 32 is moved, the phase and the amplitude of eight bdn in the closer one are also various. However, as shown in FIG. 62, the phase and the amplitude of the eight bdn in the farther one are substantially the same.

This phenomenon occurs because the phase and amplitude of bdn in the magnetic sensor are determined by the direction and distance to the magnetic body. If the direction and distance are different, the phase and amplitude are different. As similar to the effect of the far magnetic body 33, if the direction and distance are substantially the same, the phase and the amplitude will be substantially the same.

The method of removing signals with the same phase and the same amplitude is basically the same as the method of controlling the effect of the far magnetic body 33. In the case of the far magnetic body 33, the in-phase component of all magnetic sensors is removed; however, in this case, the in-phase components are removed in right and left, respectively, and an in-phase component removal signal wdbn is obtained. The method of removing the in-phase component comprises an addition calculation function 69, a division calculation function 70 and a subtraction calculation function 71 as many as the magnetic sensors, and an average value wav, which is an in-phase signal, is subtracted.

Figure 64:
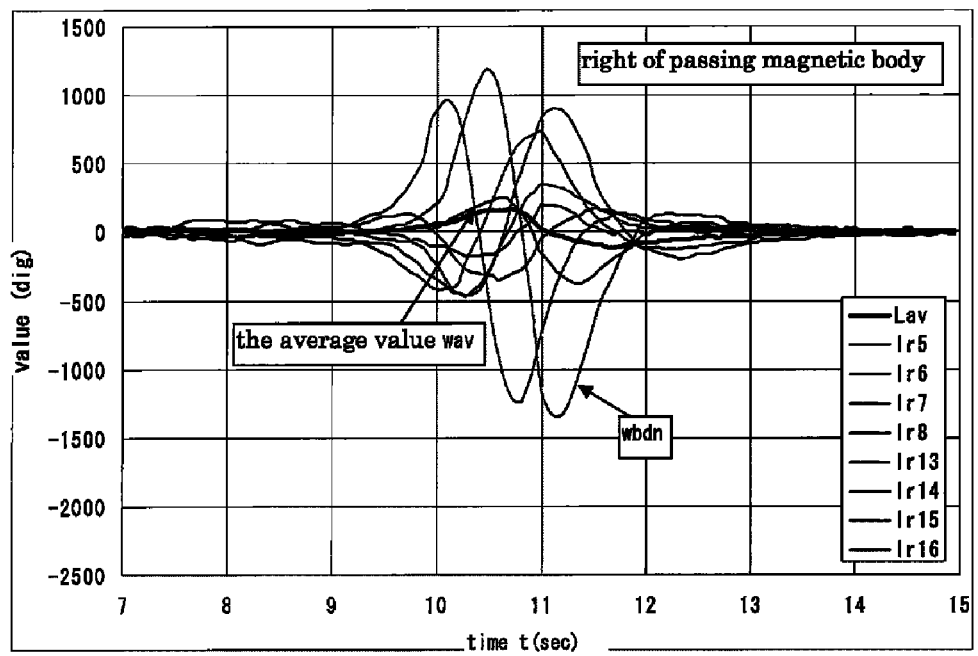
FIG. 64 is a schematic explanatory diagram showing an in-phase calculation output result example when a passing magnetic body is detected using eight magnetic sensors at the right side.
Figure 65:
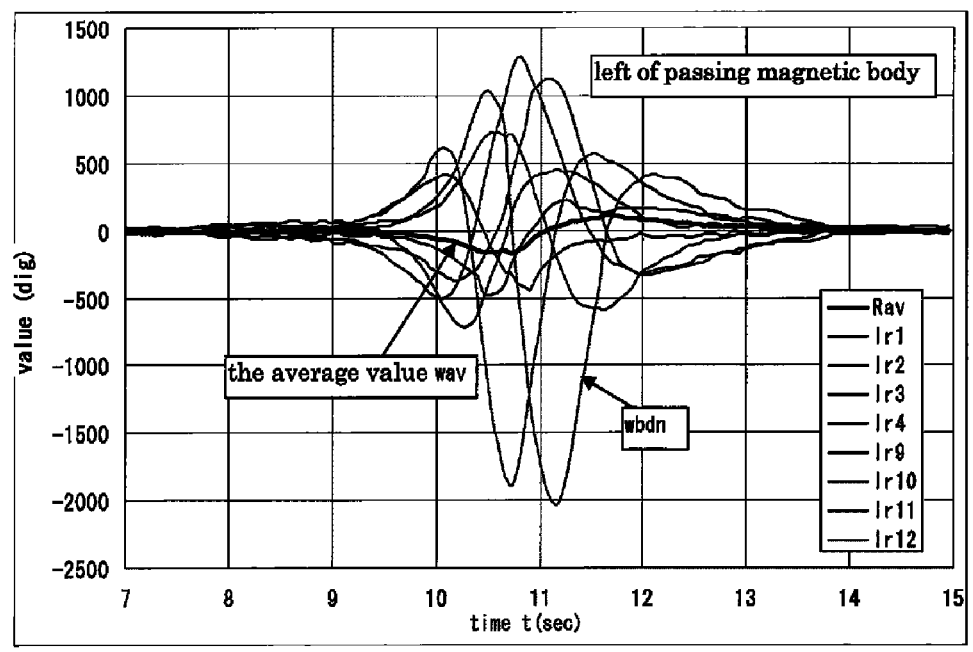
FIG. 65 is a schematic explanatory diagram showing an in-phase calculation output result example when a passing magnetic body is detected using eight magnetic sensors at the left side.
Figure 6:
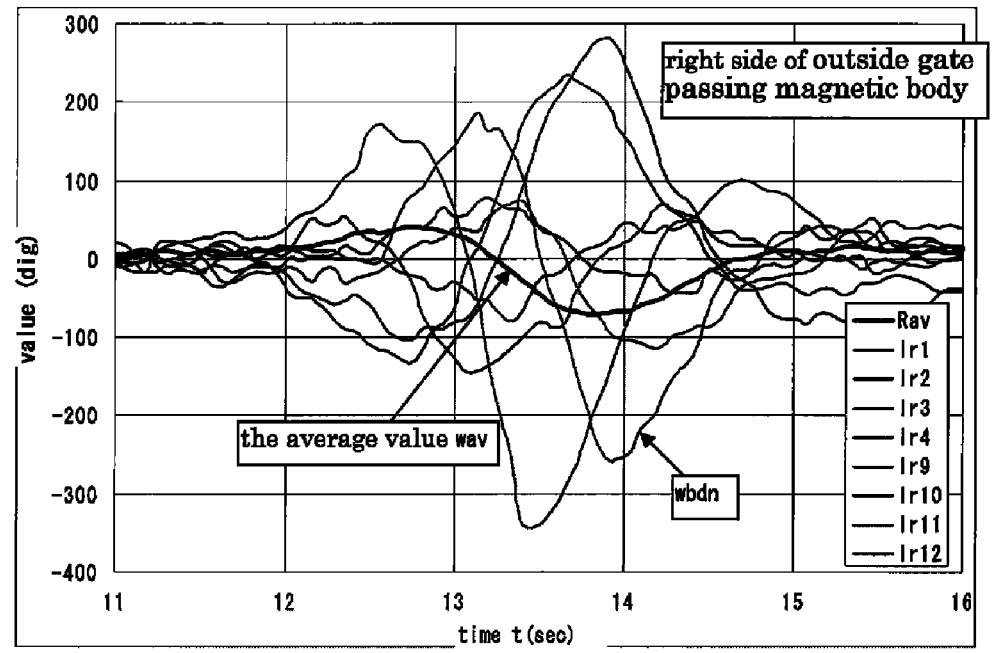
Figure 6:
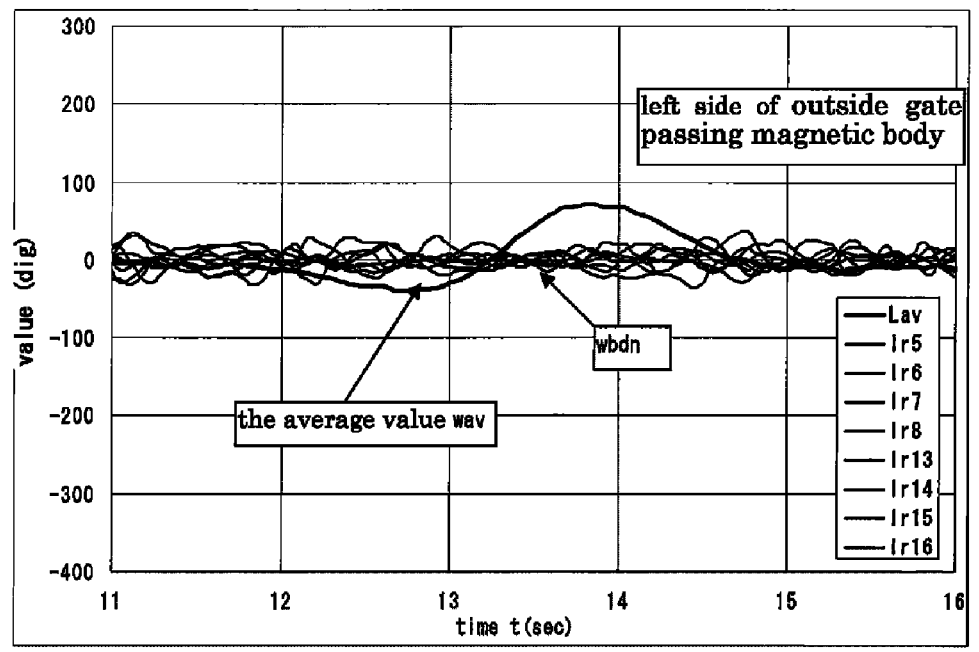

Results of calculation the dbn waveforms shown in FIG. 59 to FIG. 62 using the calculation function shown in FIG. 63 are shown in FIG. 64 to FIG. 67. As shown in FIG. 64 and FIG. 65, when the passing magnetic body 30 is moved, the in-phase component removal signal wdbn has no significant difference from the waveform of dbn, which is an original signal. As shown in FIG. 66, when the magnetic body passing outside a gate 32 is moved, eight in-phase component removal signals wdbn in the closer side are also not significantly different from the waveform of the original signal dbn. However, as shown in FIG. 67, it is characterized such that eight in-phase component removal signals wdbn in the farther side become an extremely smaller value. Therefore, if this characteristic is extracted and the detected value by the magnetic body passing outside a gate 32 is restrained, the realization is possible.

However, whether the magnetic body is close or far cannot be determined only with the values shown in FIG. 64 to FIG. 67. Even when the distance from the magnetic body, if the size of the magnetic body is large, the absolute value becomes larger. Therefore, the value has to be converted into a value that will not be affected by the size of the magnetic body. Comparing between FIG. 59 to FIG. 62 and FIG. 64 to FIG. 67, before and after the in-phase signal is removed, among the sensor units 35 to 38, only when the magnetic body passing outside a gate 32 passes through the farther one, the value changes greatly. Therefore, if the signal wdbn after the in-phase signal is removed is divided by the signal dbn before the in-phase signal is removed and an in-phase ratio wsj is obtained, the determination becomes possible. However, since the signals wdbn and dbn are changed both positive and negative, respectively, they are added after obtaining an absolute value, and after the added values |swdb| and |sdb| are obtained, the division is performed, and then, the in-phase ratio wsj is obtained.

It is possible to obtain two in-phase ratios wsj in right and left; however, it is necessary to convert to one calculated value at last. A left-right coefficient wf is obtained from two in-phase ratios wsj. In order to obtained the left-right coefficient wf, there are some calculation means, such as average value calculation of two in-phase ratios wsj, ratio calculation or selection of minimum value, and the removal rate in the horizontal direction is changed according to the calculating means. When the horizontal direction is removed too extremely, even with the gate passing magnetic body 30, when the end of the gate is passed through, the removal is conducted too much and there is a case that a magnetic body cannot be detected. In this description, an example using the average value calculation is shown.

However, this calculating method is one example of the present invention, and even if the other calculating method is used, there is no problem.

Figure 68:
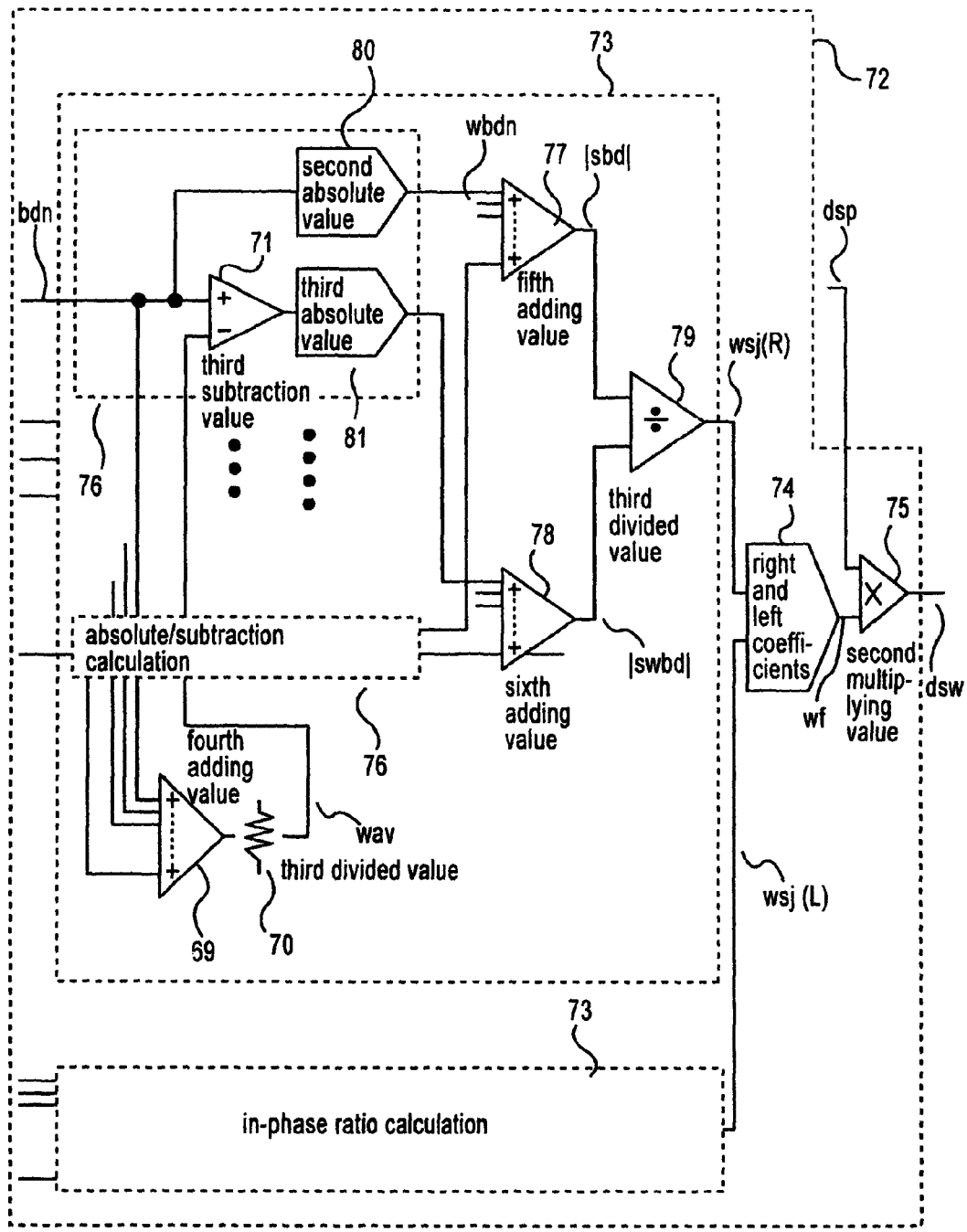
FIG. 68 is a schematic explanatory diagram showing an in-phase calculation functional part in the functional configuration example for notifying about a magnetic body using right and left in-phase calculation function.

FIG. 68 shows an example of a left-right in-phase removal calculation function 72. The left-right in-phase removal calculation function 72 is composed of two right and left in-phase ratio calculation functions 73, a left-right coefficient calculation function 74 and a multiplication calculation function 75. One in-phase ratio calculation function 73 is composed of absolute-subtraction calculation functions 76, addition calculation functions 69, division calculation functions 70, addition calculation functions 77, addition calculation functions 78 and division calculation functions 79 of half the magnetic sensors. The absolute-subtraction calculation function 76 is composed of a subtraction calculation function 71, an absolute value calculation function 80 and an absolute value calculation function 81. Furthermore, the division calculation function 81 includes an exception processing so as to not be divided by zero. For these calculations, a method composed with an electric calculating circuit according to a multiplication circuit and a division circuit is available in addition to a numerical calculation method.

Figure 69:
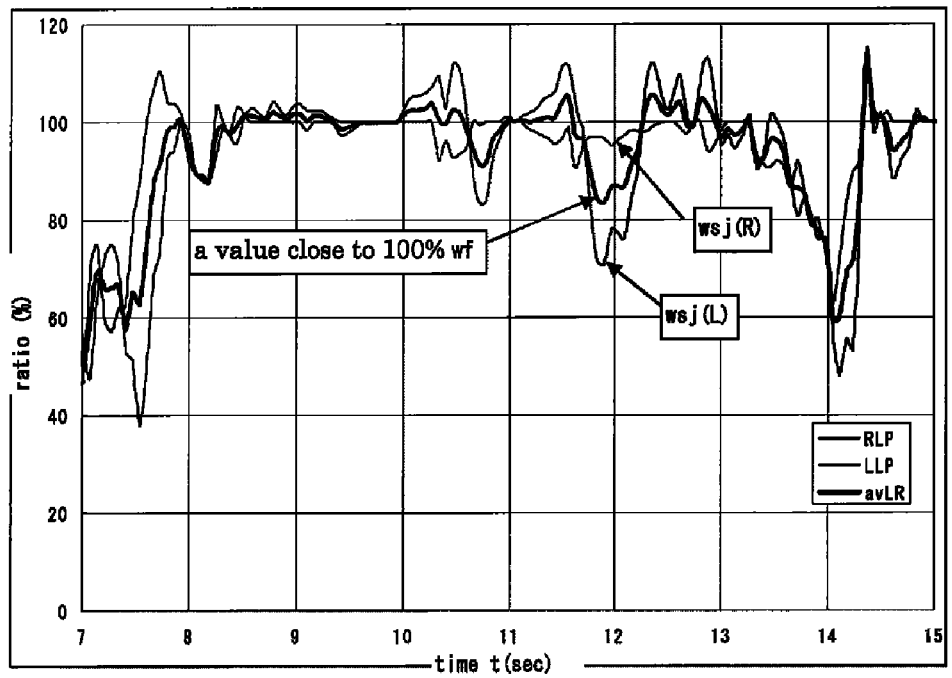
FIG. 69 is a schematic explanatory diagram showing a right and left in-phase calculation output result example when a passing magnetic body is detected using sixteen magnetic sensors at the right side.

FIG. 69 shows the in-phase ratio wsj and a left-right coefficient wf when the passing magnetic body 30 is moved. According to FIG. 69, when the passing magnetic body 30 is moved, two in-phase ratios wsj indicate a value close to 100%. Therefore, the left-right coefficient wf, which is an average value of two in-phase ratio wsj, indicates a value close to 100%.

Figure 70:
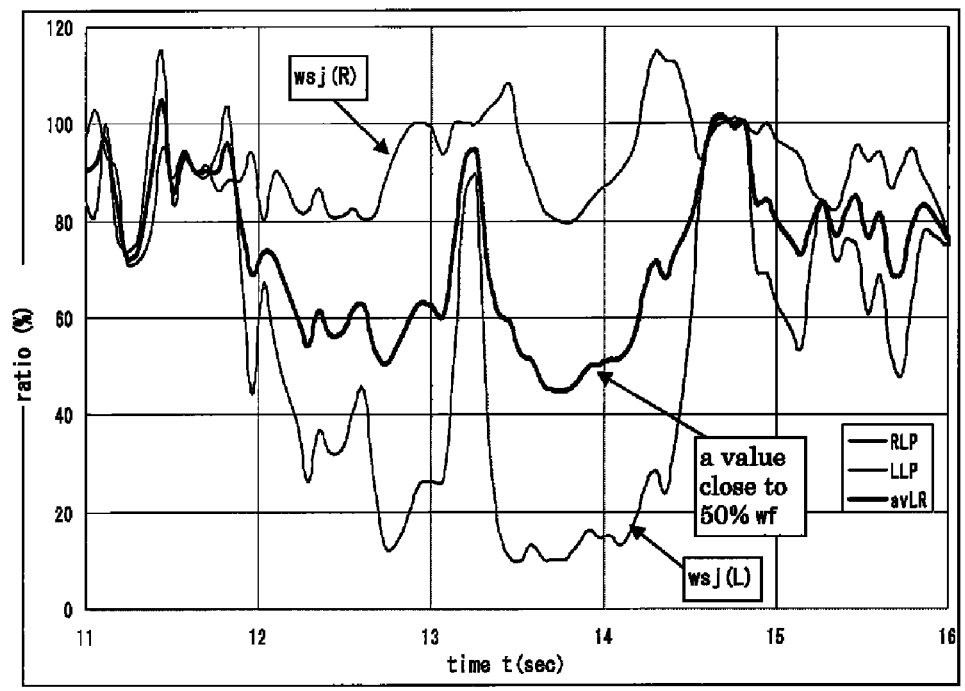
FIG. 70 is a schematic explanatory diagram showing a right and left in-phase calculation output result example when a passing magnetic body is detected using sixteen magnetic sensors at the left side.

FIG. 70 shows the in-phase ratio wsj and the left-right coefficient wf when the magnetic body passing outside a gate 32 is moved. According to FIG. 70, when the magnetic body passing outside a gate 32 is moved, the in-phase ratio wsj in the closer side indicates a value closer to 100%; however, the in-phase ratio wsj in the farther side indicates a value close to 0%. Therefore, the left-right coefficient wf indicates a value close to 50%.

Figure 71A:
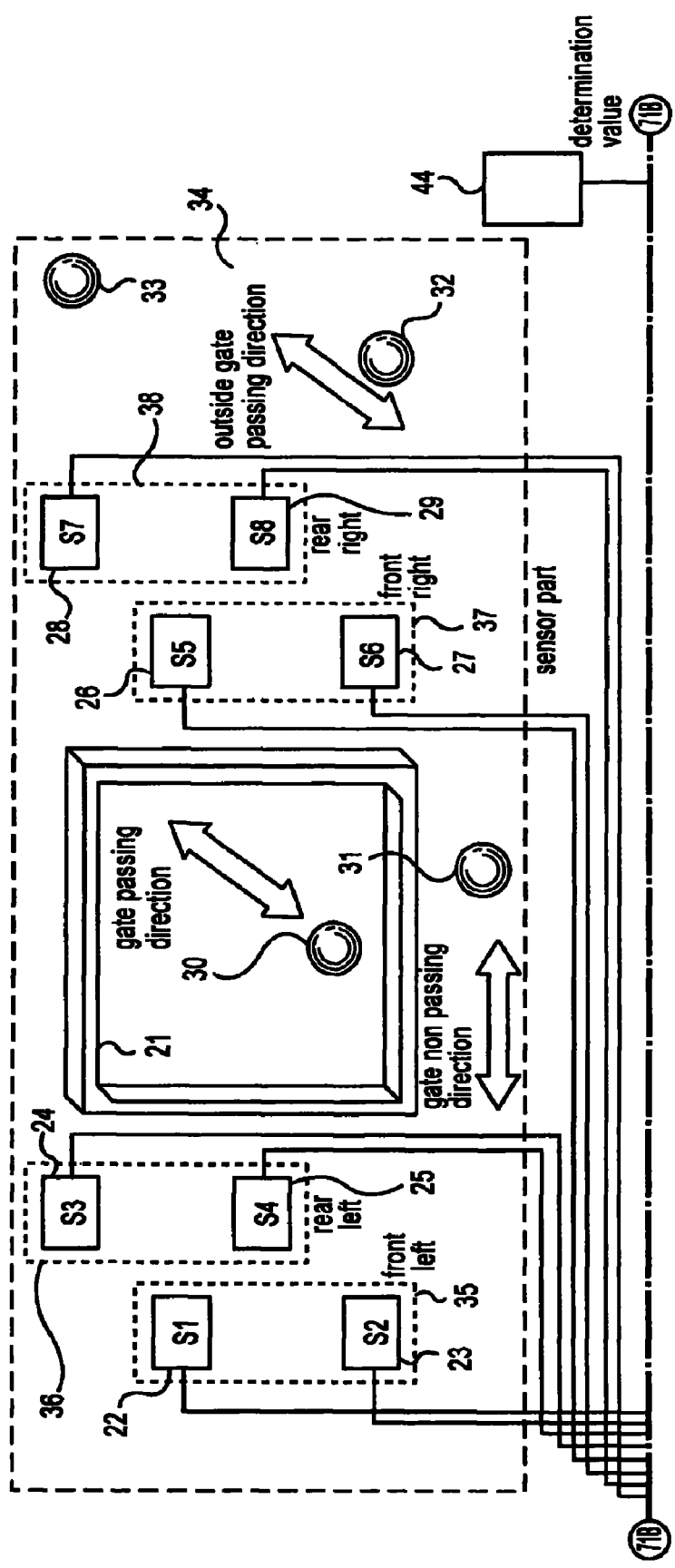
FIGS. 71A-71C are a schematic explanatory diagram showing one configuration mode of the magnetic body detector relating to the present invention.
Figure 71B:
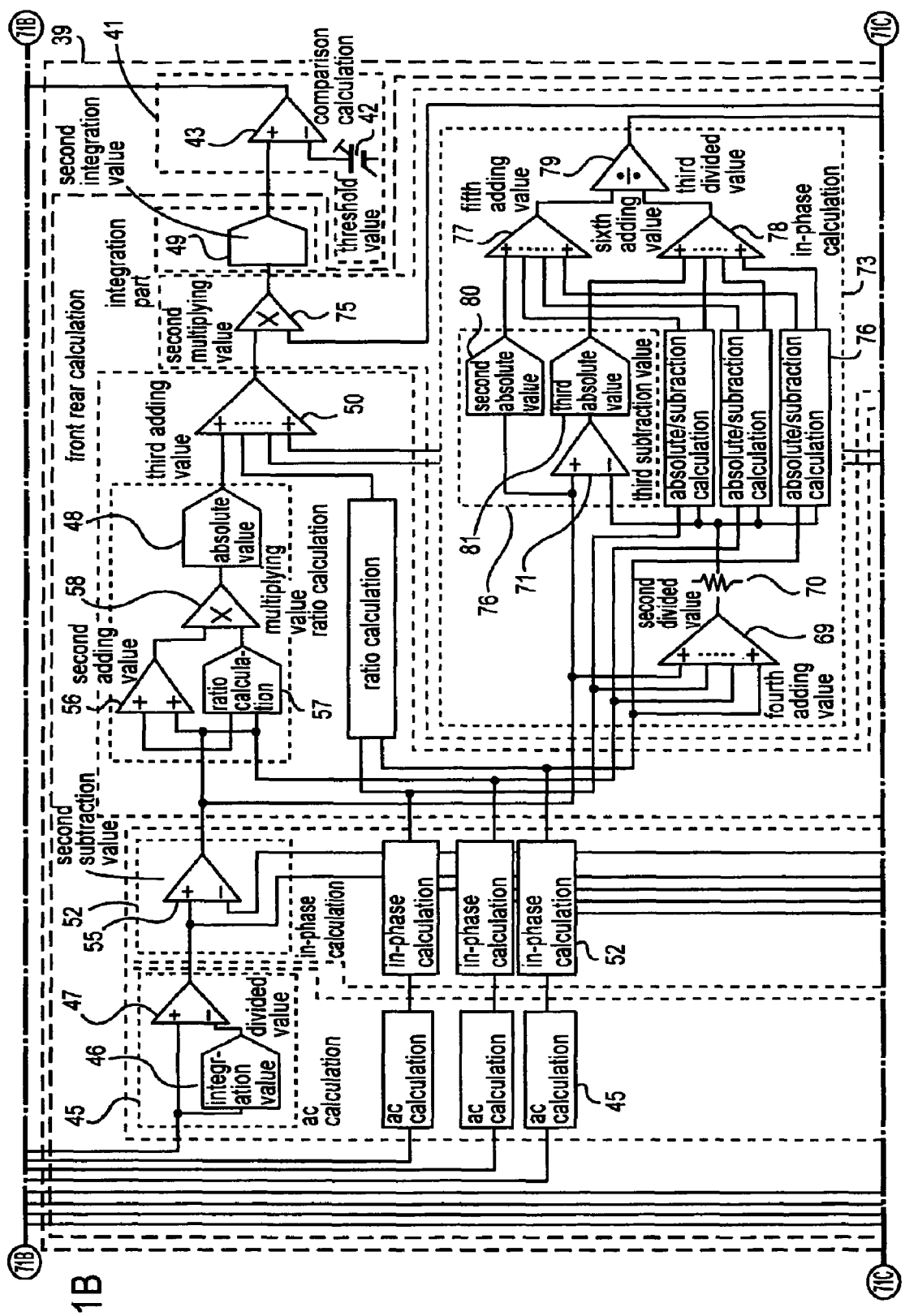
Figure 71C:
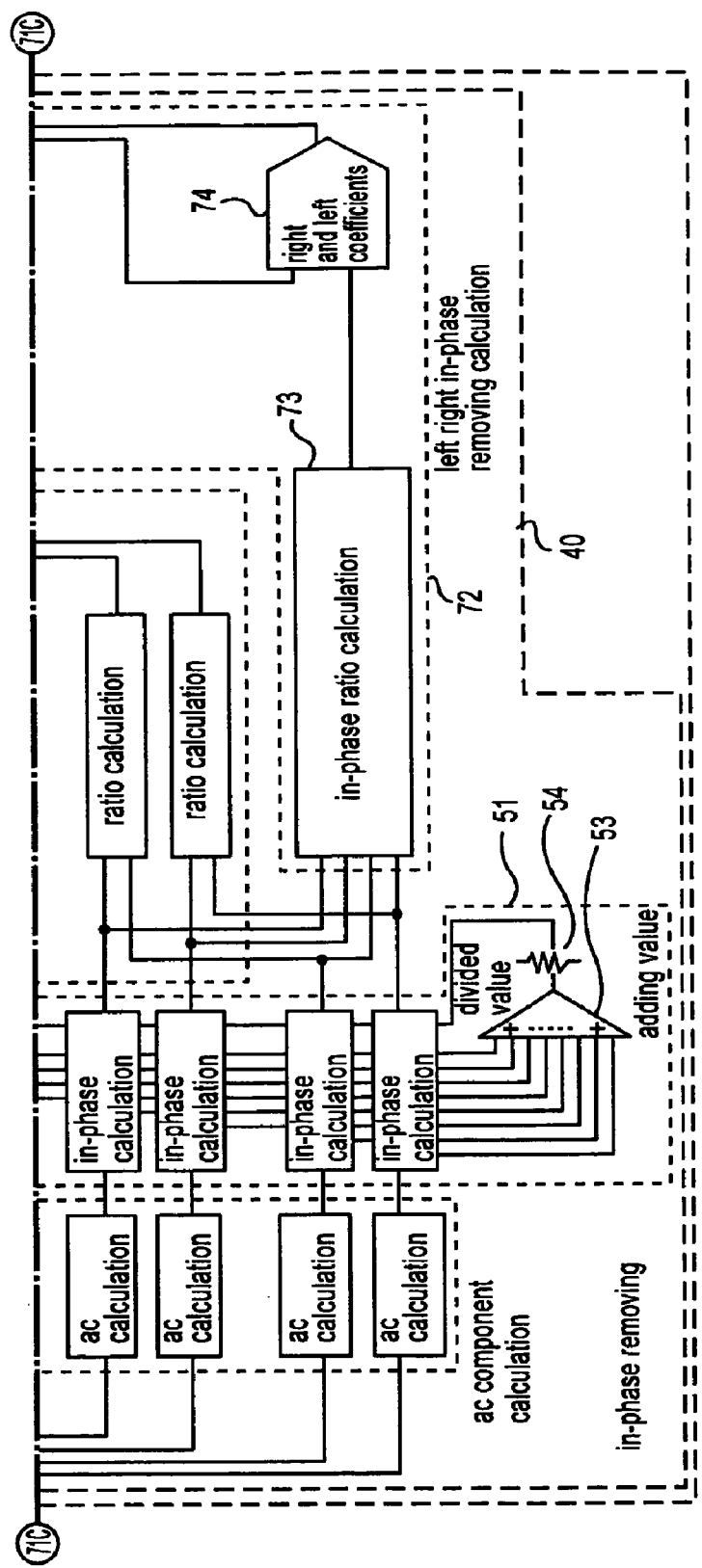
Figure 7:
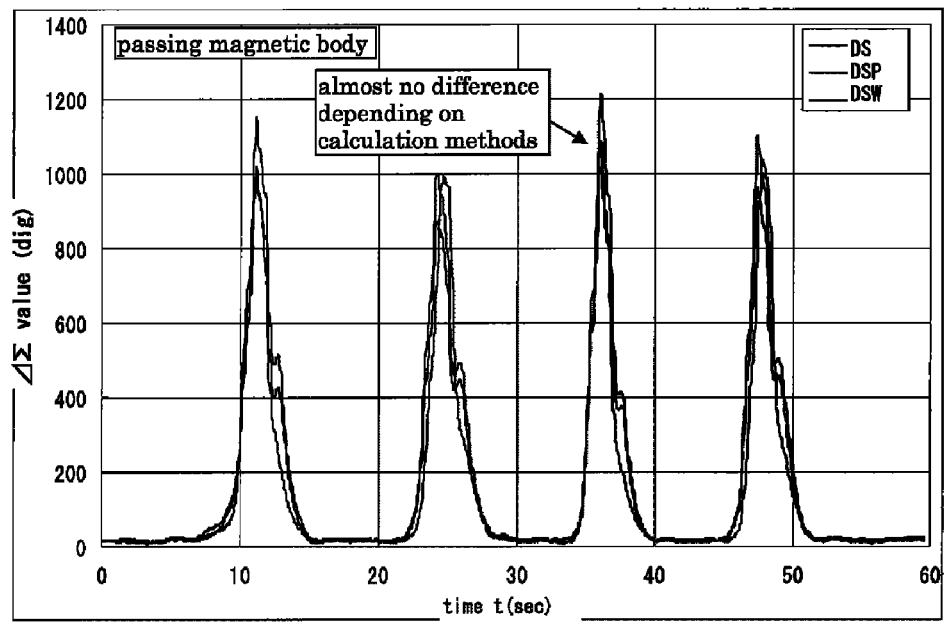
Figure 7:
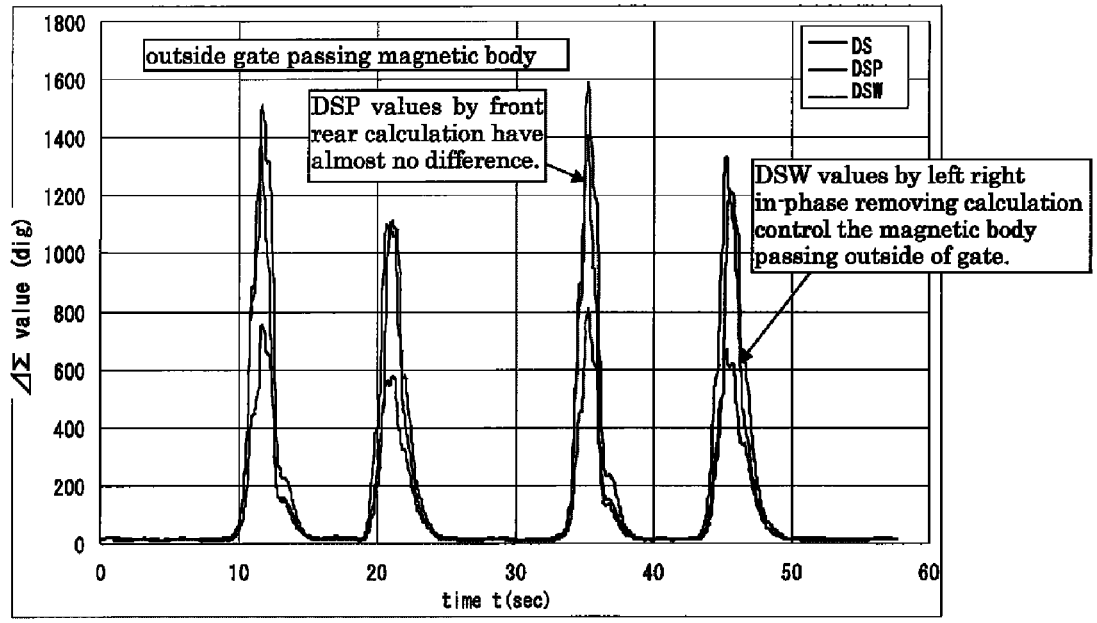
Figure 7:
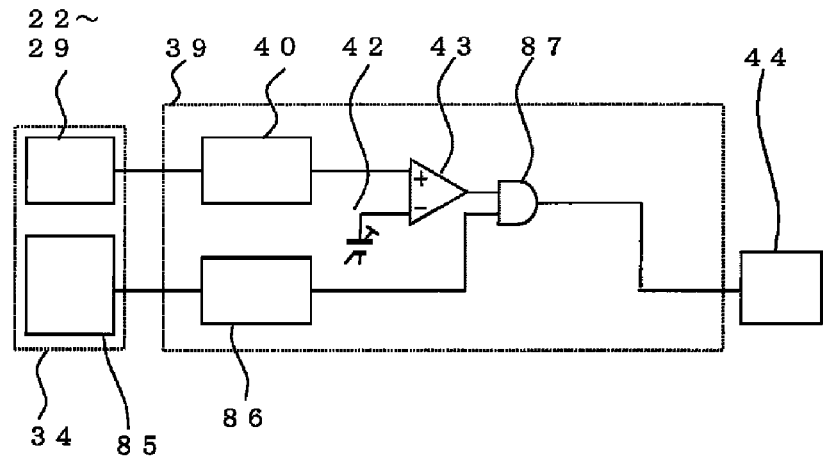
Figure 7:
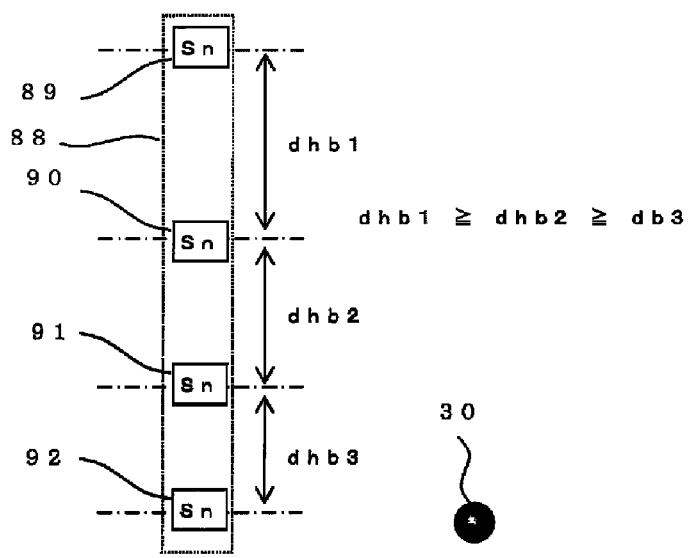

FIGS. 71A-71C show a calculation function for obtaining a detection value DSW, which is a result of integration calculation, using the left-right coefficient wf according to the left-right in-phase removal arithmetic algorithm shown in FIG. 68, and using a calculation result dsp of the front-to-rear ratio arithmetic algorithm shown in FIG. 51 and a calculation result dsw multiplied by the multiplication calculation function 75.

FIG. 72 shows a detection value DSW where the detection value DS and the detection value DSP when the passing magnetic body 30 is moved, and the left-right in-phase removal arithmetic algorithm shown in FIGS. 71A-71C are added and processed. According to FIG. 72, when the passing magnetic body 30 is moved, there is no significant difference among three detection values DS, DSP and DSW.

FIG. 73 shows a detection value DSW where the detection value DS and the detection value DSP when the magnetic body passing outside a gate 32 is moved, and the left-right in-phase removal arithmetic algorithm shown in FIGS. 71A-71C are added and processed. According to FIG. 73, when the magnetic body passing outside a gate 32 is moved, there is no significant difference between the two detection values DS and DSP. However, the detection value DSW where the left-right in-phase removal arithmetic algorithm is added is smaller value compared to the former one. Therefore, the non-passing magnetic body 31, which is unnecessary for a user, is controlled, and this is effective.

Next, the invention for notifying only to a passing object relating to the present invention will be described hereafter.

FIG. 74 is another schematic explanatory diagram showing a configuration mode of the magnetic body detector relating to the present invention. In other words, an object detection sensor 85, an object detection signal processing function 86 and a logical multiplication function 87 are added to the magnetic body detector shown in FIGS. 71A-71C.

According to the configuration shown in FIGS. 71A-71C, it becomes possible to extract the characteristics of the detection signals, such as the non-passing magnetic body 31, the magnetic body passing outside a gate 32 or the far magnetic body 33, and to control this; however, it is impossible to completely inhibit them. When a large magnetic body is moved or when a magnetic body passes through extremely close to the gate 21, this magnetic body happens to be detected.

Then, whether or not an object has passed through the gate 21 is detected using the object detection sensor 85, and the passage is determined by the object detection signal processing function 86, and only when the object has passed through, the notification function 44 is activated via the logical multiplication function 87. Even when a magnetic body approaches the gate 21, if it does not pass through, the notification function 44 will not be activated.

For the object detection sensor 85, various types of detection methods, such as light beam blocking or ultrasonic measurement, are available; however, the method is not defined herein. For example, in the case of light blocking, one becomes light emission, and the other becomes light reception. As described above, even if a function is divided or a plurality of functions are established, there is no problem.

Only when an object passes through the gate 21 and the object is a magnetic body and the detection value of said magnetic body is a threshold value or larger, the notification function is activated. Since the detection is notified only when requirements are met, it becomes possible for a user to receive an effective notification.

Next, the invention for improving a detection value of a magnetic body arranged at the lower side relating to the present invention will be described.

FIG. 75 is another schematic explanatory diagram showing a configuration mode of the magnetic body detector relating to the present invention. In other words, a plurality of magnetic sensors 89 to 92 are installed to one sensor unit 88, and the installation intervals in between the magnetic sensors 89 to 92 are narrower at the lower side compared to those at the upper side.

There are various types of supplies in an actual hospital. Other than medical supplies relating to medical procedures, construction tools, such as a stepladder, and cleaning supplies, such as a polisher, may be placed nearby. Among these supplies, there are MRI supplies whose ratio of a magnetic body is small and there are also non-MRI supplies whose ratio of a magnetic body is large.

For materials of a magnetic body, there are various types, and the most widely-used magnetic body material is iron. Since iron is strong, inexpensive and easy to be acquired, they are widely used for non-MRI supplies. Further, iron is characterized by large specific gravity. If iron whose specific gravity is large is arranged at the lower side, because the center of gravity is at the lower side, the degree of stability becomes high.

Figure 76:
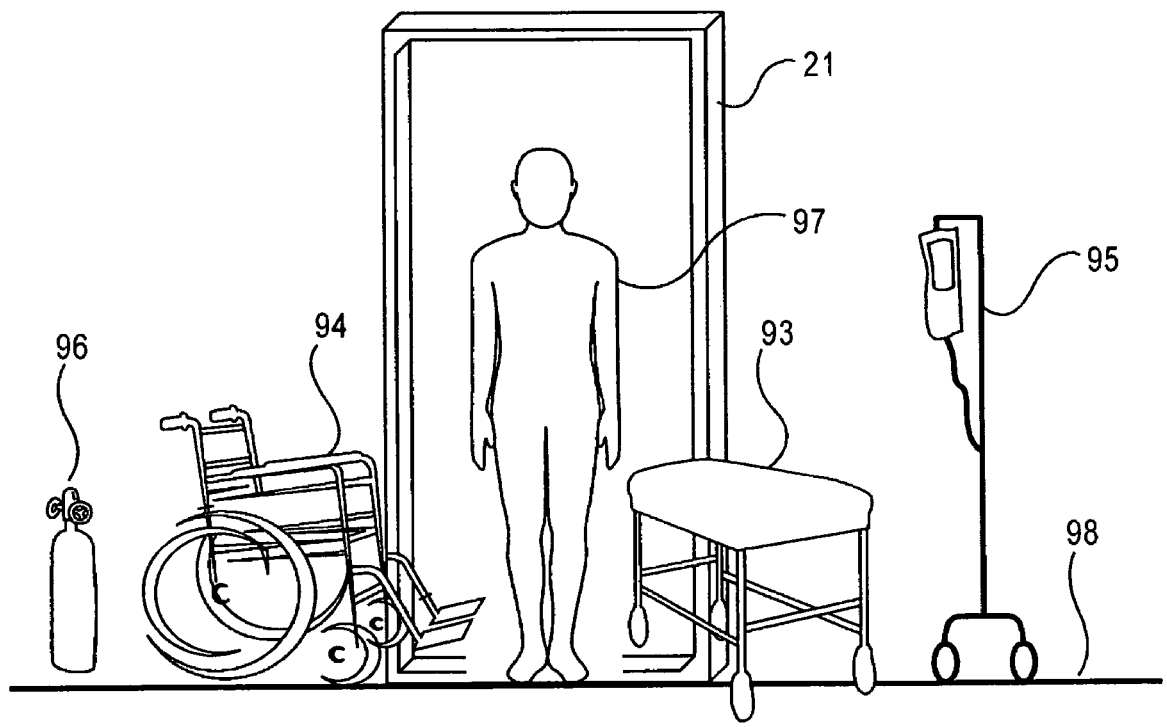
FIG. 76 is a schematic explanatory diagram showing a positional relationship of each substance that passes through a gate.

FIG. 76 shows an example of general medical supplies.

The medical supplies include a stretcher 93, a wheelchair 94, an infusion stand 95 and a cylinder 96. Iron is often used for medical supplies for non-MRI. In the stretcher 93, the wheelchair 94 and the infusion stand 95, in order to improve the degree of stability, an iron material, which is heavy, is often arranged at the lower side. Especially, the infusion stand emphasizes the degree of stability, and many stands set the center of gravity at the lower side using a heavy iron pedestal. Stainless steel whose magnetic permeability is low or aluminum, which is lightweight non-magnetic body, is often used for a support rod. In the cylinder 96, an iron cylinder is a heavy object. In the case of carrying the cylinder 96 as a single unit, a user 97 often hangs and carries the cylinder in his/her hand. In the case that the cylinder 96 is secured to the stretcher 93 or the wheelchair 94 and carried, because it is dangerous if the cylinder is dropped, it should not be installed at the higher position, but it is general to install the cylinder at the lower position. As described above, it is characterized such that iron, which is a heavy object and a magnetic body, is often moved not at the upper side of the gate 21 but near a floor surface 98 at the lower side.

Among the vacuum accidents of the MRI diagnostic systems in actual hospitals, the accidents by the infusion stand 95 account for a substantial percentage. Therefore, it is necessary to detect the infusion stand 95 and warn a user. In order to improve the degree of stability, a heavy iron pedestal is used for the infusion stand 95, and the center of gravity is set at the lower side. Stainless steel whose magnetic permeability is low or aluminum, which is lightweight non-magnetic body, is often used for a support rod. This infusion stand 95 with an iron pedestal is characterized such that the magnetic body part is close to the floor surface.

Regarding the distance between a magnetic sensor and a magnetic body, the change in magnetic flux density delta B is inversely proportional to the square of the distance between the magnetic sensor and the magnetic body. In other words, it means that the longer the distance becomes, the more drastically the output of the magnetic sensor decreases. In order to improve a detection value of the magnetic body, it is desirable to shorten the distance between the magnetic body and the magnetic sensor.

Figure 77:
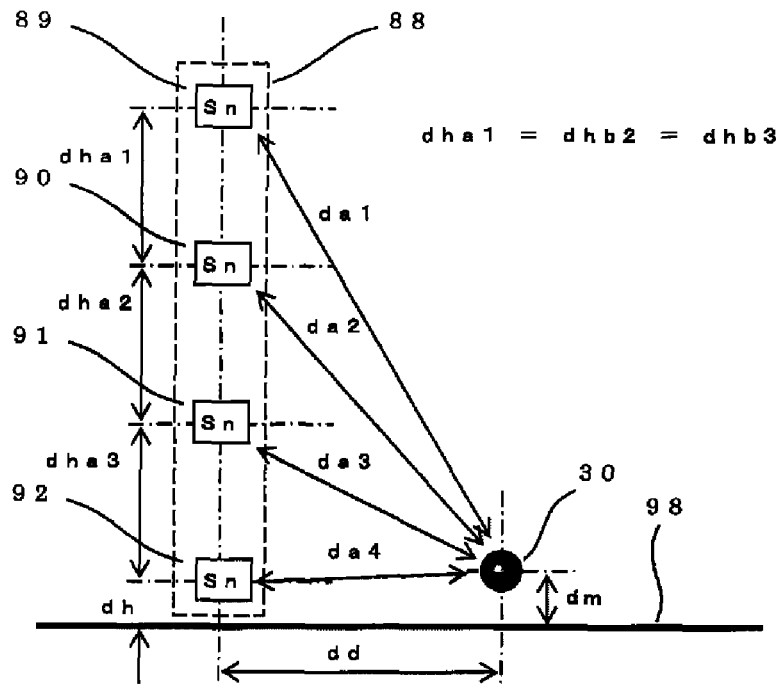
FIG. 77 is a schematic explanatory diagram showing a positional relationship between magnetic sensors arranged in equal intervals and a magnetic body that passes through the lower side of the gate.

As shown in FIG. 77, a case of arranging a plurality of magnetic sensors 89 to 92 in one sensor unit 88 at equal intervals is assumed. Furthermore, in FIG. 77, four magnetic sensors are illustrated; however, even if the quantity is changed as occasion demands, the function is the same. For the distance from each of the magnetic sensors 89 to 92 to the passing magnetic body 30 situated at the lower side, the distance da4 from the magnetic sensor 92 installed at the lowest is the closest, and the higher the position of the magnetic sensor becomes, the farther the distance becomes in order of da3, da2 and da1. Since the change in magnetic flux density is inversely proportional to the square of the distance between the magnetic sensors 89 to 92 and the passing magnetic body 30, respectively, the detection outputs of the magnetic sensors become smaller in order of 92, 91, 90 and 89.

When the passing magnetic body 30 situated at the lower side is detected, if all of the magnetic sensors 89 to 92 are installed at the lower side, it is possible to increase the detection output of the magnetic sensor. However, the passing magnetic body 30 that passes through the gate 21 does not always move at the lower side. Therefore, the magnetic sensor is required even at the upper side, as well.

In order to increase the detection output of the magnetic body at any positions from the upper to lower sides, many magnetic sensors should be established. However, because the magnetic sensor is expensive, there is a problem that the production cost increases when many magnetic sensors are used. Then, it is necessary to increase the detection output of the passing magnetic body 30 at the lower side without increasing the quantity of the magnetic sensors.

Figure 78:
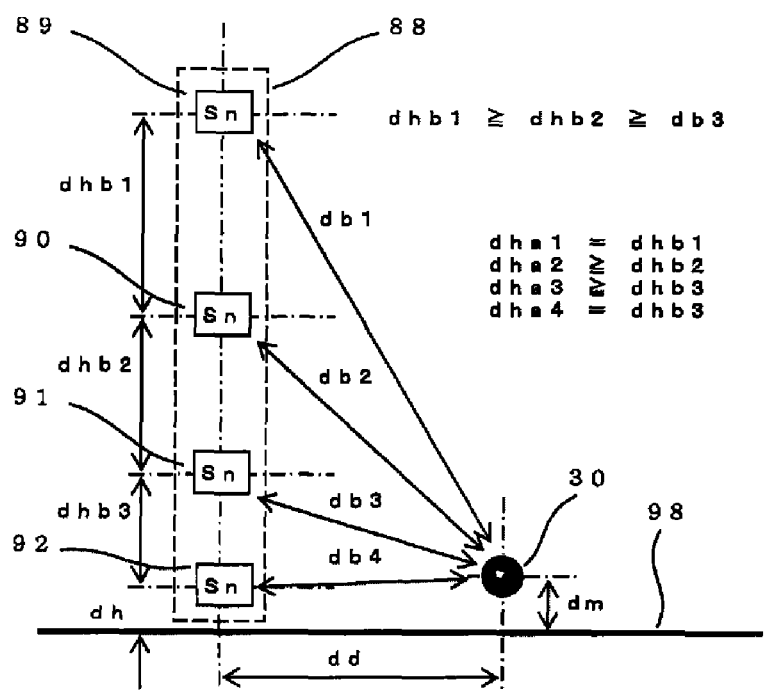
FIG. 78 is a schematic explanatory diagram showing a positional relationship between magnetic sensors arranged in unequal intervals and a magnetic body that passes through the lower side of the gate.

Next, FIG. 78 shows the case where $dhb1 \geq dhb2 \geq dhb3$, the intervals in between the magnetic sensors 89 to 92 are narrower at the lower side and the wider at the upper side. If the positions of the magnetic sensor 89 situated the highest and the magnetic sensor 82 situated the lowest from the floor surface 98 are the same, the detection outputs of the magnetic sensor 89 and the magnetic sensor 92 are the same.

However, the magnetic sensors 90 and 91 situated in between become closer to the passing magnetic body 30 at the lower side in the case of arranging the magnetic sensors at unequal intervals shown in FIG. 78 compared to the case of arranging them at equal intervals shown in FIG. 77. Therefore, the detection outputs of the magnetic sensors 90 and 91 become larger in FIG. 78 than that in FIG. 77. Therefore, the detection outputs of the passing magnetic body 30 becomes larger in the case of arranging the magnetic sensors 89 to 92 at unequal intervals shown in FIG. 78 compared to the case of arranging them at equal intervals shown in FIG. 77.

Setting intervals of the magnetic sensors to be unequal without increasing the quantity of the magnetic sensors enables the improvement of the detection value of the magnetic body situated at the lower side, and it is effective. According to this method, cost will not increase.

Next, another invention for improving the detection value of the magnetic body that passes through the vicinity of the center of the gate relating to the present invention will be described hereafter.

Figure 79:
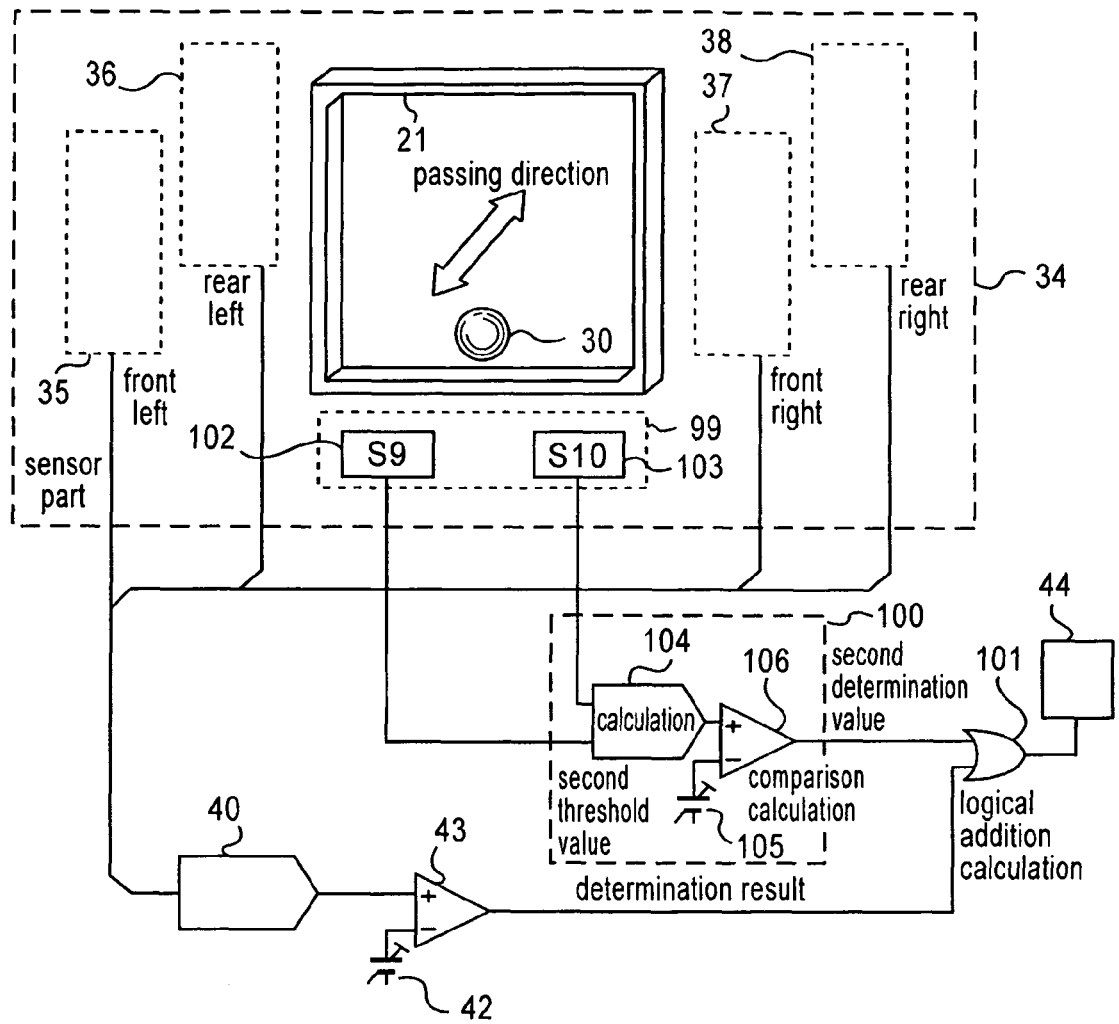
FIG. 79 is a schematic explanatory diagram showing one configuration mode of the magnetic body detector relating to the present invention.

FIG. 79 is another schematic explanatory diagram showing a configuration mode of the magnetic body detector relating to the present invention. In other words, this magnetic body detector is composed of a sensor unit 99, a second calculating part 100 and a logical addition calculation function 101 in the detection part 34 with the configuration shown in FIG. 17.

The sensor unit 99 is composed of the magnetic sensors 102 and 103, and is arranged at the lower side of the gate 21. In FIG. 79, two magnetic sensors 102 and 103 are illustrated; however, the quantity should be as needed. The second calculating part 100 is composed of a second magnetic signal processing part 104, a threshold value input function 105 for entering a second threshold value and a comparison calculation function 106.

Figure 80:
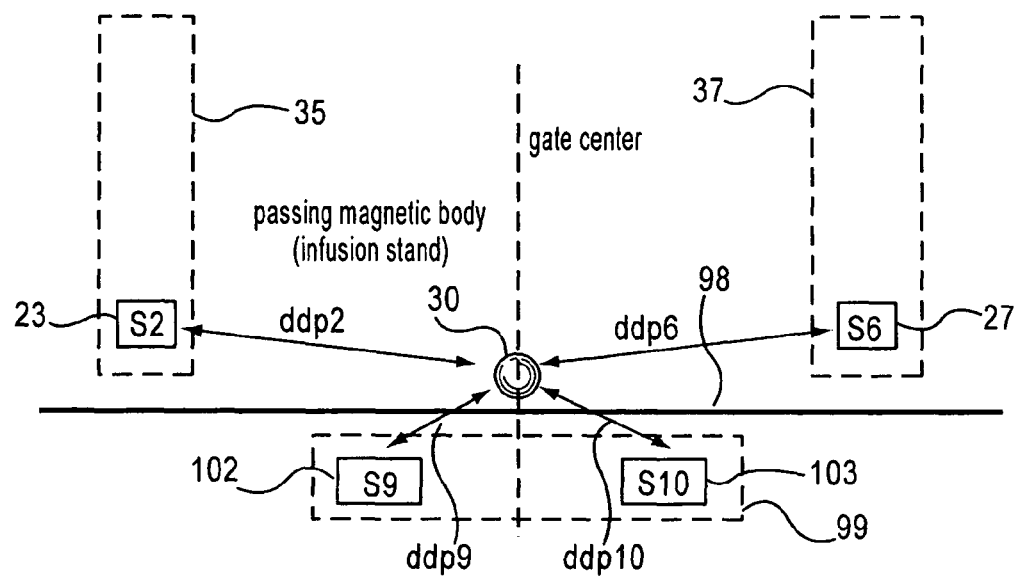
FIG. 80 is a schematic explanatory diagram showing a positional relationship of a magnetic sensor arranged under the floor and a magnetic body passing through the lower portion of a gate.

FIG. 80 shows an enlarged portion closer to the floor surface in FIG. 79.

When the user 97 passes through the gate 21 and brings the passing magnetic body 30, which position he/she passes is indefinite. He/she may pass through the gate adjacent to the sensor units 35 and 36 at the left side, may pass through the gate adjacent to the sensor units 37 and 38 at the right side or may pass through the center of the left and right sensor units. As shown in FIG. 80, when he/she passes through the center, the distances ddp2 and ddp6 from the magnetic sensors 23 and 27 becomes farthest.

Regarding the distance between the magnetic sensor and the magnetic body, the change in magnetic flux density delta B is inversely proportional to the square of the distance between the magnetic sensor and the magnetic body. In other words, it means that the longer the distance becomes, the more drastically the output of the magnetic sensor decreases. In order to improve the detection value of the magnetic body, it is desirable to shorten the distance between the magnetic body and the magnetic sensor.

In order to increase the output of the magnetic sensor, the magnetic sensor should be installed at the position where the change in magnetic flux density delta B becomes larger.

However, when the magnetic sensor is installed in the center of the gate 21, passage will be blocked.

Then, as shown in FIG. 80, the under-floor sensor unit 99 comprising the magnetic sensors 102 and 103 is installed under the floor surface 98. If the sensor unit is installed under the floor surface 98, it is possible to shorten the distance ddp2 and ddp6 to the passing magnetic body 30 such as an infusion stand, and it will not block the passage. The quantity of the magnetic sensors 102 and 103 should be one or more as occasions demand.

Figure 81:
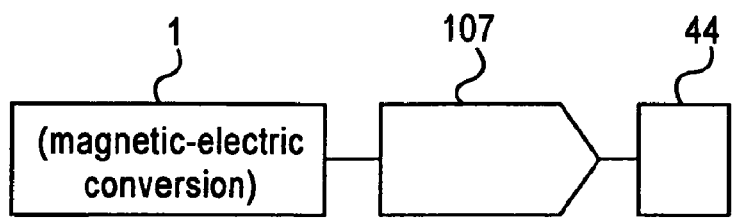
FIG. 81 is a block diagram showing a magnetic body detector using an analog computing circuit.

Since the distance to the passing magnetic body 30, such as an infusion stand that passes through the vicinity of the center of the gate 21, is shorter from the magnet sensor unit 99 installed under the floor than from the magnetic sensor units 35 to 38 arranged in the left and right, the detection output can be larger. If the detection output is large, this is effective because the magnetic body can certainly be detected. There are various methods for a method of specifically configuring the functions shown in FIGS. 71A-71C and FIG. 79. As shown in FIG. 81, it is also possible to process the output of the magnetic sensor 1 for converting the magnetic flux density B into electricity with the analog computing circuit 107 composed with an operational amplifier, a resistor or a capacitor.

Figure 82:
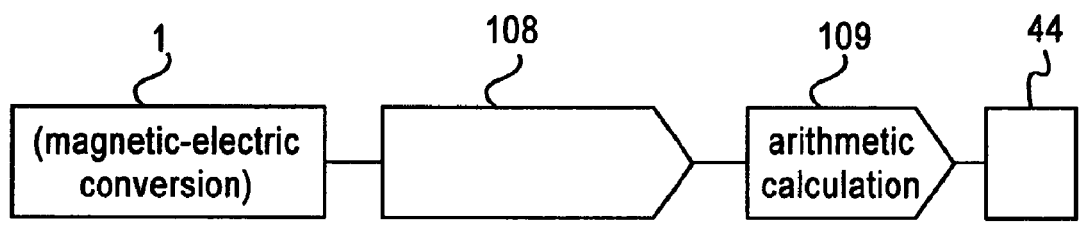
FIG. 82 is a block diagram showing a magnetic body detector using an analog-digital converting circuit and a math processing function.

Further, as shown in FIG. 82, there is another method to convert the output of the magnetic sensor 1 for converting the magnetic flux density B into electricity into numerical values using the analog-digital conversion circuit 108 for converting an analog value into a digital value, and to use the digital arithmetical unit 109 for performing numerical processing thereafter, as well. Other than this method, there is a method to mechanically convert the magnetic flux density B and to mechanistically process the converted value, and there is also a combination method.

Further, there are various methods as a calculation method. For example, after multiplication, division is performed, or after division, multiplication is performed, the result is the same. Similarly, after integration using a plurality of integration functions, addition is performed, or after addition, integration is performed using one integration function, the result is the same. As similar to a general mathematical expression, if the calculating result is the same, the order of calculation or the construction of arithmetic elements are irrelevant. Therefore, it is not necessary to be always realized with the order or the construction shown in FIGS. 71A-71C and FIG. 79, respectively.

Next, the invention for improving electric resistant noise performance relating to the present invention will be described hereafter.

Figure 83:
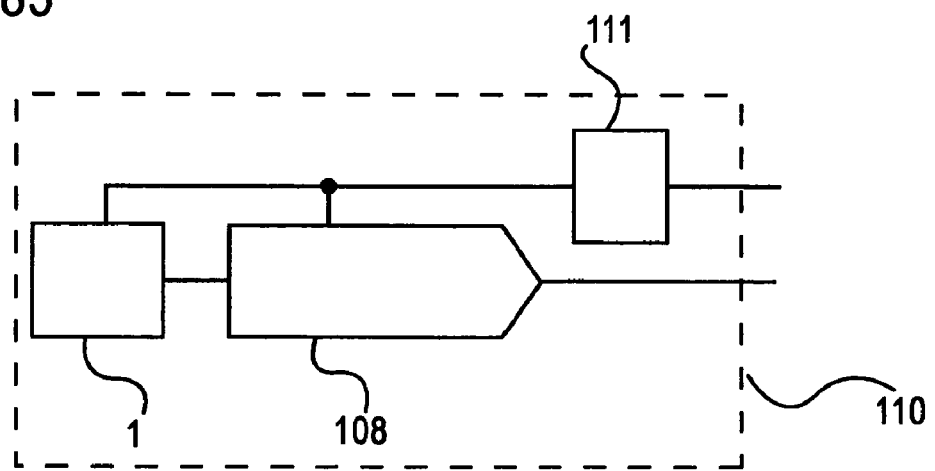
FIG. 83 is a schematic explanatory diagram showing one configuration mode of magnetic body detector relating to the present invention.

FIG. 83 is another schematic explanatory diagram showing a configuration mode of the magnetic body detector relating to the present invention. In other words, the magnetic sensor part 110 of this magnetic body detector is composed of the magnetic sensor 1, the analog-digital conversion circuit 108 and the power supply circuit 111.

There are various types for the magnetic sensor, and herein, a magnetic sensor for converting the magnetic flux density B into a quantity of electricity is assumed. The output of the sensor is an analog value and a quantity of electricity having a correlation with the entered magnetic flux density B.

Figure 84:
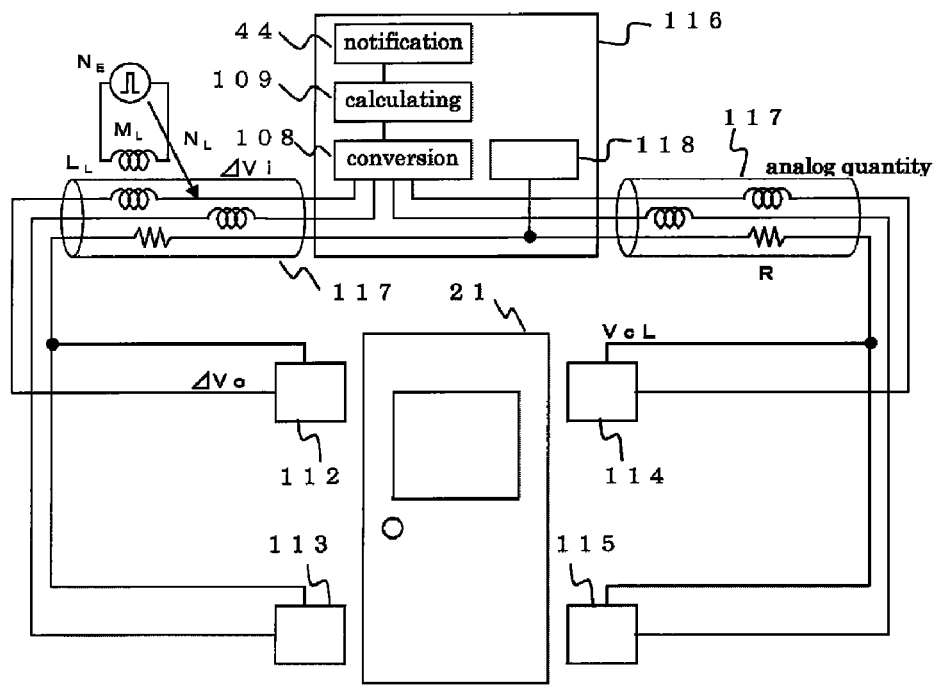
FIG. 84 is a block diagram of a magnetic body detector comprising a converting circuit and a power supply circuit.

FIG. 84 shows an arrangement example of the magnetic sensors. Furthermore, in FIG. 84, as one embodiment for the explanation, the case of four magnetic sensors is used; however, it is needless to say, the number of magnetic sensors may not be limited to four.

As shown in FIG. 84, in the magnetic body detector as in the present invention, a plurality of magnetic sensors 112 through 115 have to be arranged in the right and left of the gate 21. In the meantime, the overall determination of the presence of the magnetic body has to be performed by one control part 116 at last. In the case that the consumption current fluctuates due to the load fluctuation, the magnetic sensors 112 through 115 and the control part 116 have to be connected with the cable 117.

The control part 116 may be at any position, and a total length of the cable 117 between the magnetic sensor 113 and the magnetic sensor 115 will be 3 m or longer even using any means.

In the case of connecting analog output signals of the magnetic sensor 112 through 115 to the analog-digital conversion circuit 108 using the long cable 117, noise NL is superimposed onto the cable 117. Because the change in magnetic flux density delta B due to the inversion of the magnetic body is a small value, the change in the detection output of the magnetic sensors 112 through 115 delta Vo is also a small value. Exogenous noise NE is superimposed onto this small detection output delta Vo, and when the noise NL is added, whether the change in the input signal delta Vi in the output signal of the analog-digital conversion circuit 108 is changed by the delta Vo or by NL cannot be determined, and malfunction will occur. Therefore, unless the noise NL is reduced, the normal operation cannot be conducted.

The magnitude of the noise NL is changed according to various factors, and as the greatest factor regarding the device itself, the length of the cable 117 can be mentioned.

When the length of the cable 117 is long, it is inevitable to increase the inductance LL, and to increase the mutual ML with the exogenous noise NE. If the mutual inductance ML becomes greater, the noise NL to be superimposed to the cable becomes greater, and it causes the malfunction. In order to prevent this, it is necessary to shorten the length of the cable 117. However, it is impossible to shorten the physical distance between the magnetic sensors 112 through 115 and the control part 116, respectively.

Figure 85:
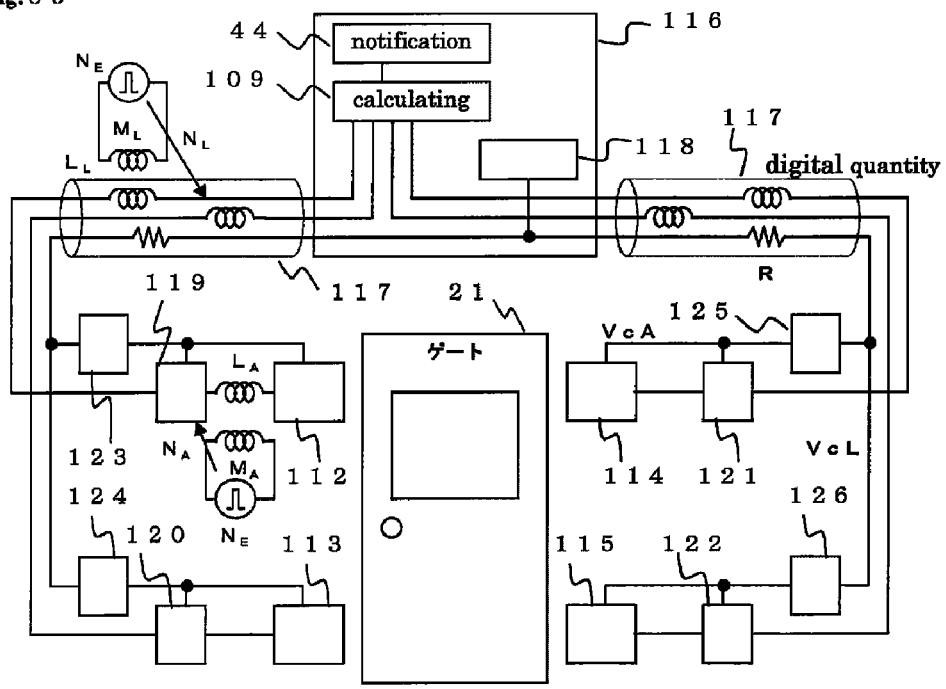
FIG. 85 is a block diagram of a magnetic body detector comprising a plurality of converting circuits and power supply circuits.
Figure 8:
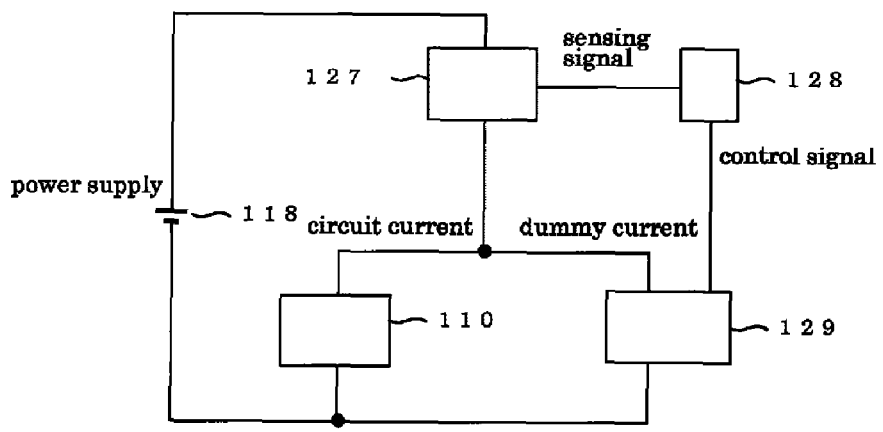
Figure 8:
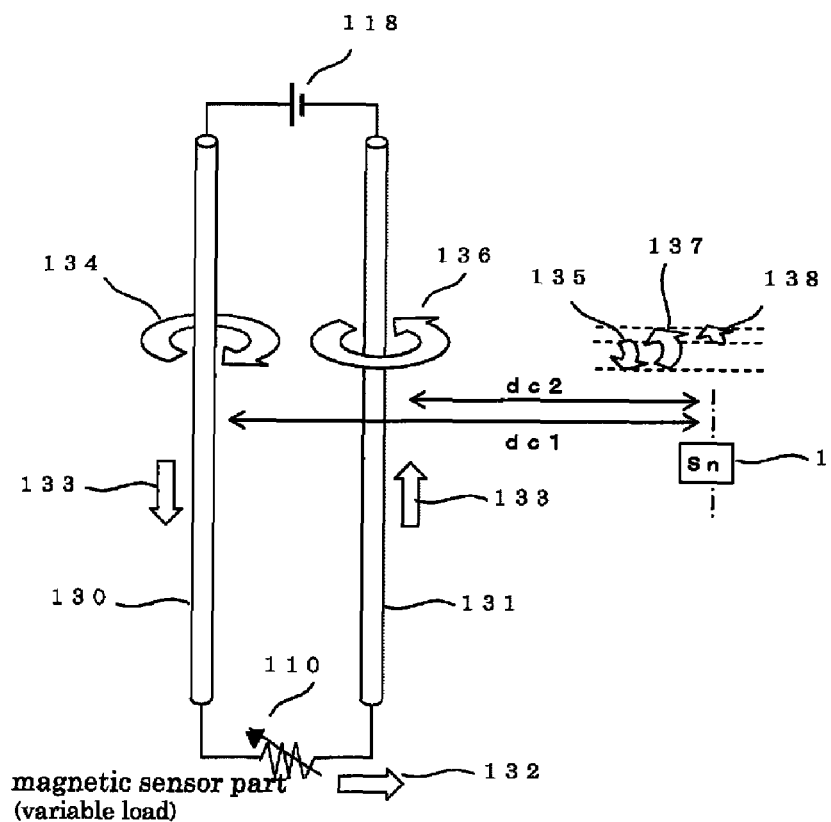

Then, as shown in FIG. 85, the analog-digital conversion circuits 119 through 122 are arranged very close to the magnetic sensors 112 through 115, respectively. Because the distance between each of the magnetic sensors 112 through 115 and the analog-digital conversion circuits 119 through 122 become extremely short, respectively, the mutual inductance MA between the inductance LA of the cable and the exogenous noise NE becomes small. Therefore, because the noise NA due to the exogenous noise NE to be superimposed to the input signals of the conversion circuits 119 through 122, it becomes possible to reduce malfunction. Because the cable 117 is long, as similar to FIG. 84, the noise NL is greatly superimposed; however, since this is a digitalized amount, if the transmission quantity is secured, it is possible to eliminate the effect of the noise NL to zero.

As another factor where noise is superimposed, a power supply is mentioned. As shown in FIG. 84, in the case of supplying a power source to each section from one control power supply circuit 118 via the cable 117, because the cable is long, the resistance component R is included in the power wire. When the consumption current fluctuates due to load variation, the power supply voltage VcL to be supplied to the magnetic sensors 112 through 115 will fluctuate due to the resistance component R. As a result, because the power supply voltage of the magnetic sensors 112 through 115 fluctuates, it causes the fluctuation of the detection output Vo regardless of the magnetic flux density.

In order to prevent this, as shown in FIG. 85, the power supply circuits 123 to 126 are arranged very close to the magnetic sensors 112 through 115, respectively. VcL fluctuates due to the load fluctuation; however, the power supply voltage VcA to be supplied to the magnetic sensors 112 through 115 does not fluctuate.

As shown in FIG. 85, the cost aspect is disadvantageous because a plurality of analog-digital conversion circuits 119 through 122 and the power supply circuits 123 to 126 are arranged. However, this is necessity for securing the performance.

Next, another invention for improving electric resistant noise performance relating to the present invention will be described hereafter.

FIG. 86 is another schematic explanatory diagram showing a configuration mode of the magnetic body detector relating to the present invention. In other words, this magnetic body detector is composed of a current detection function 127, a control function 128 and a dummy current function 129 in the magnetic sensor part 110 forming a part of the electric circuit comprising FIG. 83.

In the present invention, a plurality of magnetic sensors are used for each of the sensor units 35 to 38. Therefore, as shown in FIG. 87, the magnetic sensor part 110 composed of another magnetic sensor and other circuits is connected to the vicinity of the magnetic sensor 1 via the power supply 118 and the electric wires 130 to 131. Further, the electric wires 130 to 131 are structurally arranged in the vicinity of the magnetic sensor 1.

The consumption current 132 of the magnetic sensor part 110 is not constant. This is a fluctuating current that changes due to a fluctuating load. When the fluctuation of the consumption current 132 occurs at the magnetic sensor part 110, because an electric current 133, which is equal to the consumption current 132, flows into the electric wire 130, the magnetic field 134 fluctuates in accordance with the Amperes rule. A change in magnetic flux density 135 occurs at the position of the magnetic sensor 1 away from the electric wire 130 by distance dc1 depending upon the fluctuation of the magnetic field 134. Simultaneously, because the electric current 133 flows into the electric wire 131, as well, the magnetic field 136 fluctuates. The change in magnetic flux density 137 fluctuates at the position of the magnetic sensor 1 away from the electric wire 131 by the distance dc2 due to the fluctuation of the magnetic field 136. Since the change in magnetic flux density 135 and the change in magnetic flux density 137 are opposite direction from each other, the change in magnetic flux density 138, which is a difference between the change 136 and the change 137, occurs at the position of the magnetic sensor 1.

The magnetic sensor 1 detects the change in magnetic flux density delta B. Therefore, if the change in magnetic flux density 138 occurs due to the fluctuation of the consumption current 132 of the magnetic sensor part 110, this is detected and it causes a malfunction.

In order to prevent the malfunction, the change in magnetic flux density 138 to be generated at the position of the magnetic sensor 1 should be zero. If the distance dc1 between the electric wire 130 and the magnetic sensor 1 and the distance dc2 between the electric wire 131 and the magnetic sensor 1 are the same, because the change in magnetic flux density 135 and the change in magnetic flux density 137 are the same magnitude and the opposite direction from each other, the change in magnetic flux density 138 becomes zero and no malfunction will occur. Therefore, if the magnetic sensor 1 is installed so as to be an equal value between the distance dc1 and the distance dc2, no malfunction will occur.

However, it is extremely difficult to arrange the positions of the electric wires 130 and 131 so as to be the same distance. In FIG. 87, the electric wires 130 and 131 are indicated with simple parallel lines; however, if they are tilted, correction has to be made. In the case that the electric wire is bent in the middle, the correction has to be made, as well. These efforts are time-consuming, and the work cost becomes higher.

As another means to eliminate the change in magnetic flux density 138 to zero, a method to eliminate the fluctuation of the consumption current 132 of the magnetic sensor part 110 to zero is available. If the fluctuation of the consumption current 132 is zero, the change in magnetic flux density 138 is also zero, the malfunction will never occur. However, the consumption current 132 of the magnetic sensor part 110 is to be determined according to various factors, and it is impossible to be completely constant.

Figure 88:
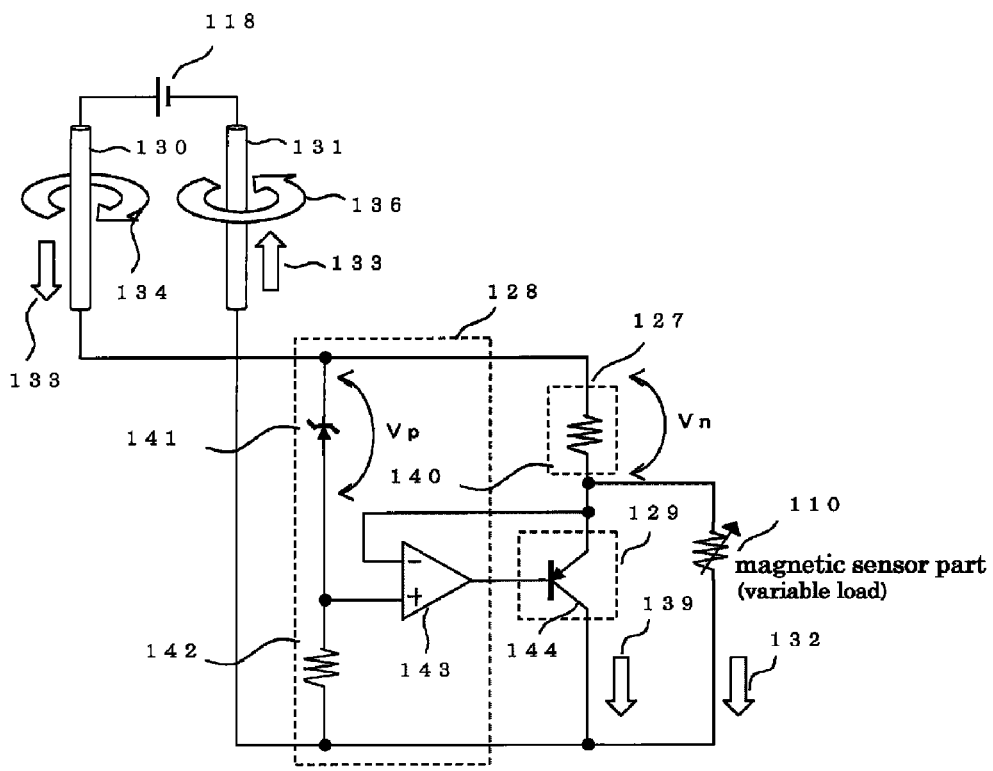
FIG. 88 is a schematic explanatory diagram showing a circuit example that unifies an electric current that flows an electric symbol into an electric wire.

Even the though the consumption current 132 of the magnetic sensor part 110 is not constant, if the electric current 133 flowing in the electric wires 130 and 131 is constant, the magnetic flux density 138 is zero. Then, as shown in FIG. 88, a current detection function 127, a control function 128 and a dummy current function 129 for flowing a dummy current 139 are established, and the dummy current 139 for supplementing the fluctuation of the consumption current 132 in the circuit 110 flows. Since a total of the consumption current 132 and the dummy current 139 is constant, the total current 133 flowing in the electric wires 130 and 131 is also constant.

Therefore, the change in magnetic flux density 138 associated with the fluctuation of the consumption current 132 of the magnetic sensor part 110 will not occur.

As a specific circuit example in FIG. 88, a current detection function 127 is composed of a resistor 140. A control function 128 is composed of constant voltage diode 141, a resistor 142 and an operating amplifier 143. The dummy current function 129 is composed of a transistor 144.

The operating amplifier 143 controls the transistor 144 so as to equalize voltage Vn to be generated by an electric current flowing in the resistor 140 and voltage Vp to be generated by the constant voltage diode 141 and the resistor 142. Since the dummy current 139 flows so as to supplement the fluctuation of the consumption current 132 of the circuit 110, the current 133, which is a total value of the consumption current 132 and the dummy current 139, will never fluctuate. If the current 133 does not fluctuate, the change in magnetic flux density 138 will not be generated. Therefore, because the magnetic sensor 1 will not be magnetically affected, the malfunction will not occur.

The configuration shown in FIG. 88 is one example for realizing this function. As the current detection function 127, various methods, such as electric current transformer or a hall element, are available in addition to the resistor 140. In addition, it is also possible to configure not only with an analog circuit but with a digital circuit, and to configure by combining the analog and digital circuits.

Next, the invention corresponding to steady magnetic noise relating to the present invention will be described hereafter.

Figure 89:
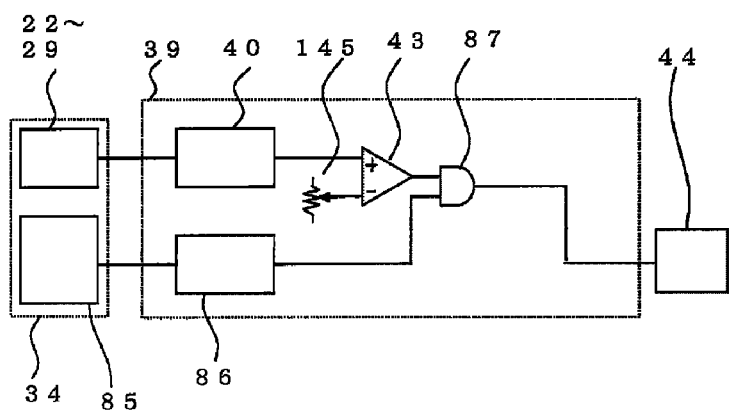
FIG. 89 is a schematic explanatory diagram showing one configuration mode of magnetic body detector relating to the present invention.

FIG. 89 is another schematic explanatory diagram showing a configuration mode of the magnetic body detector relating to the present invention. In other words, this magnetic body detector is composed of a variable threshold value input device 145 that can set a threshold value to the configuration shown in FIG. 74 from the outside.

In any environment, magnetic noise is not zero. The magnitude of the magnetic noise varies according to the environment to be used. In the case that the threshold value for determining the presence of the magnetic body is a fixed value, there is no problem in the environment with small noise; however, a malfunction may happen in the environment with large noise.

Then, a threshold value matched with the installation environment is set using the threshold value input device 145. As the specific threshold value input device 145, a variable resistor is assumed.

Next, the invention for notifying a magnetic body that does not pass through a gate relating to the present invention will be described hereafter.

Figure 90:
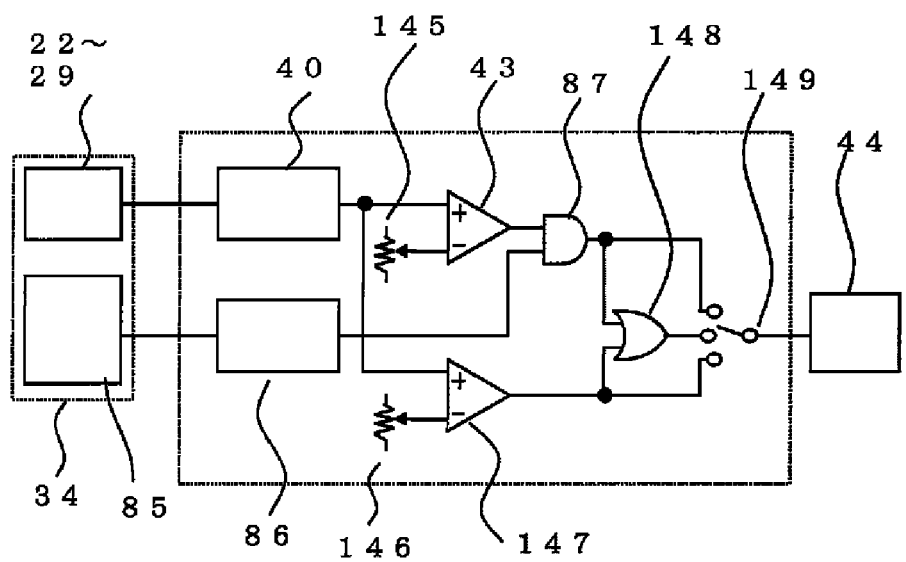
FIG. 90 is a schematic explanatory diagram showing one configuration mode of magnetic body detector relating to the present invention.

FIG. 90 is another schematic explanatory diagram showing a configuration mode of the magnetic body detector relating to the present invention. In other words, this magnetic body detector is composed of a third value input device 146, a third comparison function 147 and a logical addition function 148 and a selection device 149 in the configuration shown in FIG. 89.

For example, it is an extremely dangerous action to bring a large-sized magnetic body, such as an iron oxygen cylinder, closer to the vicinity of the MRI diagnostic system. Such dangerous action may have to be notified even if a person who has said magnetic body has no intention to pass through the gate 21. In this case, a signal of the magnetic signal processing part 40 and a third threshold value set by the third threshold value input device 146 are compared by the third comparison function 147, and if this signal is a greater value than the third threshold value, the notification function 44 is activated regardless of the passage of the object through the gate 21.

Depending upon the environment of use, as a factor to activate the notification function 44, there is a case where only the threshold value may be sufficient, and there is another case where only the third threshold value is sufficient. Further, there is a case where both the threshold and the third threshold value are regarded as a factor.

In order to select any of them, there is a method to use a selection device 149 that can select the threshold value and the third threshold value. Further, there is a case where both the threshold value and the third threshold value become required. In order to respond to these requests, a method where a logical addition signal is prepared using the logical addition function 148, and the selection function 149 that can select three types is used is available.

Further, the third threshold value input device 146 may be variable.

Figure 91:
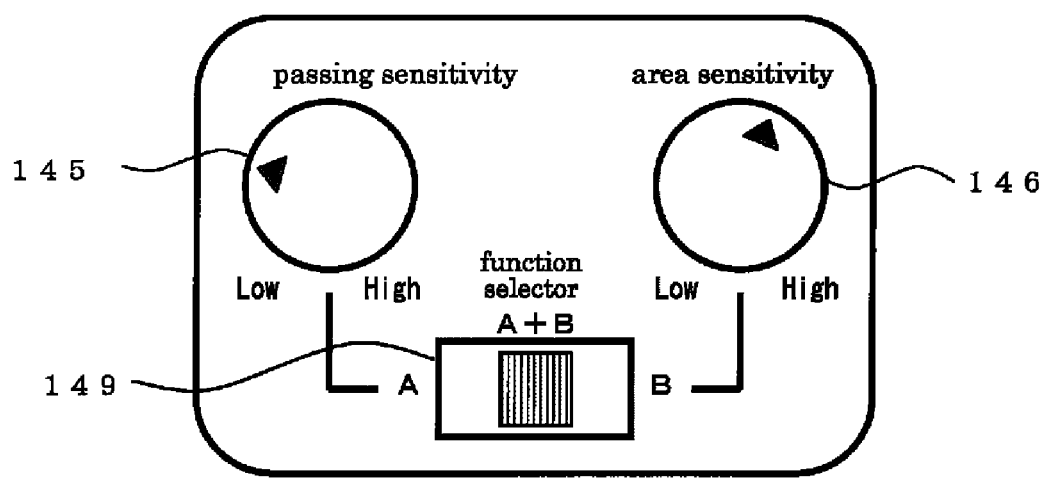
FIG. 91 is a pattern diagram showing an arrangement example of the threshold value input device and a selection device.

As one method to realize these, FIG. 91 shows an arrangement example of the variable threshold value input device 145, the third threshold value input device 146 and the selection device 149. However, FIG. 91 is an arrangement example, and this does not show a specific configuration.

Next, a notification means to the outside relating to the present invention will be described hereafter.

Figure 92:
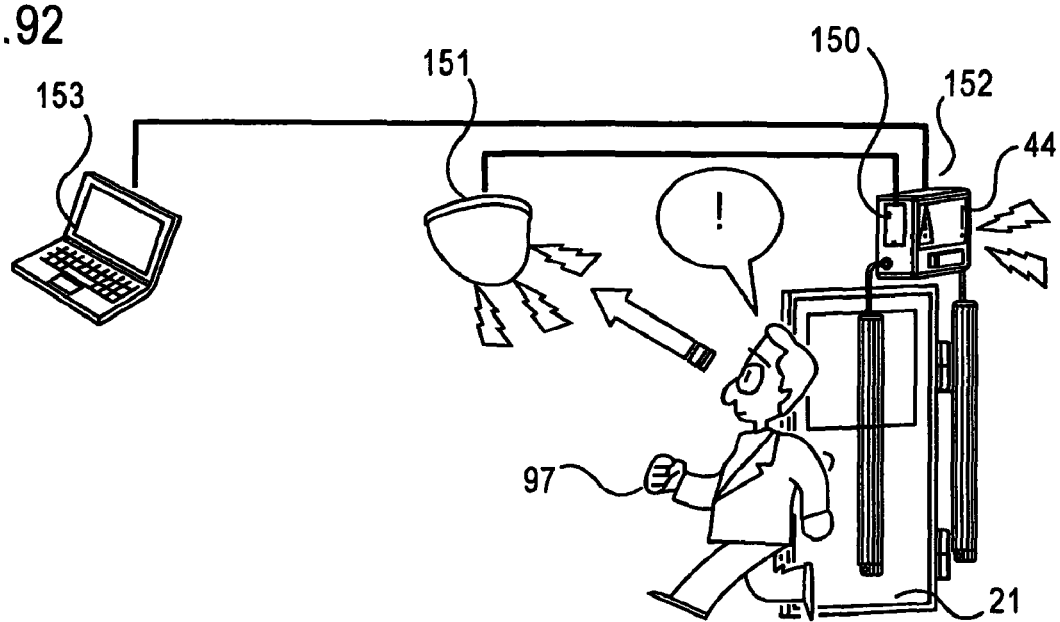
FIG. 92 is a schematic explanatory diagram showing one configuration mode of magnetic body detector relating to the present invention.

FIG. 92 is another schematic explanatory diagram showing a configuration mode of the magnetic body detector relating to the present invention. In addition, this magnetic body detector is configured by adding an electric contact 150 to the configuration shown in FIG. 90.

When the user 97 who has a magnetic body passes through the gate 21, the notification function 44 is activated. The notification function 44 notifies the user 97 using a light or sound. However, normally, since the user 97 walks by looking ahead, it is difficult to recognize the notification function 44.

Then, an external notification function 151 is activated using the electric contact 150. If the external notification function 151 is installed in the traveling direction of the user 97, the user 97 easily recognizes the external notification function 151, and he/she realizes that he/she has a magnetic body. For such external notification function 151, an application method where the external notification function 151 is installed not only in front of the user 97, but also in the MRI control room, and the detection is notified to an administrator is also adoptable.

As a method to deliver a notification action to the outside, a method including a communication means 152 is also adoptable. It is also possible to deliver the notification action to an administration instrument 153 inside or outside the hospital, by establishing a communication interface, such as RS-232, RS-422 or Ethernet.

Next, a shield door frame integrated magnetic body detector relating to the present invention will be described hereafter.

Figure 93:
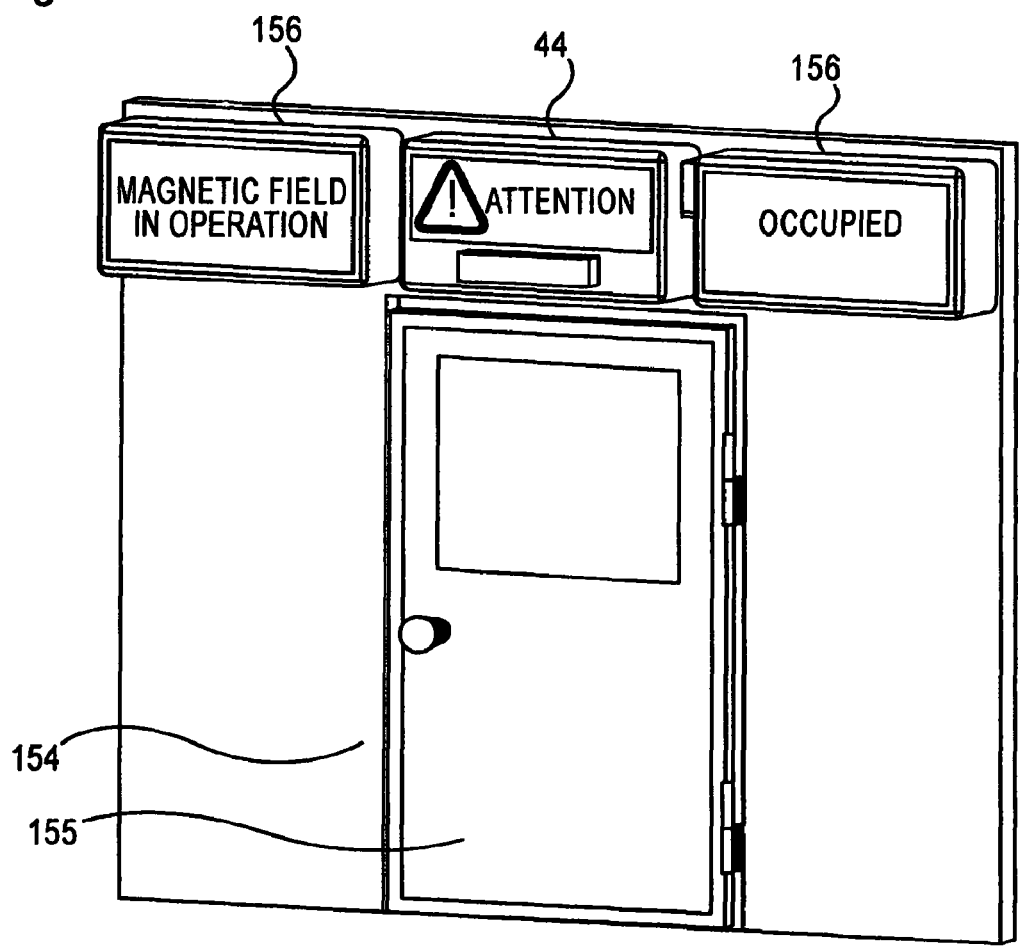
FIG. 93 is a schematic explanatory diagram showing one configuration mode of magnetic body detector relating to the present invention.

FIG. 93 is another schematic explanatory diagram showing a configuration mode of the magnetic body detector relating to the present invention. In other words, this magnetic body detector is composed with a door frame 154 and a shield door 155 in the configuration shown in FIG. 17.

In the example of FIG. 17, it is necessary to install this magnetic body detector separately from the door frame 154 and the shield door 155, and to connect a cable. An installation work of these instruments is required, and not only the installation cost is high, but also the cable is visible from the outside, and there is a problem where an appearance is impaired. Then, a portion or entire function of this magnetic body detector is incorporated within the door frame 154.

Because the function of the magnetic body detector is incorporated into the door frame 154, the installation work can be substantially the same as the case of installing a normal door frame, and the appearance will never be impaired. Since an integrated unit can be assembled at a production plant, the installation work is only once at a point of use. In addition, there is also a case that another notification function separately from the one for magnetic body detection has to be established as occasions demand. In that case, if a notification function 156 is installed in the same door frame 154, not only the installation cost can be reduced, but it is also possible to improve the appearance. For the shield door 155 and the door frame 154, taking transportability to an installation location into consideration, there is no problem if they are divided into some portions for enabling transportation. The assembly work is performed at an installation location.

However, FIG. 93 is an arrangement example, and it shall not show any specific configuration.

Further, the notification function 156 may be plural.

What is claimed is:

1. A magnetic body detector for detecting a magnetic body that passes through a gate, comprising:
a magnetic sensor for detecting magnetic flux density having a threshold value;
a comparison function for comparing the output of the magnetic sensor with the threshold value; and
a notification function for notifying the results of the comparison function,
wherein a solid angle formed by a detection axis of the magnetic sensor and a vertical axis or a horizontal axis is set within 15 degrees excluding zero degree.

2. The magnetic body detector according to claim 1, wherein
a plurality of magnetic sensors are so arranged as to be in different positions.

3. The magnetic body detector according to claim 2, wherein
a calculating part is provided to control the calculation function output of a magnetic body that does not pass through the gate by arithmetically processing the output of a plurality of the magnetic sensors.

4. The magnetic body detector according to claim 3, wherein the calculating part comprises:
an in-phase signal removing calculation function for removing an in-phase signal component; and
an addition calculation function for adding a plurality of in-phase signal component removing signals obtained by the in-phase signal removing calculation function;
wherein the plurality of magnetic sensors are simultaneously operated, and in-phase signal components of detection signals detected from each magnetic sensor are removed using the in-phase signal removing calculation function, respectively, and a plurality of in-phase signal component removing signals obtained by the in-phase signal removing calculation function are added by the addition calculation function, and an addition signal obtained by the addition calculation function and the threshold value are compared by the comparison function.

5. The magnetic body detector according to claim 4, wherein:
the calculating part comprises:
an alternating-current component calculation function for extracting only an alternating-current component from a detection signal of the magnetic sensor; an absolute value calculation function for calculating an absolute value of the in-phase signal component removing signal obtained by removing an in-phase signal from the alternating-current component by the in-phase signal removing calculation function; and an integration calculation function for time integration calculation of the absolute value;
a plurality of integrated values obtained by the integration calculation function are added by the addition calculation function; and an addition signal obtained by the addition calculation function and the threshold value are compared by the comparison function.

6. The magnetic body detector according to claim 5, wherein
a sensor part is configured such that sensor units comprising one or more magnetic sensors are arranged in the front and rear relative to a traveling direction of an object to be detected;
a calculating part is composed of an alternating-current component calculating part, an in-phase signal removing part, a front-to-rear ratio calculating part, an integration part and a determination part;
the alternating-current component calculating part is composed of alternating-current calculations comprising an integration calculation function and a subtraction calculation function as many as the magnetic sensors;
the in-phase signal removing part is composed of in-phase calculations comprising the subtraction calculation function as many as the magnetic sensors, an addition calculation function and a division calculation function;
the front-to-rear ratio calculating part is composed of ratio calculations comprising the addition calculation function, the ratio calculation function, a multiplication calculation function and an absolute value calculation function, as many as one-half of the magnetic sensors;
the integration part is composed of the integration calculation function;
the determination part is composed of the threshold value input function for entering the threshold value and the comparison calculation function;
the notification function is configured to notify a warning to a user by a predetermined means;
a plurality of magnetic sensors are simultaneous operated; an integrated value of the detection signal of each magnetic sensor is obtained by the integration calculation function of the alternating-current component calculating part, respectively; each detection signal and a subtracted value of the integrated value are obtained by the subtraction calculating function of the alternating-current component calculating part; an added value of obtained subtracted value is obtained by the addition calculating function of the in-phase signal removing part; an divided value of obtained added value is obtained by the division calculating function of the in-phase signal removing part; a subtracted value (second subtracted value) between the subtracted value and the divided value is obtained by the subtraction calculating function of the in-phase signal removing part; added values (second added values) of the second subtracted values in two each of front and rear magnetic sensors are obtained by the addition calculation function of the front-to-rear ratio calculating part; ratios of the second subtracted value in two each of the front and rear magnetic sensors are obtained by the comparison calculation function of the front-to-rear ratio calculating part, respectively; multiplied values of the second added value and the ratio in the front and rear are obtained by the multiplication calculating function of the front-to-rear ratio calculating part, respectively; absolute values of the obtained front and rear multiplied values are obtained by the absolute value calculating function of the front-to-rear ratio calculating part; an added value (third added value) of all obtained values is obtained by the addition calculating function of the front-to-rear ratio calculating part; an integrated value (second integrated value) of the obtained third added value is obtained by the integration calculating function of the integration part; a threshold value is entered by the threshold value input function of the determination part; the determination value of the second integrated value and the threshold value is obtained by the comparison calculating function of the determination part; and the notification function is activated according to the obtained determination value.

7. The magnetic body detector according to claim 6, wherein the sensor units in the sensor part are arranged in the front & rear and left & right relative to the traveling direction of the object to be detected; at the same time, left-right in-phase removing part are established to the calculating part; and the sensor units in the sensor part are arranged in the front & rear and left & right relative to the traveling direction of the object to be detected; at the same time, left-right in-phase removing part are established to the calculating part; and the present invention can adopt the configuration such that the left-right in-phase removing part is composed of two in-phase ratio calculation function, left-right counting calculation function and the multiplication calculation function, and the in-phase ratio calculation function is composed of absolute/subtraction calculation functions comprising the subtraction calculation function, the first absolute value calculation function and the second absolute value calculation function as many as one-half of the magnetic sensors, a first addition calculation function, a first division calculation function, a second addition calculation function, a third addition calculation function and a second subtraction calculation function;

a plurality of magnetic sensors are simultaneously operated;

an integrated value of detection signal of each magnetic sensor is obtained by the integration calculation function of the alternating-current component calculating part; a subtracted value of the detection signal and its integrated value is obtained by the subtraction calculation function of the alternating-current component calculating part; an added value of obtained subtracted values is obtained by the addition calculation function of the in-phase signal removing part, respectively; an divided value of obtained added value is obtained by the division calculation function of the in-phase signal removing part, respectively; a subtracted value (second subtracted value) between the subtracted value and the divided value is obtained by the subtraction calculation function of the in-phase signal removing part; an added value (second added value) of the second subtracted values in two each of front and rear magnetic sensors is obtained by the addition calculation function of the front-to-rear ratio calculating part; a ratio of the second subtracted values in two each of front and rear magnetic sensors are ratio calculation function of the front-to-rear ratio calculating part;

a multiplied value of the front and rear of second added values and the ratio are obtained by the multiplication calculation function of the front-to-rear ratio calculating part; an absolute value of the obtained front or rear multiplied value is obtained by the absolute value calculation function of the front-to-rear ratio calculating part;

an added value (third added value) of obtained all absolute values is obtained by the addition calculation function of the front-to-rear ratio calculating part; absolute values of the right and left of the second subtracted values are obtained by the first absolute value calculation function of the left-right in-phase removing part, respectively; added values (fourth added value) of the right and left second subtracted values are obtained by the first addition calculation function of the left-right in-phase removing part, respectively; divided values (second divided values) of the right and left of fourth added values are obtained by the first division calculation function of the left-right in-phase removing part, respectively; subtracted values (third subtracted values) of the right and left of second subtracted values and the second divided value are obtained by the subtraction calculation function of the left-right in-phase removing part; absolute values (third absolute values) of the obtained right and left of the third subtracted values are obtained by the second absolute value calculation function of the left-right in-phase removing part, respectively; added values (fifth added values) of the right and left of the second absolute values are obtained by the second addition calculation function of the left-right in-phase removing part, respectively; added values (sixth added values) of the right and left of the third absolute values are obtained by the third addition calculation function of the left-right in-phase removing part, respectively; divided values (third divided values) of the right and left of the fifth added value and the sixth added value are obtained by the second division calculation function of the left-right in-phase removing part, respectively; coefficients of the right and left of the third divided values are obtained by the left-right counting calculation function of the left-right in-phase removing part, respectively; a multiplied value (second multiplied value) of the third added value and the coefficient is obtained by the multiplication calculation function of the left-right in-phase removing part; an integrated value (second integrated value) of the obtained second multiplied value is obtained by the integration calculation function of the integration part; a threshold value is entered by the threshold input function of the determination part, and a determination value of the second integrated value and the threshold value is obtained by the comparison calculation function of the determination part; and the notification function is activated according to the obtained determination value.

8. The magnetic body detector according to claim 1, comprising an object detection function for detecting a passage or approach by an object, and only when the object is detected by the object detection function, the notification function is activated.

9. The magnetic body detector according to claim 6, wherein
three or more magnetic sensor are vertically arranged in intervals within the sensor unit in the sensor part; at the same time, the intervals in between the magnetic sensors become narrower downward from the upper side.

10. The magnet body detector according to claim 6, wherein
a second sensor unit comprising one or more magnetic sensors are additionally arranged at the lower side of an object to be detected; at the same time, a second calculating part comprising the calculation function, the threshold value input function and the comparison calculation function is established; and a logical addition calculation function is established; and
a calculated value in the output signal of the magnetic sensor established in the second sensor is calculated by the calculation function; a threshold value (second threshold value) is entered by the threshold value input function; a determination value (second determination value) of the calculated value and the second threshold value is obtained by the comparison calculation function; a logically added value of the determination value and the second determination value is obtained by the logical addition calculation function; and the notification function shall be activated according to the obtained logically-added value.

11. The magnetic body detector according to claim 3, wherein
a conversion circuit for conversing an analog output quantity of the magnetic sensor into a digital quantity is installed very close to each magnetic sensor, and the digital quantity of the conversion circuit is calculated by the calculating part.

12. The magnetic body detector according to claim 11, wherein
the power supply circuits are established as many as the magnetic sensors, and the power supply circuits are installed very close to each of the magnetic sensor and the conversion circuits.

13. The magnetic body detector according to claim 12, comprising:
an electric current detecting function for measuring a circuit current, a control function for constantly controlling an electric current flowing into the electric current detecting function, and a dummy electric current function for flowing a dummy electric current by the control function, wherein
the dummy electric current function is connected to the electric current detecting function, and a total of the circuit electric current and a dummy electric current is constant.

14. The magnetic body detector according to claim 1, comprising a function for varying the threshold value.

15. The magnetic body detector according to claim 1, comprising:
a threshold value input function 2 for entering a threshold value 2, and a comparison function 2 for comparing between an output value of the magnetic detection function and the threshold value 2, wherein
a comparison result 2 by the comparison function 2 enables the notification function.

16. The magnetic body detector according to claim 15, comprising a selection function for selecting two inputs, wherein
a function for enabling the notification function according to the comparison result, and a function for enabling the notification function according to the comparison result 2 are selected.

17. The magnetic body detector according to claim 16, comprising a selection function 2 for selecting three inputs, wherein
a function for enabling the notification function according to the comparison result, a function for enabling the notification function according to the comparison result 2 and a function for enabling the notification function according to logical addition of the comparison result and the comparison result 2.

18. The magnetic body detector according to claim 17, comprising electric contact, wherein
the electric contact comprises a function for opening/closing the electric contact by being synchronized with the notification function.

19. The magnetic body detector according to claim 18, comprising a communication function, wherein
the communication function comprises a function for transmitting/receiving information to/from the outside.

20. The magnetic body detector according to claim 1, comprising a door frame, wherein
the door frame incorporates a portion or all of a magnetic body detecting function, and the notification function.

* * * * *